(12) United States Patent
Bogdan

(10) Patent No.: US 8,982,974 B2
(45) Date of Patent: *Mar. 17, 2015

(54) OFDM CLOCK RECOVERY

(71) Applicant: John W Bogdan, Ottawa (CA)

(72) Inventor: John W Bogdan, Ottawa (CA)

(73) Assignee: John W. Bogdan, Ottawa, Ontario (CA)

( * ) Notice: Subject to any disclaimer, the term of this patent is extended or adjusted under 35 U.S.C. 154(b) by 7 days.

This patent is subject to a terminal disclaimer.

(21) Appl. No.: 13/763,729

(22) Filed: Feb. 10, 2013

(65) Prior Publication Data

US 2014/0205028 A1 Jul. 24, 2014

Related U.S. Application Data

(63) Continuation of application No. 11/931,026, filed on Oct. 31, 2007, now Pat. No. 8,374,075, which is a continuation-in-part of application No. PCT/CA2006/001120, filed on Jun. 27, 2006.

(60) Provisional application No. 60/894,433, filed on Mar. 12, 2007.

(51) Int. Cl.
*H01L 27/28* (2006.01)
*H04L 7/00* (2006.01)
*H03K 5/15* (2006.01)
*H03L 7/07* (2006.01)
*H03L 7/08* (2006.01)
*H03L 7/099* (2006.01)
*H04L 27/26* (2006.01)

(52) U.S. Cl.
CPC .......... *H04L 7/0079* (2013.01); *H03K 5/15013* (2013.01); *H03L 7/07* (2013.01); *H03L 7/08* (2013.01); *H03L 7/0807* (2013.01); *H03L 7/0995* (2013.01); *H04L 27/2657* (2013.01); *H04L 27/2675* (2013.01); *H04L 27/2656* (2013.01); *H04L 27/2662* (2013.01)
USPC ........... 375/260; 375/226; 375/316; 375/340; 375/344; 375/354; 375/365; 375/366; 375/368; 375/371; 375/375; 375/376; 455/75; 455/119; 455/130; 455/173.1; 455/182.1; 455/182.2; 455/192.1; 455/192.2; 455/260; 455/516; 370/210; 370/344; 370/480; 370/503; 370/509; 370/510; 370/516; 327/141; 327/147; 327/156; 327/163; 714/707

(58) Field of Classification Search
CPC ................................................... H04L 7/0079
USPC ......... 375/226, 260, 316, 340, 344, 354, 365, 375/366, 368, 371, 375, 376; 455/75, 119, 455/130, 173.1, 182.1, 182.2, 192.1, 192.2, 455/260, 516; 370/210, 344, 480, 503, 508, 370/509, 510, 516; 327/141, 147, 156, 163; 714/707
See application file for complete search history.

(56) References Cited

U.S. PATENT DOCUMENTS

| 3,755,748 | A * | 8/1973 | Carlow et al. | 327/160 |
|---|---|---|---|---|
| 7,298,772 | B1 * | 11/2007 | Neerudu et al. | 375/136 |
| 8,363,757 | B1 * | 1/2013 | Meng et al. | 375/344 |
| 2002/0186087 | A1 * | 12/2002 | Kim et al. | 331/100 |
| 2004/0066736 | A1 * | 4/2004 | Kroeger | 370/200 |
| 2004/0071200 | A1 * | 4/2004 | Betz et al. | 375/152 |
| 2005/0117667 | A1 * | 6/2005 | Yajima et al. | 375/324 |
| 2007/0064740 | A1 * | 3/2007 | Waxman | 370/498 |

* cited by examiner

*Primary Examiner* — Leon Flores

(57) ABSTRACT

Receiver synchronization techniques (RST), contributing more accurate synchronization of receiver clock to OFDM composite frame combined with much faster acquisition time and better stability of the receiver clock, and phase and frequency recovery techniques, comprising a software controlled clock synthesizer (SCCS) for high accuracy phase & frequency synthesis producing synchronized low jitter clock from external time referencing signals or time referencing messages wherein SCCS includes a hybrid PLL (HPLL) enabling 1-50,000 frequency multiplication with very low output jitter independent of reference clock quality.

9 Claims, 19 Drawing Sheets

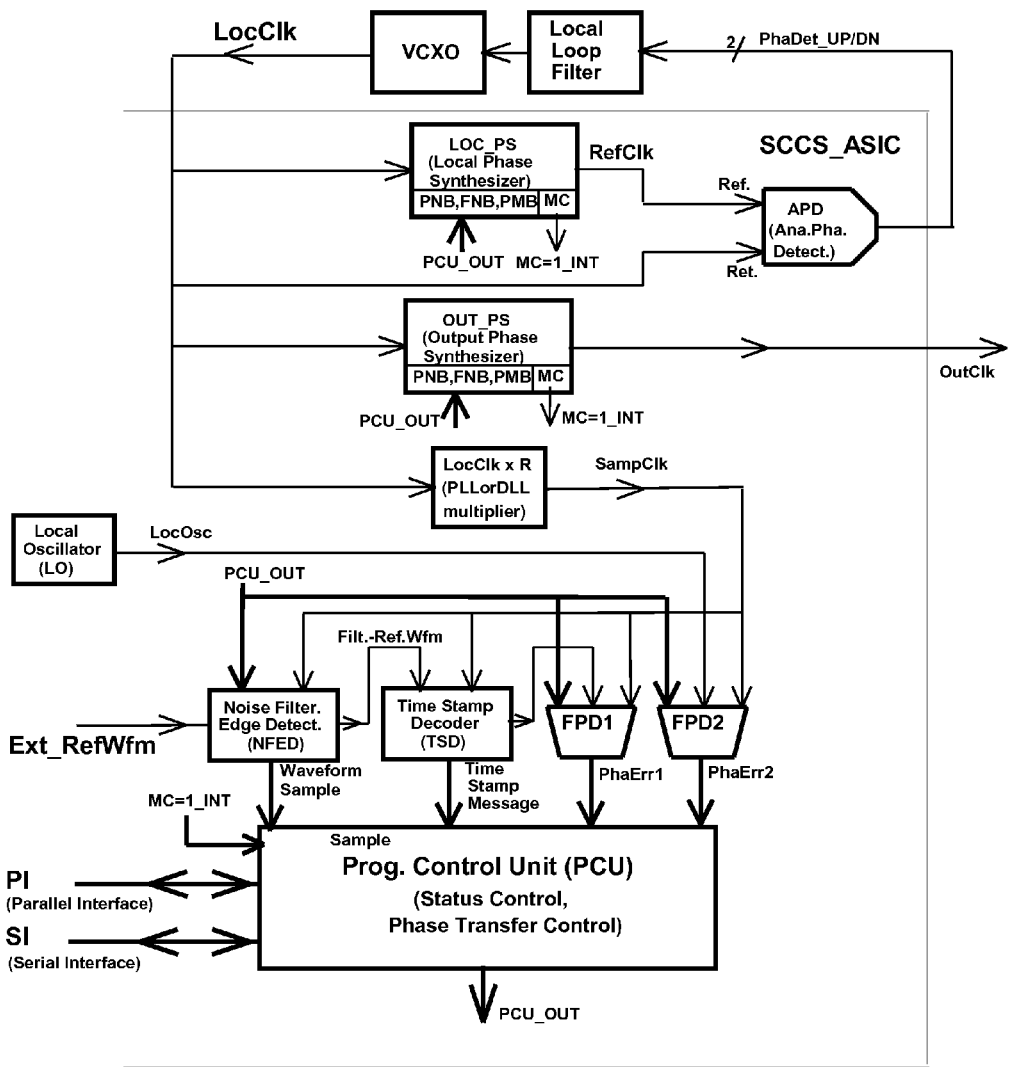
FIG.1 Open Ended Configuration of SCCS

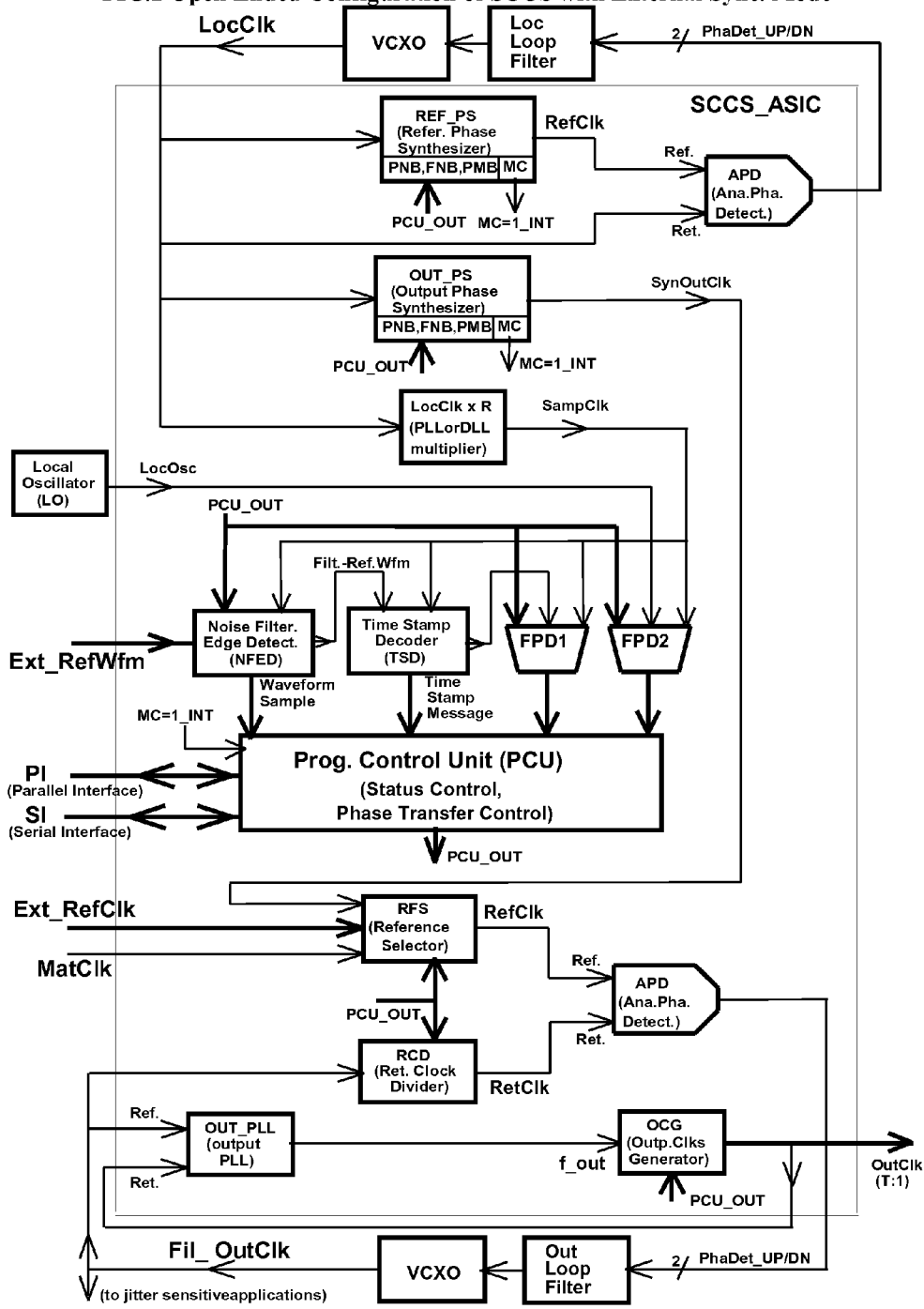

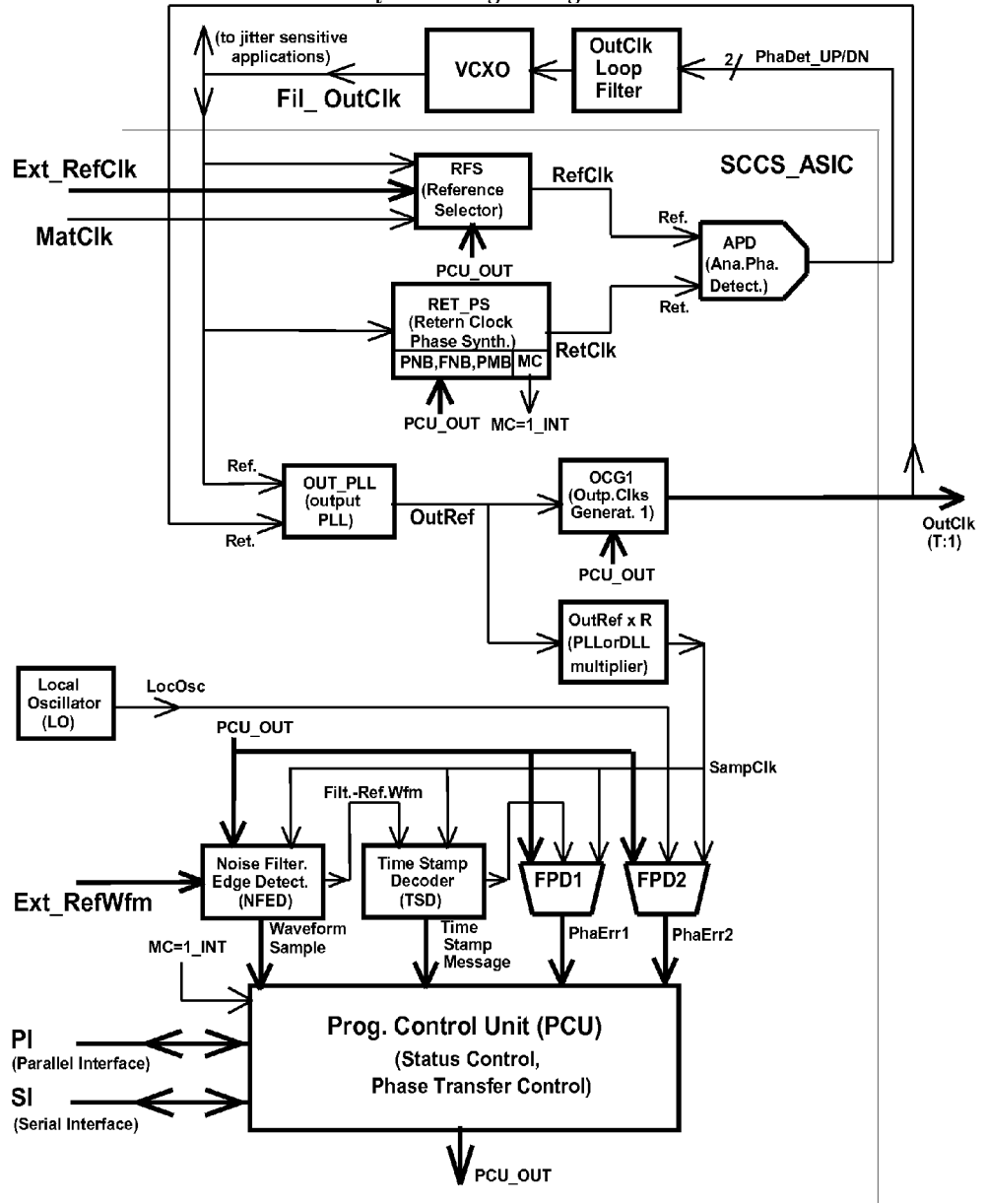

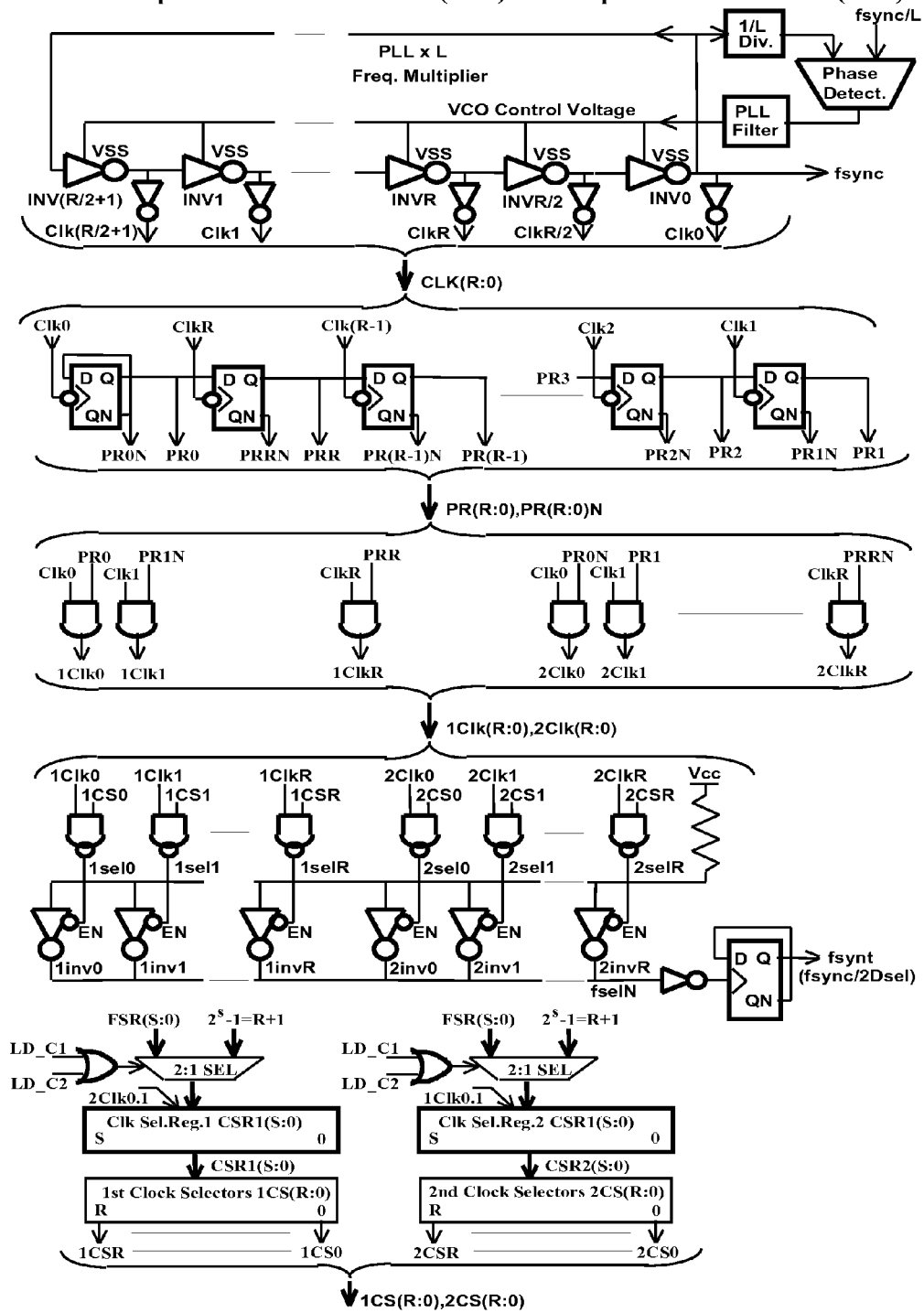
FIG.4 Sequential Clocks Generator (SCG) and Output Selection Circuits (OSC)

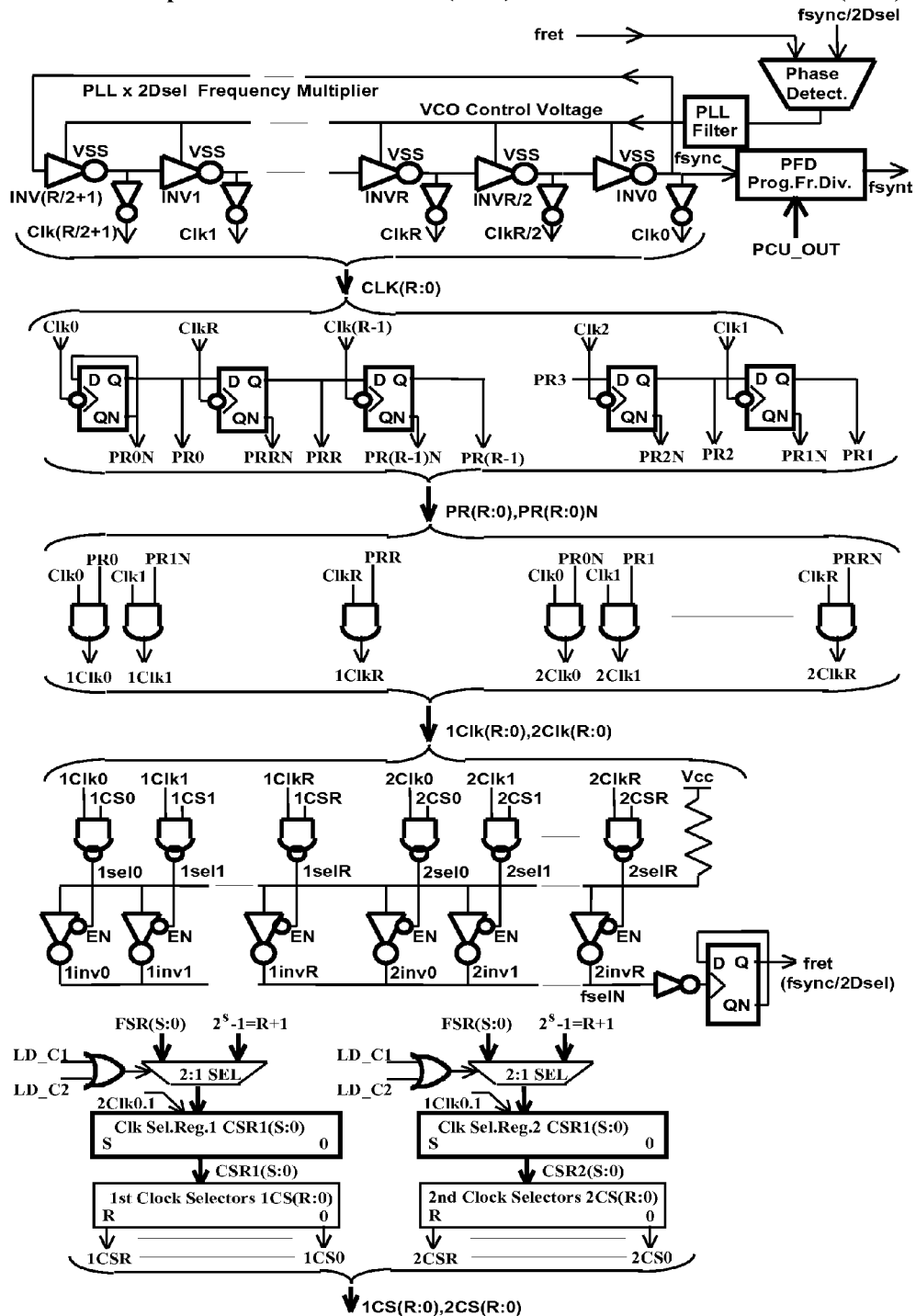
FIG.4A Sequential Clocks Generator (SCG) and Return Selection Circuits (RSC)

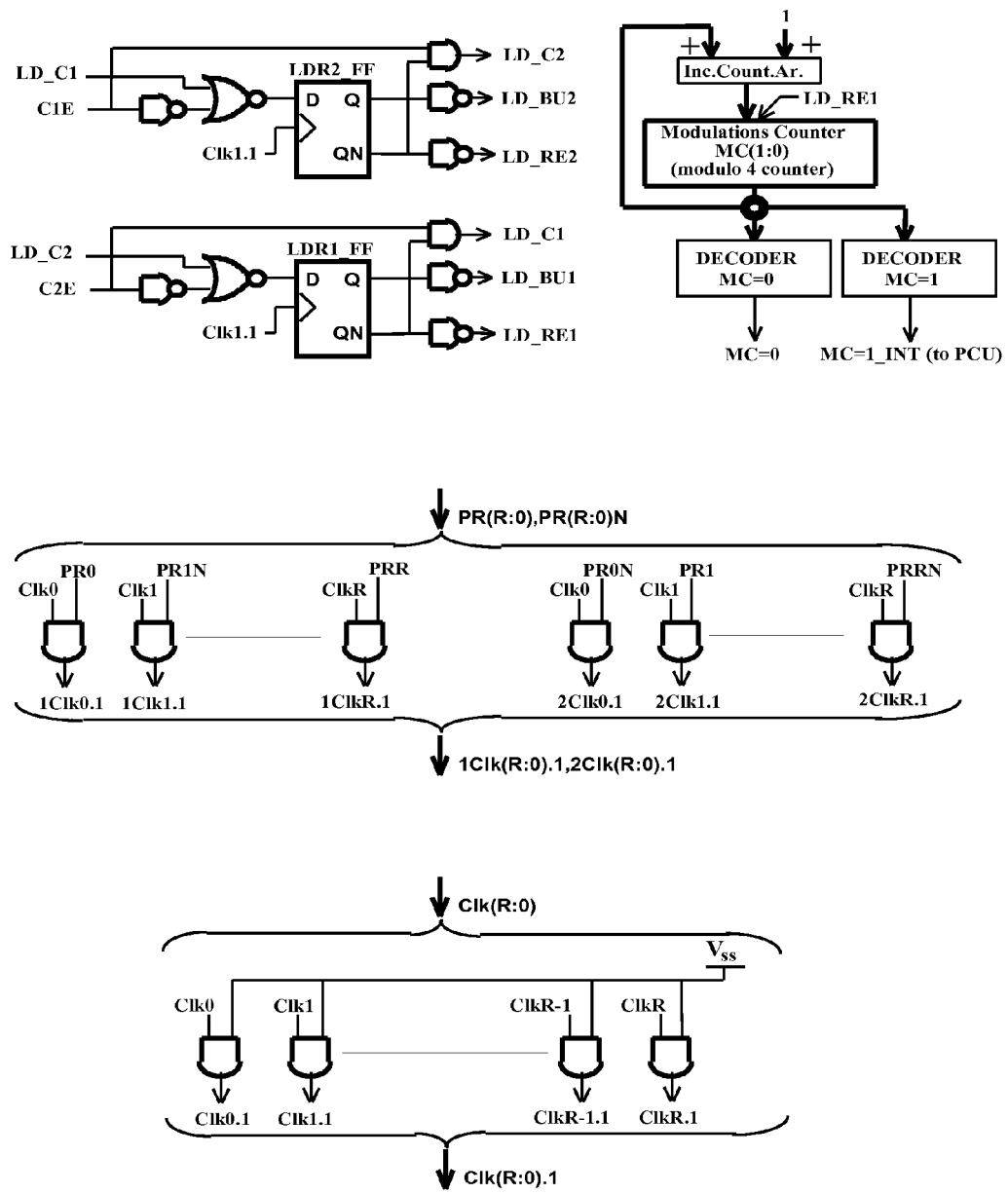
FIG.5 Timing Control (TC) and Clocks Equalization (CE)

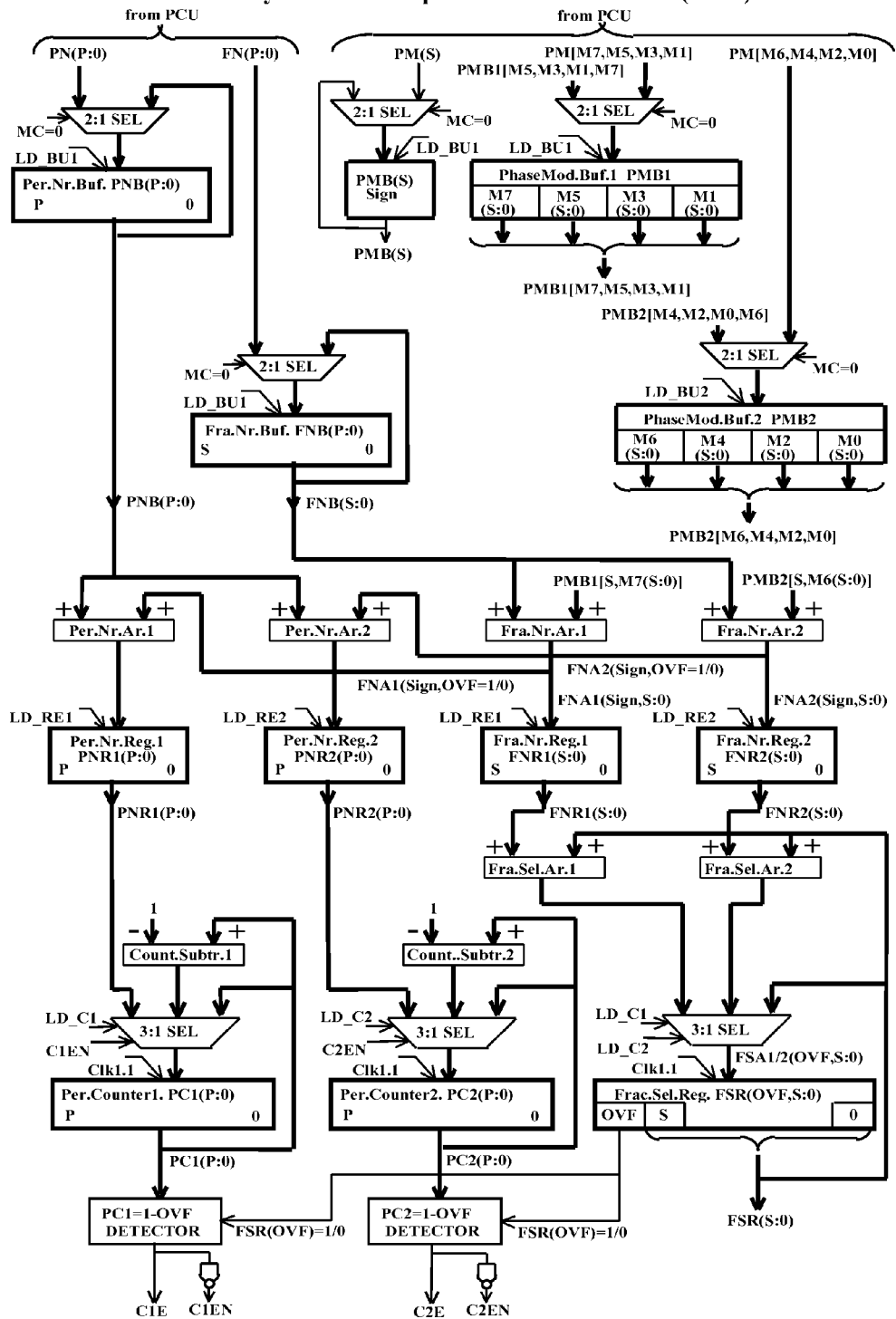
FIG.6 Synchronous Sequential Phase Processor (SSPP)

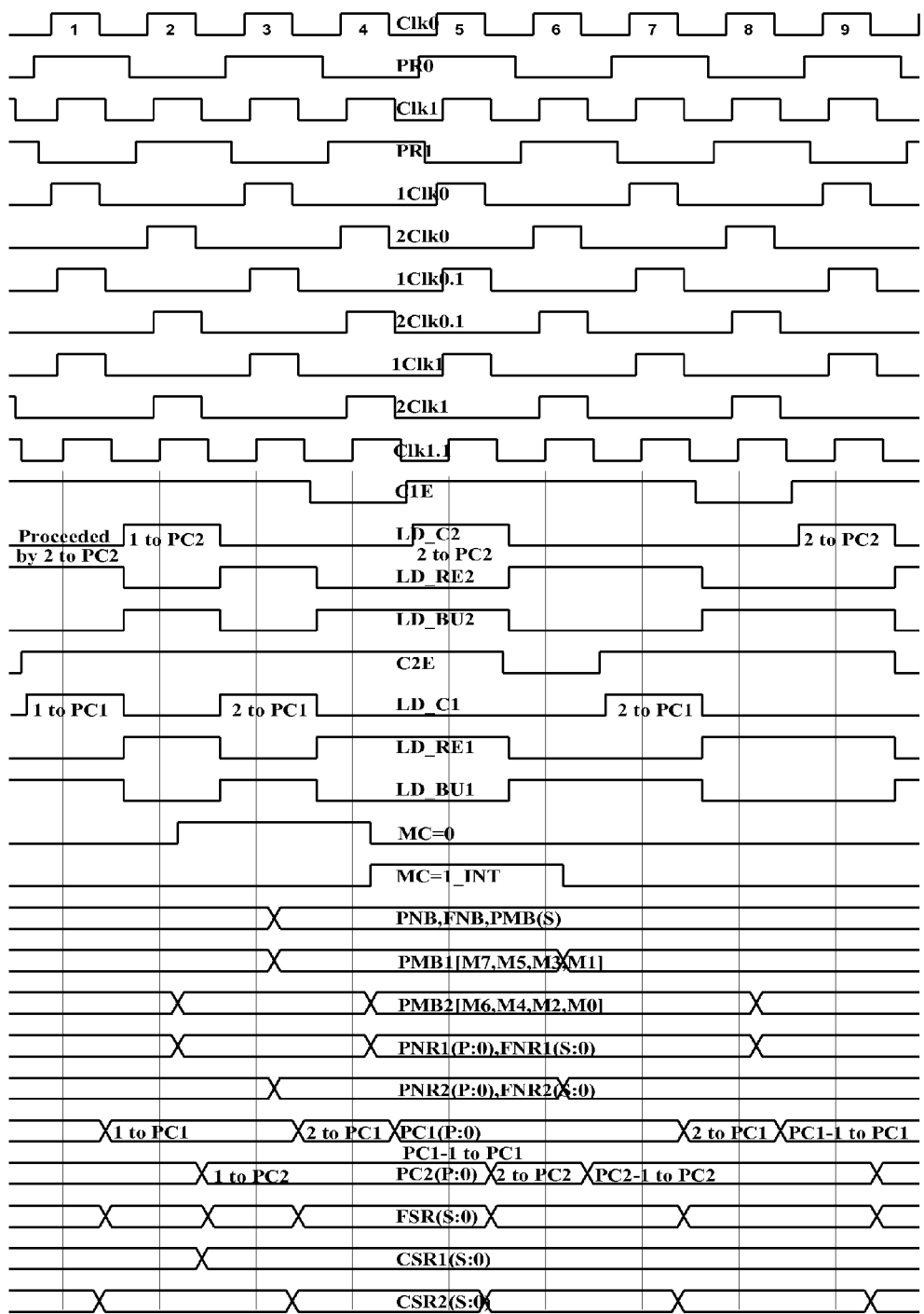

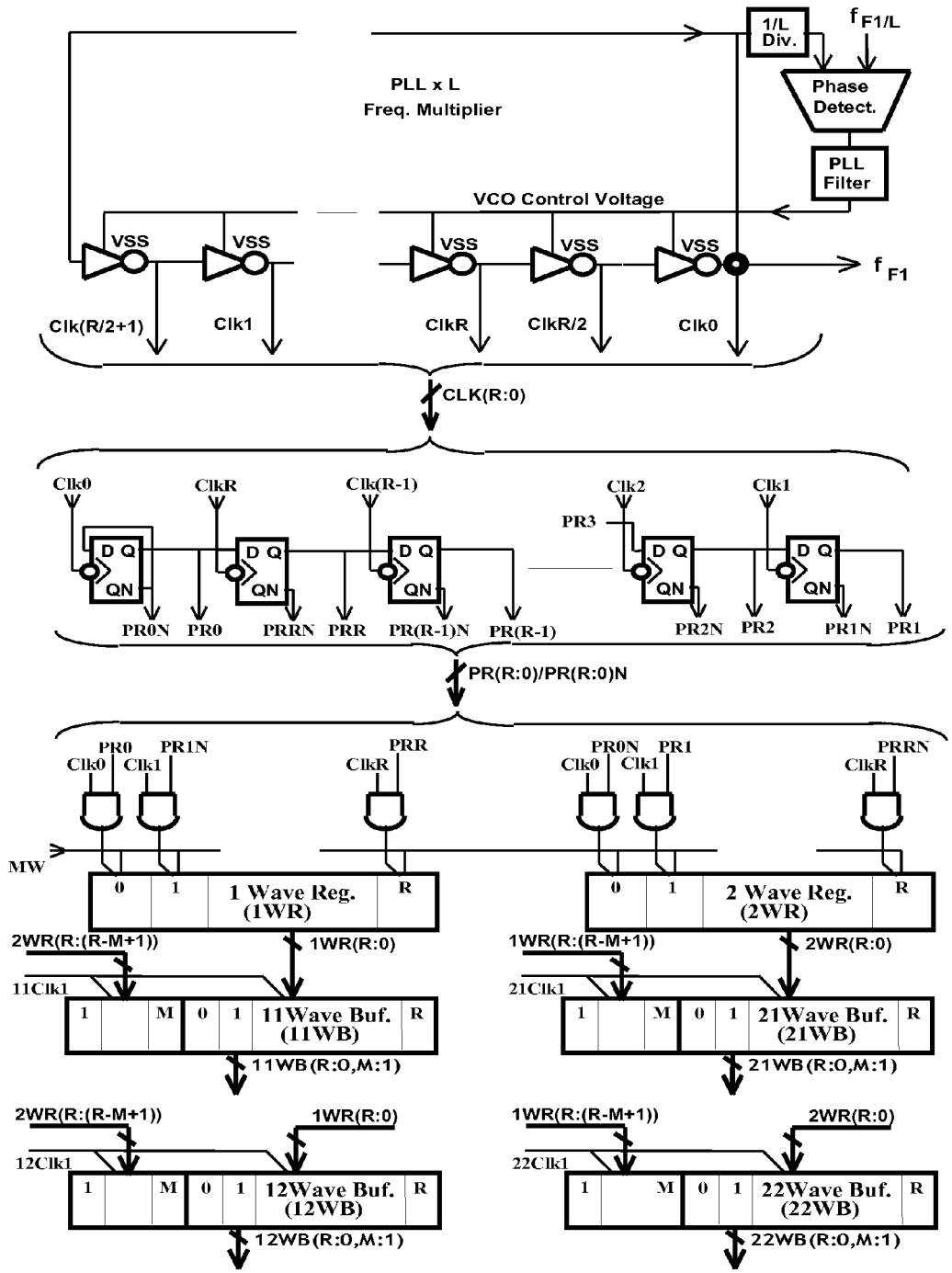

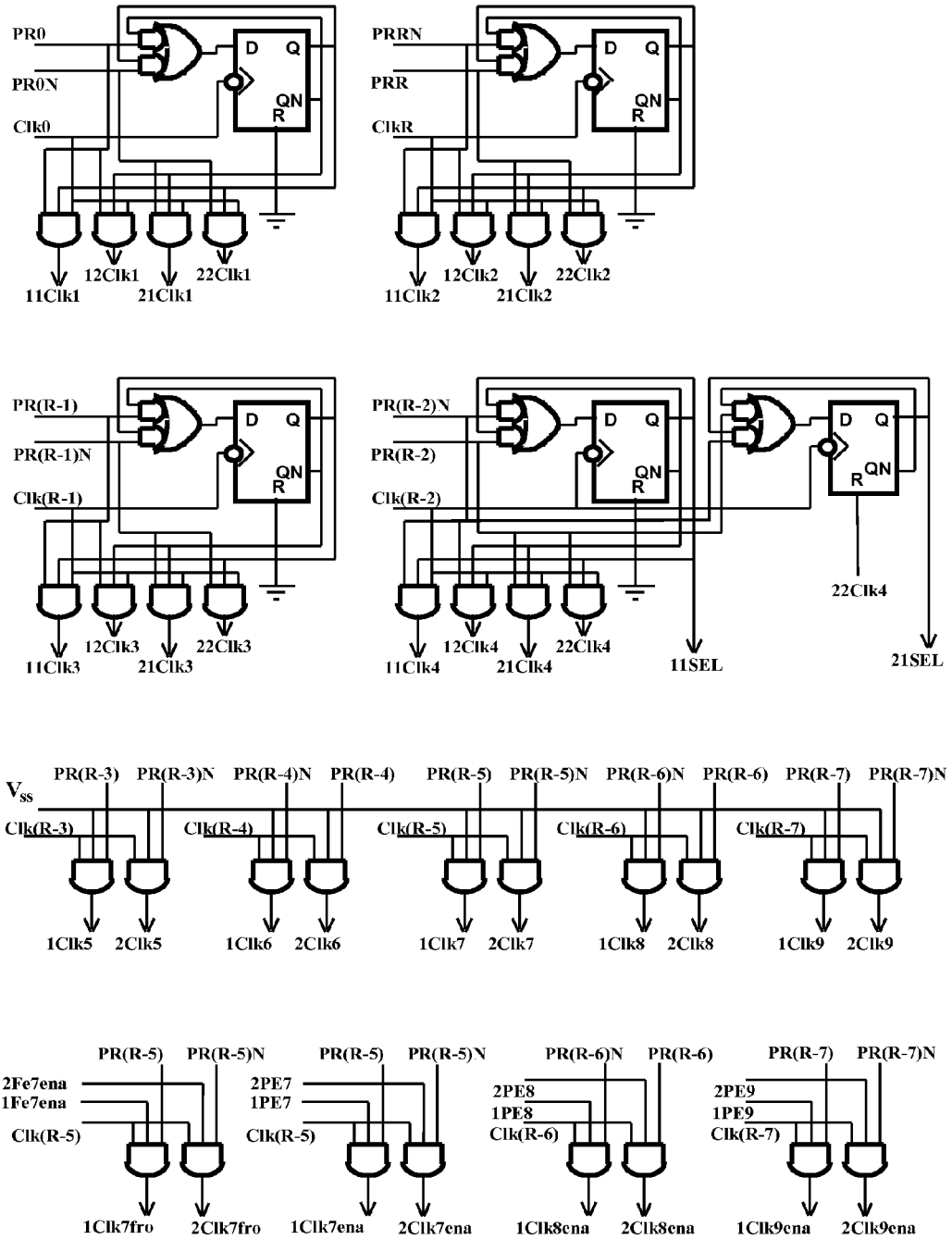

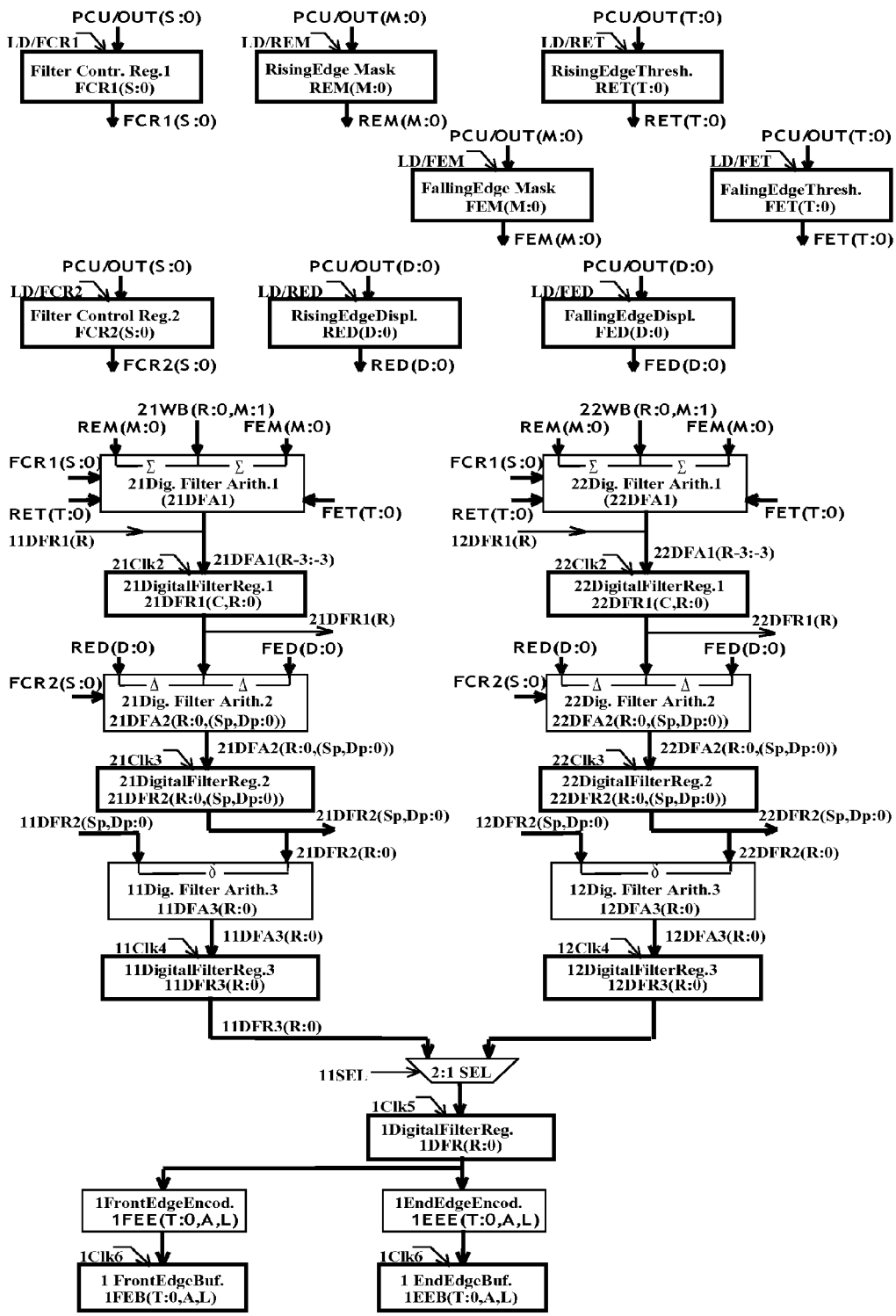
FIG.10 Noise Filtering Edge Detectors (NFED)

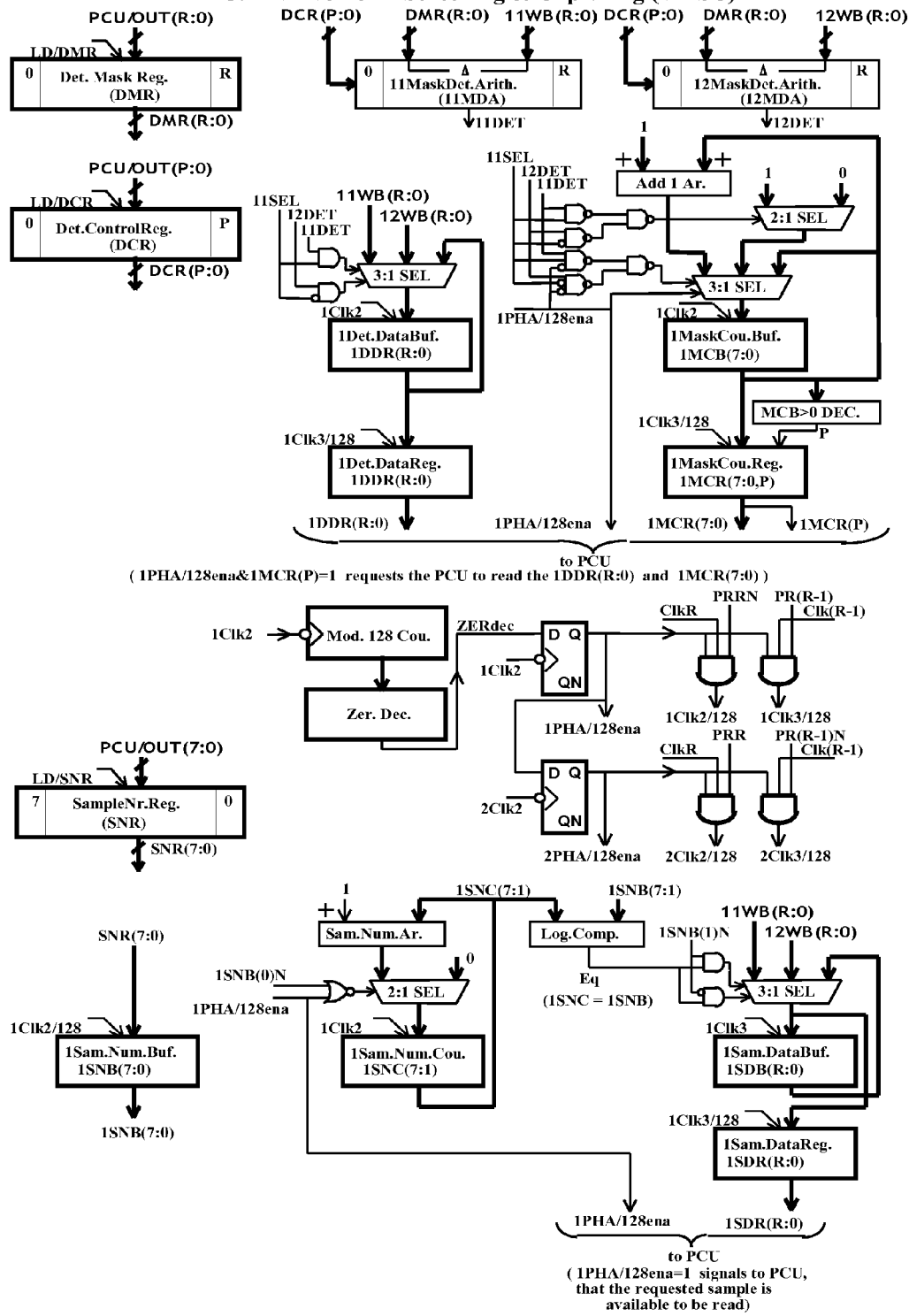

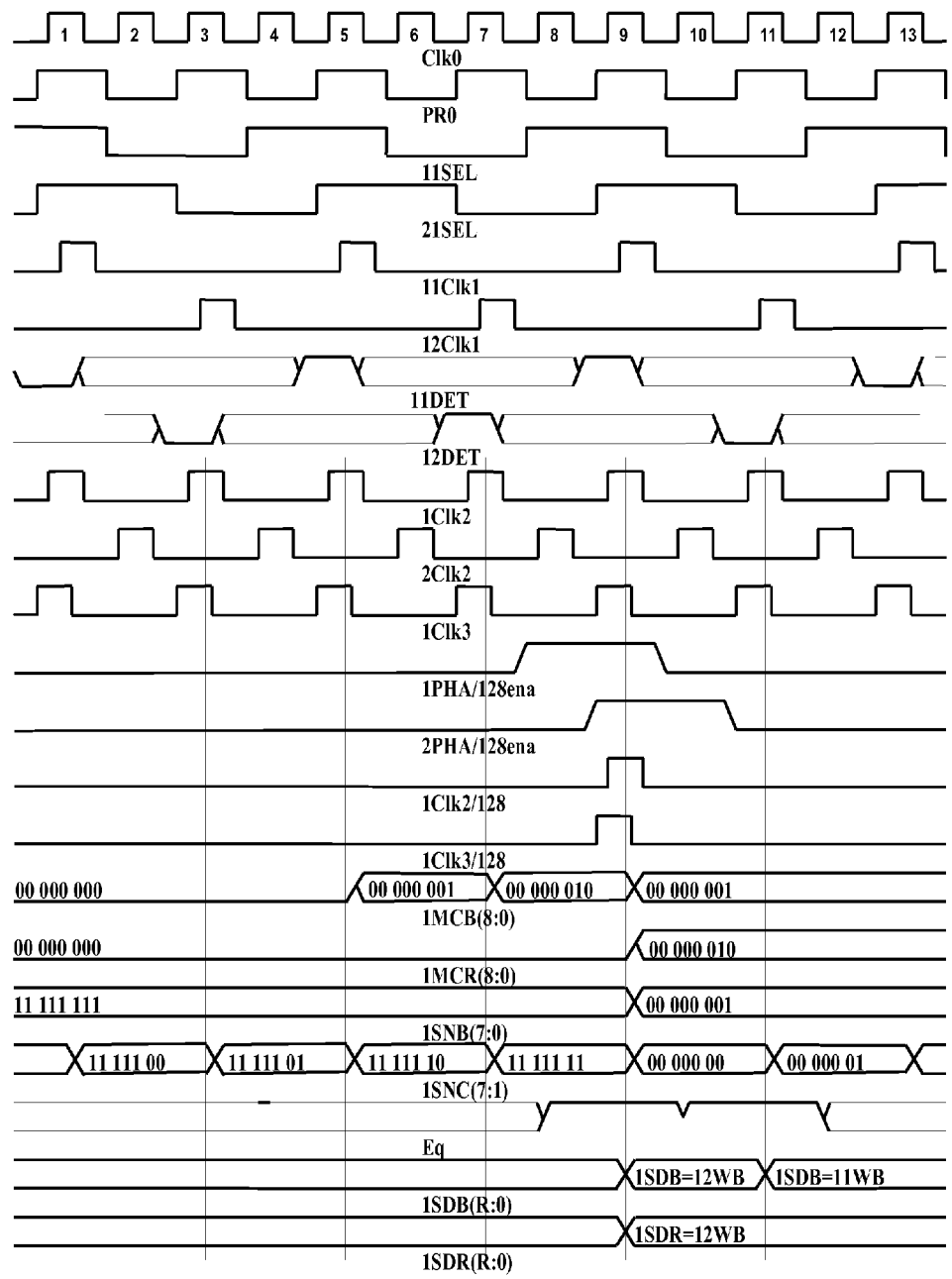
FIG.12 Timing Diagrams of the WFSC

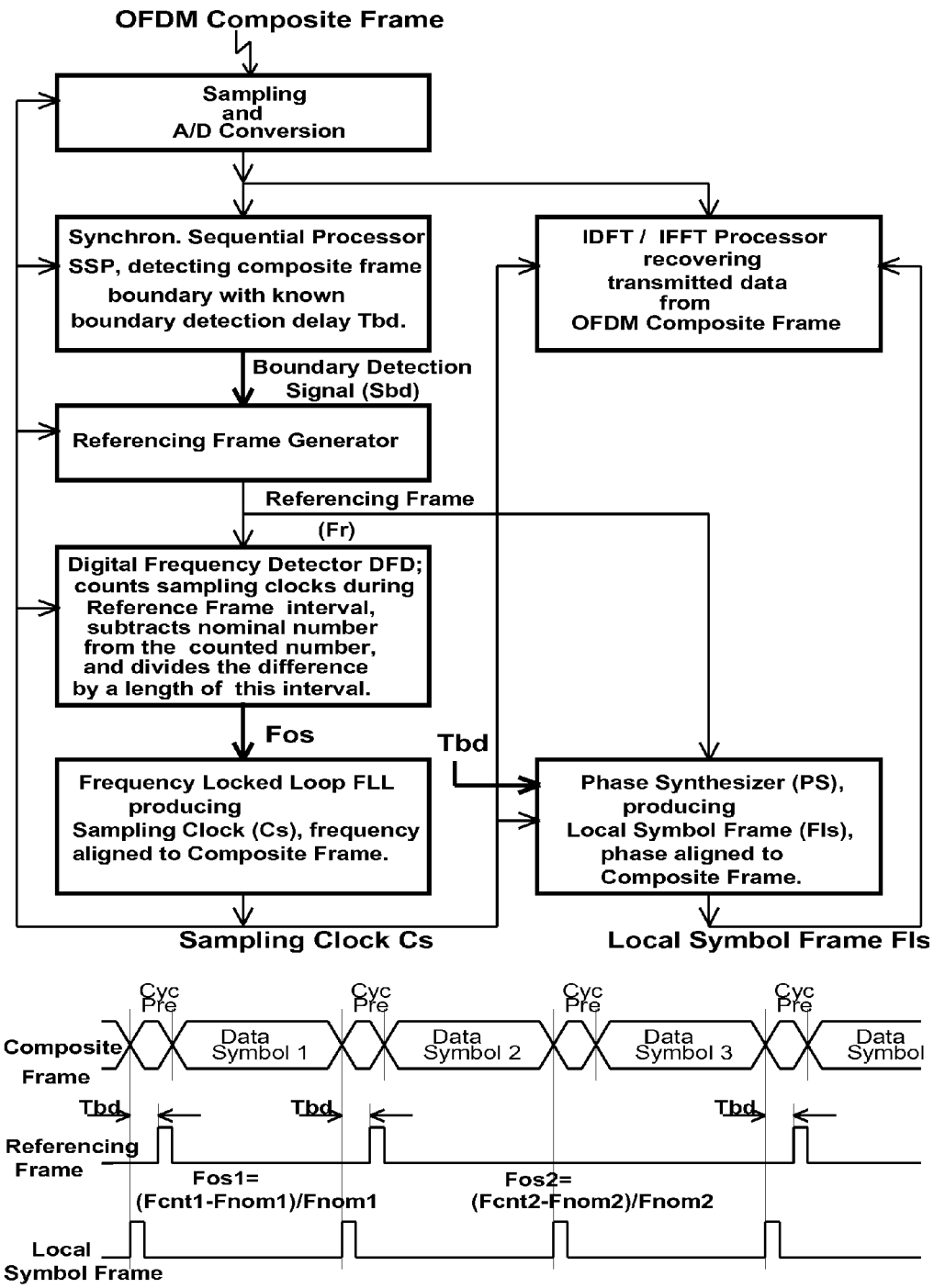
FIG.13 Inherently Stable Synchronization System

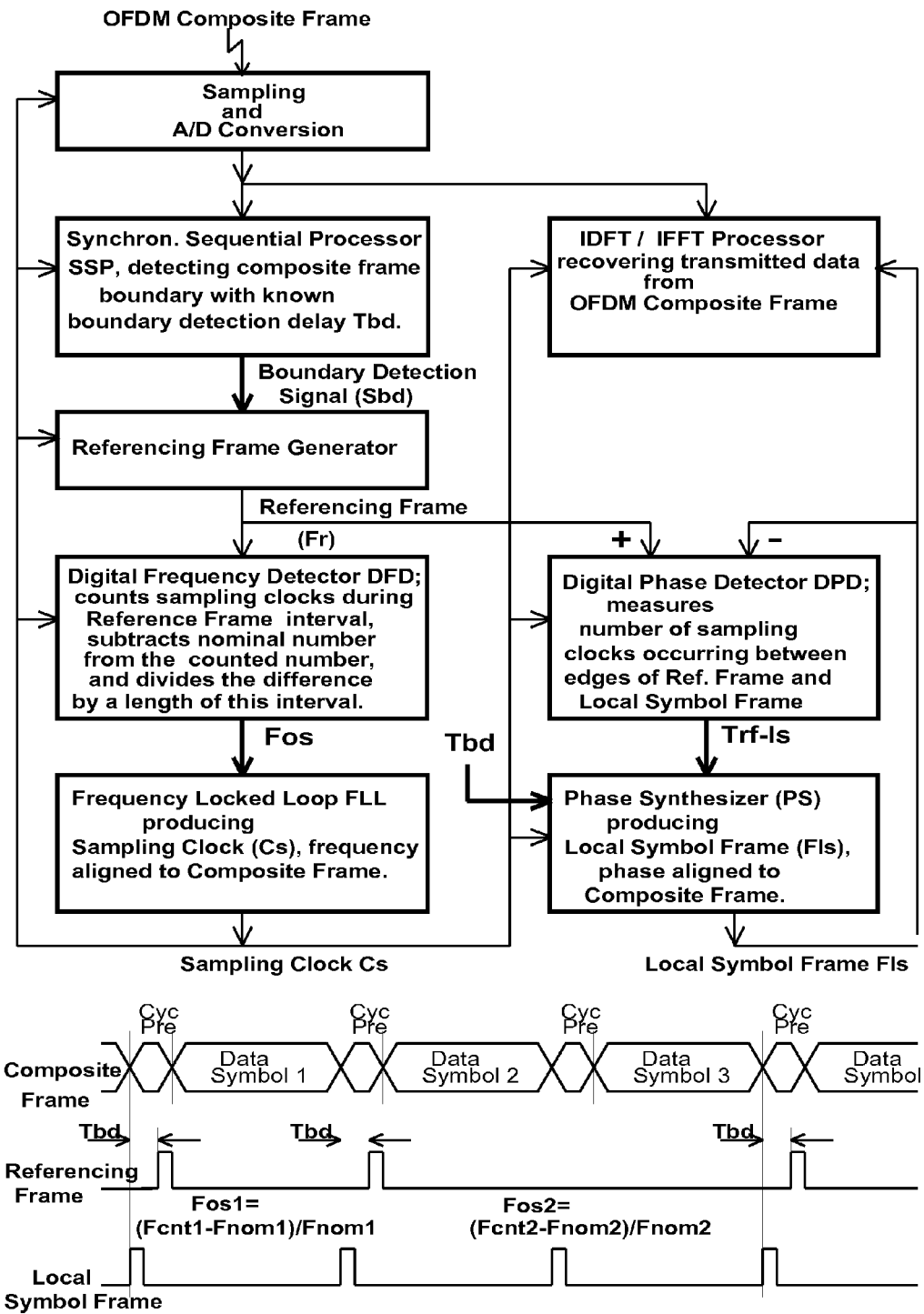

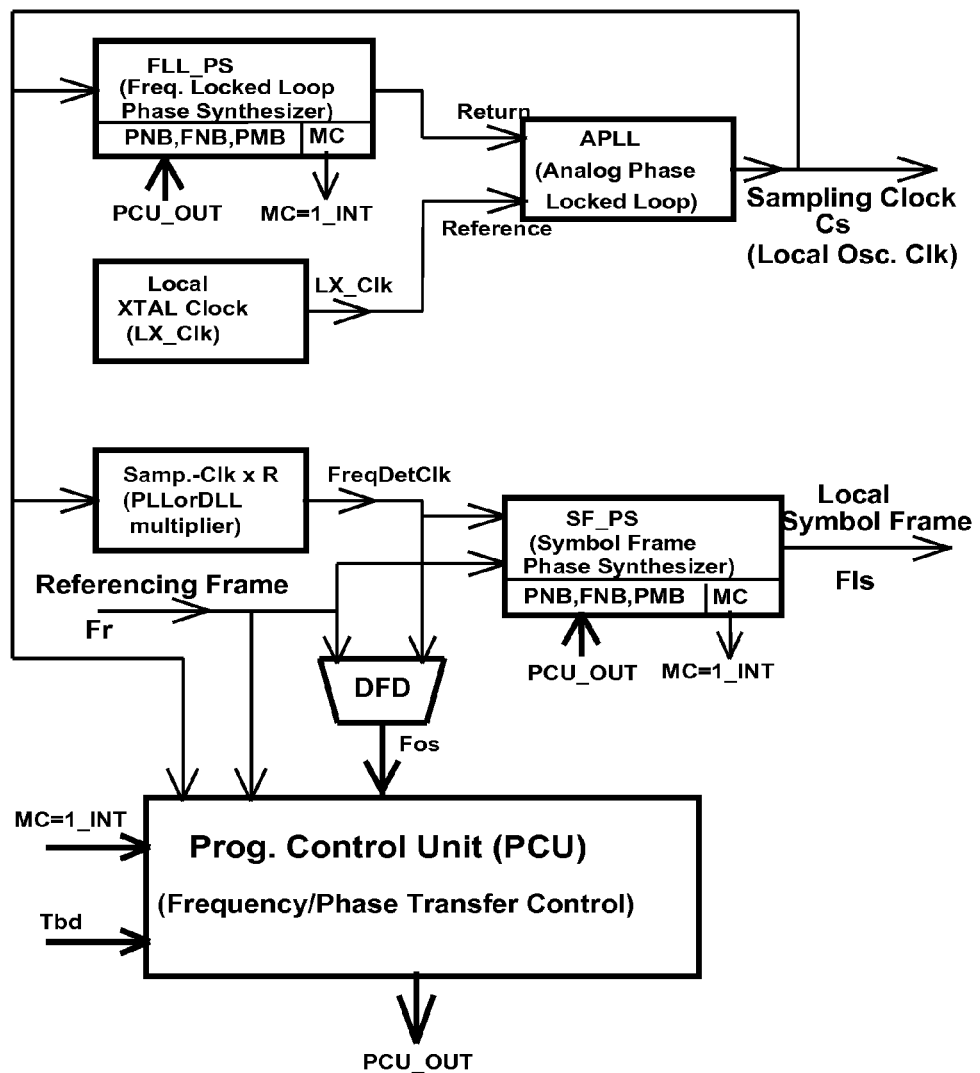
FIG.15 Inherently Stable FLPS

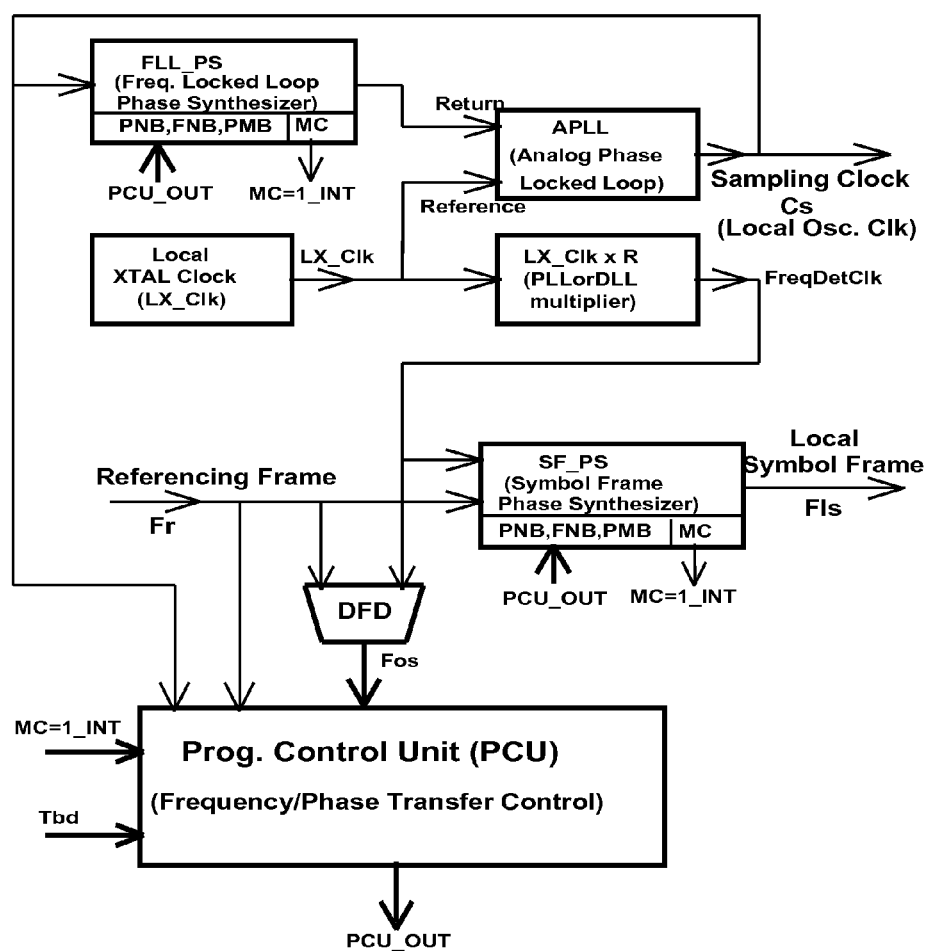
FIG.16 FLPS with Freq. Detector using XTAL clock

FIG.17 FLPS with Improved Stability
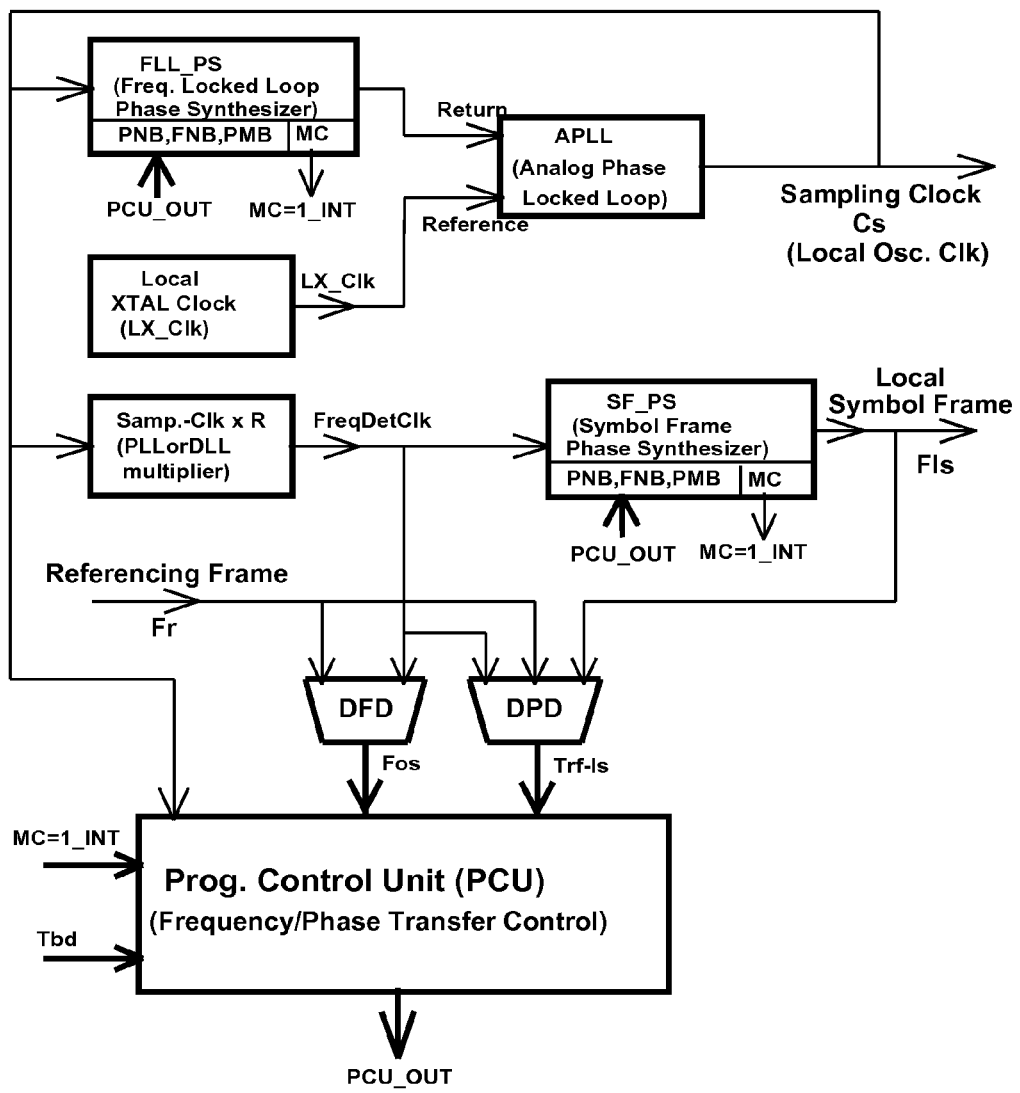

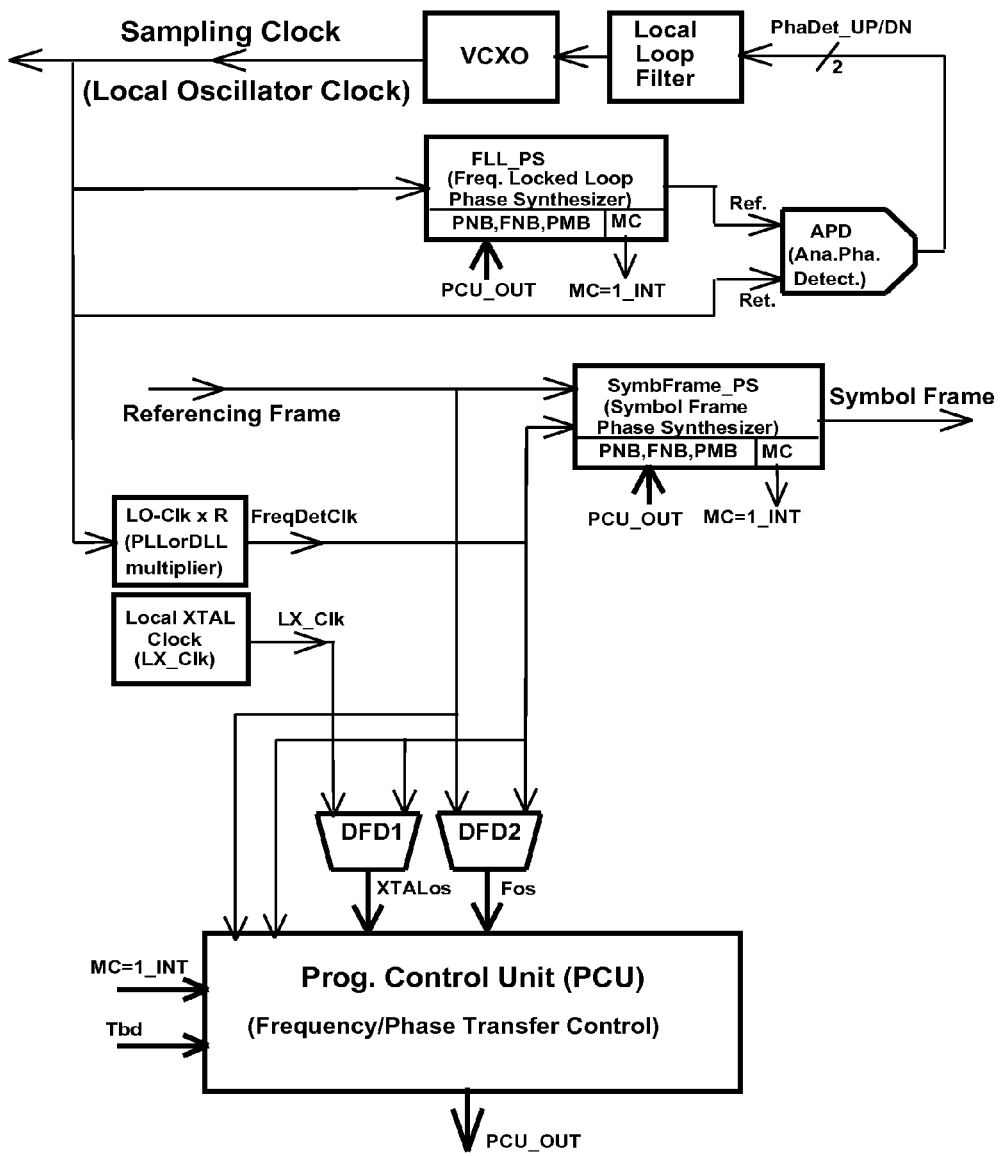
FIG.18 High Accuracy FLPS

OFDM CLOCK RECOVERY

This patent application is a continuation of U.S. patent application Ser. No. 11/931,026 filed on Oct. 31, 2007 wherein the Ser. No. 11/931,026 is hereby incorporated by reference in its entirety,
wherein the Ser. No. 11/931,026 is the continuation-in-part of international application No. PCT/CA2006/001120 filed on 27 Jun. 2006 as claiming priority benefit of Canadian informal application No. CA 2,510,004 filed on 27 Jun. 2005 and the Ser. No. 11/931,026 claims priority benefits of U.S. provisional application No. 60/894,433 filed on 12 Mar. 2007.

BACKGROUND OF THE INVENTION

1. Field of the Invention

This invention is directed to providing low cost high accuracy phase and frequency recovery techniques (PFRT) offering significantly better stability and accuracy in synchronizing systems and circuits in multiple fields including communication systems, distributed control, test and measurement equipment, and automatic test equipment.

Such PFRT comprises software controlled clock synchronizer (SCCS) which can be used in multiple fields exemplified above wherein said communication systems include communication networks for wireless or wireline or optical transmissions with very wide ranges of data rates.

The SCCS comprises further novel components such as; programmable phase synthesizers (PS), precision frame phase detectors (FPD) of an incoming wave-form, and noise filtering edge detectors (NFED) for precise recovering of wave-form edges from noisy signals.

Furthermore: since said FPD and NFED define circuits and methods enabling ~10 times faster and more accurate location systems than conventional solutions, they allow reliable location services for mobile and traffic control applications including fast movements at close ranges in noisy environments unacceptable for solutions.

Still furthermore this invention comprises receiver synchronization techniques (RST), utilizing a referencing frame, recovered from an OFDM composite signal, for synchronizing an OFDM receiver clock to a composite signal transmitter clock.

2. Background art of Software Controlled Clock Synchronizer

Conventional solutions for software controlled synchronization systems use software controlled digital phase locked loops (DPLLs) for implementing software algorithm minimizing phase errors and providing programmed transfer function between a DPLL output clock and a timing reference.

In conventional solutions said timing reference can be provided:
as a conventional external clock connected to a digital phase detector, which compares it with the local clock in order to produce the digital phase error;
or with time stamp messages sent by an external source, initiating a capture of local clock time and communicating external clock timing corresponding to the captured local timing, wherein software is used for producing said digital phase errors by comparing the captured local timing with the communicated external timing.

However the conventional DPLL configurations have four major limitations listed below:
1. DPLLs are inherently unstable if said timing reference comprises components having frequencies higher than ⅕ of the DPLL bandwidth. Since time stamp messages are sent over regular communication links they are subjected to highly unpredictable time delay variations (TDVs) resulting from collisions between different packet streams sharing a common communication line. Such unpredictable TDVs are bound to introduce timing reference components having unknown frequency spectrums, when said timing reference is provided by exchanging time stamp packages sent over shared communication link. Resulting stability problems cause such conventional DPPL configurations to be highly unreliable in many applications.
2. Conventional digital phase detectors and said software algorithms minimizing phase errors, involve accumulation of phase digitization errors. Such accumulation causes an uncontrolled phase drift of the output clock, when a software error minimization procedure is unable to recognize and eliminate persistent existence of an digitization error corresponding to a lasting unknown frequency error of the output clock.
3. Conventional digital phase detectors; offer resolutions worse than that of phase steps limited by maximum clock frequency of IC technology, and they require complex processing for calculating precise phase skews when highly irregular edges of a reference timing are defined in newly emerging timing protocols such as IEEE 1588. Similarly clock synthesizers have phase steps resolutions bounded by maximum clock frequency of IC technology and furthermore they use frequency synthesis method unable to provide high precision control of phase transients of synthesized clock.
4. Conventional clock synchronization systems require expensive local oscillators, expensive external off-chip analog components, and expensive IC technologies suitable for mixed mode operations; in order to provide highly stable and low jitter synchronization clocks required in industrial control systems and in communication networks. Temperature stable crystal oscillators are major cost contributors exceeding ⅔ of total costs of synchronization systems. However in conventional solutions; low cost highly stable crystal cuts can not be used, since their oscillation frequencies are to low to be transformed into a stable low jitter clock.

Conventional synchronization systems use digital phase detectors which are >5 times less accurate than this inventions FPD, and frequency synthesizers producing uncontrolled phase transients during any frequency switching and introducing 10 times less accurate phase steps than this inventions phase synthesizer PS.

Such frequency synthesizers are based on direct digital frequency synthesis (DDFS) method modifying average frequency of an output clock by periodical removal of a clock pulse from a continues stream of pulses. Since said frequency synthesizers use over 10 times slower phase processing and introduce unknown numbers of 10 times less accurate phase steps than the PS, they are unable to perform any phase synthesis and produce uncontrolled phase transients during frequency switching and introduce much more jitter than the PS.

Consequently; in order to limit phase transients to acceptable levels, said conventional synchronization systems are bound to work in closed loop configurations wherein output clock phase is subtracted from reference clock phase and resulting phase error is minimized by a programmable control unit driving frequency synthesizer producing said output clock 3. Background art of Receiver Synchronization Techniques Insufficient accuracy of conventional synchronization for OFDM receivers impose major limitations on OFDM communication quality (see Cit. [1] and [2] listed below) and such limitations are compounded by rapidly growing data rates.

Some conventional solutions add specific preambles inserted into composite signal (Cit. [3], [4], [5], and [6]). Such preamble comprises similar parts having known phase (displacement in time) within the preamble.

Such preambles enable detection of symbol boundary time offset, by steps of:

evaluating correlation functions between OFDM signal portions shifted properly in time until such similar preamble parts are detected;

using a phase of local clock frame marked by the similar parts detection and said known phase of such similar parts detected, for estimating time offset of the local frame;

estimating frequency offset of the local clock versus transmitter clock by analyzing said correlation functions between such preamble parts shifted properly in time.

Other synchronization solutions analyze correlation estimates of received pilot preambles or pilot tones with predefined pilot preambles or pilot tones (Cit.[7]), in order to estimate time offset and frequency offset of the local clock frame.

However such use of preambles or pilots; reduces system efficiency by using signal power that could otherwise have been used for transmitting data, and allows limited accuracy only due to such detection and estimates sensitivity to channel interference and insufficient data supplied in the preamble.

There are also pilot-less synchronization techniques. One such pilot-less technique, named maximum likelihood (ML) method (Cit.[8]), utilizes inherent redundancy in OFDM signal, by correlating parts of the signal with other parts having known positioning within frame (cyclic prefix). However; as such pilot-less technique uses statistical methods and depend on transmitted data patterns, they are even less accurate than those using preambles or pilots.

Another pilot-less technique calculates timing offset and frequency offset from displacements of tone phases caused by said timing and frequency offsets (Cit.[9]).

Fundamental deficiency of conventional solutions characterized above is their inability to perform any accurate measurement of frequency offset; due to their reliance on using phase offset observed over single preamble/pilot period only for the frequency offset estimation. Such estimates degraded by unpredictable OFDM channel interference, can not be helped enough by averaging them for as long as each estimate is calculated over single preamble/pilot.

Still other significant deficiency of conventional synchronization is instability of their phase locked loops (used for phase and frequency tracking), caused by changing data patterns and/or unpredictable phase error components introduced into OFDM channel by generally unknown interference.

Such conventional synchronization solutions for OFDM receivers did not succeed in providing reliable and accurate recovery of a referencing frame providing time domain definition of phase and frequency of received OFDM composite frame. However such referencing frame defined in time domain, is essential for achieving accurate control of local oscillator frequency offset and receiver time offset (receiver phase error).

OFDM composite signal has not been originally designed to carry distinctive edges enabling detection of composite frame boundaries, and conventional DFT/IDFT frequency domain processing is not well suited for any accurate detection of such boundaries occurring in time domain either.

Conventional DSP techniques and processors used are not equipped to perform real-time processing of OFDM signal needed to produce such referencing frame maintaining predictable accurate timing relation to the OFDM signal received.

Such major deficiencies of conventional solutions are eliminated by the RST as it is explained in Subsection 2 of BRIEF SUMMARY OF THE INVENTION.

CITATIONS

[1] "Equalization for DMT-Based Broadband Modems" by Thierry Pollet at al., IEEE Communications Magazine, Volume 38, Issue 5, May 2000.
[2] "Retraining WLAN Receivers for OFDM Operation" by Ivan Greenberg, CommsDesign, January 2002.
[3] "A Symbol Synchronization Algorithm for OFDM Systems" by T. Salim at al., Communication Systems and Networks ~AsiaCSN 2007~ April 2007.
[4] "Synchronization Approach for OFDM based Fixed Broadband Wireless Access Systems" by M. Gertou, G. Karachalios, D. Triantis, K. Papantoni and P. I. Dallas, INTRACOM S. A., July 2005.
[5] "A Novel Scheme for Symbol Timing in OFDM WLAN Systems" by Yong Wang at al., ECTI Transactions on Electrical Eng. Electronics and Communications, August 2005.
[6] "Performance of a novel carrier frequency offset estimation algorithm for OFDM-based WLANs" by ZHAO Zhong-wei, Journal of Zhejiang University SCIENCE A, 2006 7(3).
[7] "Synchronization Schemes for Packet OFDM System" by Haiyun Tang, Kam Y. Lau and Robert W. Brodersen, IEEE International Conference on Communications, May 2003.
[8] "ML Estimation of Timing and Frequency Offset in Multicarrier Systems" by Jan-Jaap van de Beek, Magnus Sandell, Per Ola Borjesson, Lulea University of Technology, April 1996.
[9} "A Robust Timing and Frequency Offset Estimation Scheme for Orthogonal Frequency Division Multiplexing (OFDM) Systems" by Bruce McNair, Leonard J. Cimini, Nelson Sollenberger, VTC99 May 1999.

BRIEF SUMMARY OF THE INVENTION

1. Brief Summary of SCCS

Since the SCCS system is using said very accurate FPD and said very accurate PS free of any uncontrolled phase transients, it can implement an inherently stable open loop configuration wherein a programmable control unit (PCU) provides signals producing totally predictable output clock phase implementing precisely defined phase transfer function between an external timing reference and the output clock. In addition to elimination of said feedback related instability problems, such SCCS system allows ~10 times better control of output clock phase transients and much lower phase jitter by synthesizing output phase with ~10 times smaller and more accurate phase steps than conventional solutions.

The SCCS eliminates all four limitations mentioned in the "Background art" section, by contributing improvements listed below:

1. Since the SCCS uses an open-ended phase control system without any closed loop feedback, the SCCS enables inherently stable synthesis of the output clock, independently of reference frequency spectrum.
2. The SCCS defines digital frame phase detector (FPD), which eliminates said accumulation of digitization errors during phase tracking of highly irregular waveforms communicated with stamp messages of IEEE 1588 protocol.

3. The FPD part of the SCCS offers >5 times more accurate measurements of time errors, between the local clock and an external clock, occurring during variable lengths time intervals communicated by the external source. The SCCS defines digital phase synthesizer (PS) enabling direct precise control of phase transfer function between PSs input and output clocks, and the PS allows ~10 times lower jitter of output clock phase.

4. The SCCS significantly reduces system manufacturing costs, by enabling use of inexpensive lower frequency oscillators including all oscillators already used by potential customers, and by enabling use of inexpensive standard CMOS technologies for synthesizing high precision synchronization clocks. The SCCS includes a Hybrid PLL (HPLL) which can multiply crystal frequencies as low as 30 kHz into a stable low jitter clock in GHz frequency range. The HPLL comprises a DPLL driving an analog PLL (APLL) using an analog phase detector (APD) with return input connected to an APLL output clock and with reference input connected to said PS receiving the APLL output clock. The DPLL minimizes digital phase error between said crystal oscillator clock and the APLL output clock, by introducing phase steps into a transfer function of said PS which produce appropriate phase errors on an output of said APD. Since the DPLL is programmable; it can convert any oscillator frequency into any local clock frequency, and consequently it allows use of local oscillator of any frequency including low frequency crystals and oscillators proven already in customers products.

Such HPLL solution is unique, as it allows: multiplication of said very low frequency clocks by factors which can be made as high as 50 000 without increasing jitter or causing stability problems, combined with indefinite flexibility and precision in setting frequency of generated high frequency clocks.

This major contributions over conventional solutions make the HPLL conclusively superior alternative to conventional PLLs in many major areas including analog, mixed mode SOC, signal processing, and all frequency control products where low jitter high multiplication is the major bottleneck.

In addition to the above mentioned advantages over conventional solutions; the SCCS offers unique ability of precise recovering of every single edge of incoming noisy waveform, with adaptive time-domain noise filtering edge detector (NFED). The NFED densely over-samples incoming waveform, and filters out phase noise from wave-form edges and eliminates amplitude glitches from wave-form pulses.

Still other advantage of SCCS is its ability to provide a single SOC design accepting all practically possible frequencies of timing references, as it is presented by a Heterodyne Timing Configuration of SCCS shown in FIG. 3 described in the next section.

In contrary to conventional solutions, the SCCS is not limited to discrete sets of input/output frequencies or local oscillator frequencies, but accepts a local oscillator (LocOsc) of any frequency and accepts an external reference clock (Ext_RefClk) of any frequency or an external reference waveform (Ext_RefWfm) carrying any reference frequency, while providing any required frequency of an SCCS output clock (OutClk).

Such very wide universality will allow synchronization products suppliers to replace wide variety of their SOC products with a single chip solution. Consequently, their own costs will be significantly reduced and such single chip solution will make their product much more competitive as being easier to use across diversified product lines produced by major equipment manufacturers who are their major clients.

The next section SUMMARY OF THE INVENTION; explains major configurations of the SCCS (see also FIG. 1, FIG. 2 and FIG. 3), and justifying said configurations novel components such as the phase synthesizer, the frame phase detector and the noise filtering edge detector.

2. Brief Summary of Receiver Synchronization Techniques

The RST alleviates said deficiencies of conventional solutions, since the RST comprises:

supplementing or replacement of said conventional DSP techniques and processors unequipped to perform real-time processing of OFDM signal, with real-time synchronous processing techniques enabling very accurate detection of composite frame boundaries enabling time domain definition of said referencing frame maintaining predictable accurate timing relation to the OFDM signal received;

recovery of timing of composite frames boundaries, and using such timing to define said referencing frame;

using such referencing frame interval corresponding to any required plurality of OFDM symbols for estimating frequency offset, wherein estimation accuracy by one order higher than that of conventional solutions can be achieved (such accuracy improves proportionally to a length of referencing frame interval);

inherently stable frequency locked phase synthesis method (FLPS) for receiver frequency and phase control, wherein such highly accurate frequency offset estimates are used by a frequency locked loop for controlling frequency of its oscillator clock while time offset (phase error) estimates are applied only to a phase synthesizer utilizing such oscillator clock for synthesizing local symbol frame phase minimizing such time offset estimates (i.e. phase aligned with the composite signal frame).

The RST comprises methods and systems for accurate and reliable recovery of said referencing frame from preambles or pilots commonly used already in OFDM systems, thus enabling substantially better receiver synchronization to OFDM composite signal frame.

Furthermore the RST comprises solutions enabling very accurate recovery of the referencing frame from data carrying tones only, and thus RST contributions over conventional solutions include; 10× lower frequency and time offset combined with improvement of system efficiency by eliminating preambles and pilots needed previously.

SUMMARY OF THE INVENTION

1. Open Ended Configuration of Software Controlled Clock Synthesizer

The open ended configuration of SCCS (OEC) is presented in FIG. 1. Such configuration comprises two major parts described below.

The first part is said Hybrid PLL (HPLL) for multiplying said local oscillator frequency provided by a crystal producing frequencies as low 30 kHz, by a programmed by PCU factor which can exceed 50 000 without any increase of jitter levels and without any stability problems.

The HPLL provides practically indefinite flexibility and precision in setting frequency of generated high frequency clocks. Resulting frequency can rise as far as it is supported by a voltage controlled crystal oscillator (VCXO), as long as it remains lower than maximum clock frequency which exceeds GHz ranges in present IC technologies.

The HPLL comprises a DPLL (DPLL) driving an analog PLL (APLL) using an analog phase detector (APD) with return input connected to an APLL output clock (LocClk) and with reference input connected to a local phase synthesizer (LOC_PS) receiving the APLL output clock.

The DPLL minimizes digital phase error 2 (PhaErr2) between said local oscillator (LocOsc) and the LocClk, by introducing phase steps into an output phase of said LOC_PS which are converted by the APD into analog phase errors controlling phase locking between the LocClk and the OscClk.

The DPLL uses a frequency phase detector 2 (FPD2) for measuring said PhaErr2 which is read by a programmable control unit (PCU) using it for producing said phase steps introduced into said LOC_PS output phase, wherein amount of introduced phase steps is controlled using an MC=1_INT signal received by the PCU from the LOC_PS. The MC=1_INT signals a request from the LOC_PS demanding the PCU to send the next series of said phase steps when the last series is applied already. The FPD2 receives PCU control signals programming expected relation between phase of the OutClk and phase of a sampling clock (SampClk) derived from the LocClk through a simple multiplication by a factor <8.

The second part is an open ended software controlled synthesizer (OE_SCS) using PCU software sub-routines for providing a programmable phase transfer function (PTF) between the Ext_RefWfm and the OutClk.

The OE_SCS offers; unique ability to program very precisely synchronized phase free of any uncontrolled transients. Therefore, the OE_SCS provides ~10 times better precision in frequency and phase control than conventional solutions. Furthermore, the OE_SCS offers inherently stable configuration independently of said highly unpredictable frequency spectrum of the time delay variations occurring in the Ext_RefWfm. Consequently, the OE_SCS eliminates serious stability problems of conventional clock synchronizers bound to use closed loop configurations for implementing message-based protocols.

Said PCU controls operations of the OUT_PS by defining series of phase steps inserted by the OUT_PS into a phase of the OUTCLK.

The PCU calculates said phase steps by processing:
a phase error 1 (PhaErr1) received form a frame phase detector 1 (FPD1) measuring phase error between the sampling clock and a filtered reference wave-form (Filt_RefWfm);
time stamp messages received from a Time Stamp Decoder (TSD) recovering such messages from the FILT_RefWfm produced by a noise filtering edge detector (NFED).

The PCU supplies the next series of said phase steps in response to the interrupt MC=1_INT from the OUT_PS which signals that insertions of the last series has been completed.

Furthermore the PCU controls operations of the NFED providing adaptive time domain filtering of the Ext_RefWfm carrying synchronization signals which can be encoded into time stamp messages or can be conventional BITS references.

The PCU receives unfiltered wave-form samples from the NFED and calculates most suitable noise filtering masks and algorithms which the PCU communicates back to the NFED (see Subsection 8. Noise Filtering Edge Detector).

Compared to a moment when a sync message requesting capturing of a time stamp is received by the PCU; an exact sync edge of the FILT_RefWfm destined to capture said time stamp can be displaced in time by a known number of message symbols (edge displacement). Such edge displacement is determined by a messaging protocol used.

Since FPD1 keeps capturing time stamps of all received edges of the FILT_RefWfm, the FPD1 or the PCU shall be equipped with an edge selection circuit (ESC). The ESC provides selection of time stamps captured by said sync edge and is synchronized by the time stamp messages produced by the Time Stamp Decoder.

Further definitions of a synchronization means provided by the OEC, such as Free-Run and Hold-Over modes, are provided in the Subsection 4.

2. Open Ended Configuration of SCCS with External Synchronization Mode

The open-ended configuration of SCCS with external synchronization mode (OEC_ESM) is presented in FIG. 2 and is described below.

The OEC_ESM comprises the previously explained OEC and is further extended by adding an output clock analog PLL (OutClk_APLL). The OutClk_APLL filters out jitter from a synthesized clock from the OUT_PS (SynOutClk) and produces SCCS output clocks (OutClk(T:1)) which are phase aligned with a reference clock selected by the PCU from a set of timing references including the SynOutClk, external reference clocks (Ext_RefClk) and a clock signal form a mate SCCS unit (f_mate).

Said external reference clocks are used in the external synchronization mode, wherein they are produced by a master synchronization unit and are used to synchronize multiple other units located in a back-plane of a network element. However said other units can alternatively use other synchronization references available in other synchronization modes and may be synchronized by the Ext_RefWfm carrying a message based protocol or BITS clocks.

Such plurality of synchronization references and modes allows switching to one of alternative references when an active reference fails.

The f-mate clock from a mate unit allows Master/Slave protection switching which is described in the Subsection 4.

The output clock analog PLL comprises:
a reference selector (RFS) connected to the SynOutClk from the OUT_PS and to the external reference clocks and to the f_mate clock and to the PCU, wherein the PCU controls selections of made by the RFS producing a reference clock (RefClk) for the OutClk_APLL;
a return clock divider (RCD) connected to a filtered output clock (Fil_OutClk) of the OutClk_APLL and to the PCU, wherein the PCU defines a division coefficient matching frequency of a return clock (RetClk) for the OutClk_APLL with a frequency of the RefClk; an analog phase detector OutClk_APD connected to the reference clock and to the return clock, and producing an analog phase error (PhaDet_UP/DN) driving an output clock loop filter (OutLoopFil) which drives a VCXO producing the filtered output clock;
an output PLL (OUT_PLL) for multiplying one selected OutClk(T:1) clock and for providing phase alignment between all the OutClk_APLL and the Fil_OutClk, wherein the OUT_PLL is connected to the selected OutClk(T:1) clock and to the Fil_OutClk;
an output clocks generator (OCG) connected to the output of the OUT_PLL and to the PCU, wherein the OCG produces the OutClk(T:1) which are phase aligned but have different frequencies wherein the PCU controls OCG operations by programming said frequencies of the SCCS output clocks.

Further definitions of synchronization means provided by the OEC_ESM, are provided in the Subsections 3 and 4.

3. Heterodyne Timing Configuration of SCCS

The heterodyne timing configuration (HTC) simplifies SCCS by integrating:

both the APLL and the OC APLL from the OEC_ESM, into a single APPL;

and both the REF_PS and OUT_PS from the OEC_ESM, into a single RET_PS.

The two previous configurations of SCCS offer said practically unlimited universality in accepting said local oscillator (LocOsc) of any frequency and accepting said external reference waveform (Ext_RefWfm) carrying any reference frequency, while providing all practically needed frequencies of said SCCS output clocks (OutClk(T:1)).

The HTC extends this universality even further by enabling acceptance of practically unlimited ranges of said external reference clocks (Ext_RefClk) as well.

Therefore despite implementing a close loop system, the HTC may still be used as a less costly alternative; if timing reference is not provided by a message based protocol, or if a message-based protocol is used in simple networks with stable TDVs.

Said integration is achieved by placing a return phase synthesizer (RET_PS) into a return path of the integrated APLL. Consequently said phase steps supplied by the PCU need to be reversed as they are subtracted from a phase of a reference clock of the APLL instead of being added to it. Indefinite RET_PS flexibility in phase and frequency generation makes it much better frequency divider than the previous configuration Return Clock Divider and allows said unlimited flexibility in accepting all frequencies of the Ext_RefClk.

Resulting HTC comprises:

a programmable control unit (PCU) for implementing a programmable phase transfer function PTF between the OutClk and the Ext_RefClk or the Ext_RefWfm, wherein the PCU controls operations of the return phase synthesizer (RET_PS), the PCU has a terminals for an interrupt MC=1_INT and for a first phase error (PhaErr1) and for a second phase error (PhaErr1) and for a time stamp message and for a waveform sample;

the reference selector (RFS) connected to a filtered local clock (Fil_OutClk) and to the external reference clocks (Ext_RefClk) and to the f_mate clock and to the PCU, wherein the PCU defines selections made by the RFS producing a reference clock (RefClk) for the analog phase detector (APD);

the RET_PS connected to a filtered output clock (Fil_OutClk) and connected to the PCU wherein the RET_PS requests PCU to supply the next series of phase steps by activating the MC=1_INT, wherein the RET_PS introduces such phase steps into the Fil_OutClk thus synthesizing a return clock (RetClk) for the APD;

the APD connected to the RefClk and to the RetClk, the APD producing an analog phase error (PhaDet_UP/DN) driving an output clock loop filter (OutLoopFil) which drives a VCXO producing the filtered output clock;

the output PLL (OUT_PLL) for multiplying one selected OutClk(T:1) clock and for providing phase alignment between all the OutClk_APLL and the Fil_OutClk wherein the OUT_PLL is connected to the selected OutClk(T:1) clock and to the Fil_OutClk, wherein the OUT_PLL produces an output reference clock (OutRef) connected to the OCG and to the FPD2;

the output clocks generator (OCG) connected to the output of the OUT_PLL and to the PCU, wherein the OCG produces the OutClk(T:1) which are phase aligned but have different frequencies wherein the PCU controls OCG operations by programming said frequencies of the SCCS output clocks;

the NFED and the TSD and the FPD1 and the FPD2 having the same connectivity and performing the same operations as defined in the Subsection 1, with the exception of the FPD2 which is connected to the OutRef and to the LocOsc and to the PCU;

wherein the PCU uses its internal micro-operations for implementing filter functions of an on chip digital PLL (DPLL) by processing the PhaErr1 and the PhaErr2 and the time stamp messages into the PCU output driving the RET_PS into producing the synthesized return clock providing compliance of the SCCS output clocks with the phase transfer function defined by the PTF, wherein the PCU controls NFED operations as it is described in the Subsection 1.

4. SCCS Configurations

In contrary to conventional frequency synthesizers, SCCS phase synthesizer produces totally predictable phase and frequency responses to received from the PCU control signals. Therefore it enables said open ended configurations which can work with only one frame phase detector (FPD) for measuring phase errors between a timing reference and a local clock, in order to implement an actual synchronization system. The second FPD in the open ended configuration explained in the Subsection 1, is used for the frequency multiplication of said local oscillator only. If a local clock had sufficiently high frequency, the FPD would not be needed at all.

As said conventional frequency synthesizers produce unpredictable transient during frequency switching, they require second digital phase detector for providing feedback about a phase of synthesizers output clock in order to reduce said phase transients with a DPLL.

An open ended configuration without said multiplication of LocOsc frequency is defined below. A Software Controlled Clock Synthesizer (SCCS) for implementing a programmable phase transfer function (PTF) between an SCCS output clock (OutClk) and external reference clocks (Ext_RefClk) or an external reference carrying wave-form (Ext_RefWfm) such as BITS references or line references or time stamp messages; the SCCS comprises:

a programmable control unit (PCU) using software subroutines for controlling SCCS status and for said implementation of the PTF, wherein the PCU controls operations of a return clock phase synthesizer (RET_PS), the PCU has terminals for interrupts from other SCCS circuits and for a first phase error (PhaErr1) and for a second phase error (PhaErr2) and for a time stamp message and a for a waveform sample;

the RET_PS for synthesizing a return clock (RetClk), the RET_PS connected to the PCU and to the SCCS output clock (OutClk);

the APLL for producing the OutClk, wherein a reference input of the APLL is connected to the OutClk or to the Ext_RefClk while the return input of the APLL is connected to the synthesized RetClk;

a first frame phase detector (FPD1) receiving a local reference clock (LocClk) and the Ext_RefWfm or receiving the LocClk and the OutClk or receiving the Ext_RefClk and the OutClk, wherein the FPD1 produces the PhaErr1 connected back to the PCU;

wherein said PCU uses said software subroutines for implementing a digital PLL (DPLL) by processing said first phase error and the second phase error into the PCU output driving the RET_PS into synthesizing the RetClk providing compliance of the APLL output clock with the phase transfer function defined by the PTF.

The SCCS includes reference selection means for alternative use of one of multiple connected external timing references, such as reference clocks or external waveforms, for producing the SCCS output clock, the SCCS further comprises:

a reference selector connected to multiple external timing references and controlled by the PCU, wherein the PCU selects one of the multiple timing references for being connected to the FPD1 which is read by the PCU and used by PCU subroutines for controlling the SCCS output clock;

activity monitors for the external timing references for producing status signals indicating active/non-active conditions, wherein said status signals are connected to the PCU;

wherein the output signals of the activity monitors are read and processed by the microprocessor which is producing reference selection signals connected to the reference selectors.

The SCCS further comprises:

an output phase locked loop (OUT-PLL) referenced by the APLL output clock and producing a fundamental output clock, wherein the OUT-PLL has a return input connected to one SCCS output clock;

an output clock generator (OCG) connected to the fundamental output clock, the OCG produces a plurality of the SCCS output clocks (OutClk).

The SCCS further comprises:

interface circuits, for communication with an external control processor, connected to the external control processor and to the PCU (see the Parallel Interface and the Serial Interface in the FIG. 1 and FIG. 2 and FIG. 3);

wherein the interface circuits and the PCU enable the external control processor to read information about statuses of the activity monitors and to select an external reference clock or the local reference clock for referencing the SCCS output clock.

Furthermore in the interface circuits and the PCU enable the external control processor to perform switching of mode of operation of the SCCS between the APLL mode and the DPLL mode.

The SCCS PCU is provisioned to perform operations listed below:

reading information about statuses of the activity monitors and selecting an external timing reference or the local reference clock for referencing the SCCS output clock;

switching mode of operation of the SCCS between the APLL mode and the DPLL mode.

Furthermore the SCCS is provisioned to perform a master/slave mode switching for maintaining phase alignment between an active SCCS unit and a backup SCCS unit installed in a back-plane for protection switching, the SCCS comprises:

a master/slave subroutine reading activity monitor of a reference clock provided by a mate SCCS unit and reading internal status of the own SCCS unit;

wherein the master/slave subroutine performs switching to the master mode by selecting other reference clock than the mate's reference clock when the mate's reference clock becomes inactive or performs switching to the slave mode by selecting the mate's reference clock when the mate's reference clock is detected active during a power-up initialization of the own SCCS unit.

The SCCS comprises using a programmable phase synthesizer to produce an Analog PLL return clock, which can be reprogrammed to match a frequency of a reference clock of said Analog PLL.

Furthermore the SCCS comprises:

applying an output clock of the APLL to a reference input of the APLL;

using the return clock synthesizer for inserting phase deviations between the APLL return clock and the output clock applied to the APLL reference input;

using the inserted phase deviations for implementing required phase and frequency transfer functions between the APLL output clock and other SCCS reference clocks;

implementing digital PLL (DPLL) algorithms for providing the required phase and frequency transfer functions.

Still furthermore the SCCS comprises:

using frequency phase detectors (FPDs) for measuring phase errors between the APLL output clock and said other SCCS reference clocks;

using the PCU for processing the measured phase errors and producing control codes for the return clock synthesizer, which implement pre-programmed phase and frequency transfer functions between the APLL output clock and said other SCCS reference clocks.

The SCCS comprises:

Said analog phase locked loop (APLL) for producing the output clock (OutClk) which can be locked to the external reference clock (Ext_RefClk), unless the APLL is driven by the digital phase locked loop (DPLL);

Said DPLL can provide locking to the Ext_RefWfm (which can be a GPS clock), or to a local oscillator.

The SCCS further comprises:

programmable frequency dividers for a reference signal and for return signal of said APLL, for providing programmable bandwidth adjustments of the APLL;

programmable frequency dividers in the output clock generator (OCG) which can be reprogrammed by the PCU, in order to allow utilizing a single pin of the OutClk(T:1) for providing multiple different output clock frequencies;

activity monitoring circuits for synchronizer input clocks and output clocks;

frequency monitoring circuits for synchronizer reference clocks; status control circuits for switching synchronizer modes of operation and active reference clocks, based on an analysis of said activity and frequency monitoring circuits;

phase transfer control circuits for providing a required phase transfer function between an active reference clock and synchronizer output clocks;

a serial interface which allows the status control circuits and the phase transfer control circuits to be monitored and reprogrammed by an external controller (see the Serial Interface in the FIG. 1, FIG. 2 and FIG. 3);

a parallel interface which allows the status control circuits and the phase transfer control circuits to be monitored and reprogrammed by an external controller controller (see the Prallel Interface in the FIG. 1, FIG. 2 and FIG. 3);

automatic reference switching functions including hold-over and free-run switching, which are performed by the status control circuits and are based on monitoring a status of the activity and frequency monitoring circuits;

a master/slave switching circuit which allows a pair of integrated synchronizers to work in a master/slave configuration having a slave synchronizer being phase locked to a mate clock which is generated by a mate master synchronizer;

The above listed status control circuits and phase transfer control circuits can be implemented as separate on-chip control units or with a single on-chip PCU.

APLL mode of operation in the Heterodyne Timing Configuration is described below.

One of the external reference clocks (Ext_RefClk) is selected to be applied to the APLL reference input and the return phase synthesizer (RET_PS) is switched by the PCU into producing the APLL return clock which is matching said selected external reference clock.

The implementation of a DPLL mode is explained below.

The APLL output clock Fil_OutClk is applied to the APLL reference input and the return phase synthesizer (RET_PS) is switched by the PCU into producing the APLL return clock which is matching said output clock Fil_OutClk.

The FPD1 measures a phase error between the output clock multiplication SampClk and the Ext_RefWfm, and the FPD2 measures a phase error between the SampClk and the local oscillator LocOsc.

The PCU reads the above phase errors and uses them to calculate new contents of the RET_PS's periodical adjustment buffers and the fractional adjustment buffers needed for inserting phase deviations required for providing a phase transfer function (PTF), between the output clock Fil_OutClk and the Ext_RefWfm, which is already preprogrammed in the PCU.

The invention includes providing slave mode implementation which replaces the external reference clock with the mate SCCS output clock f_mate, in order to drive the above described APLL configuration. The slave mode allows maintaining phase alignment between active and reserve SCCS units, for the purpose of avoiding phase hits when protection switching reverts to using clocks from the reserve SCCS unit.

The invention includes using the above mentioned method of slave SCCS phase alignment for all 3 configurations shown in the FIG. 1, FIG. 2 and FIG. 3).

5. Digital Wave Synthesis from Multi Sub-Clocks

The invention comprises the digital wave synthesis from multi-sub-clocks (DWS MSC) as a new timing method and circuit for programming and selecting a phase and a frequency of a synthesized clock.

The DWS MSC comprises programmable phase modifications which are defined below:

Phase increases of the synthesized clock are provided; by adding whole clock periods and/or fractional sub-clock delays, obtained from serially connected delay elements which the reference clock is propagated through, to a present phase obtained from a counter of reference clock periods and/or a present fractional sub-clock delay.

Phase decreases of the synthesized clock are provided; by subtracting whole clock periods and/or fractional sub-clock delays, obtained from serially connected delay elements which the reference clock is propagated through, from a present phase obtained from a counter of clock periods and/or a present fractional sub-clock delay.

The DWS MSC provides ~10 times better phase adjustment resolution than the commonly used DDFS method; because the DWS MSC can modify phase with time intervals specified in fractions of clock cycle, instead of inserting or eliminating whole clock cycles from a synthesized clock. Therefore, the phase hits and resulting jitter are reduced by around 10 times compared to the DDFS method.

The DWS MSC provides an implementation of programmable algorithms for synthesizing a very wide range of low and high frequency wave-forms.

The DWS MSC comprises; a 1-P phase generator, a synchronous sequential phase processor (SSPP) for real time processing and selection of a phase of out-coming waveform, and a programmable computing unit (PCU) for controlling SSPP operations and supporting signal synthesis algorithms.

Said 1-P phase generator is an extension of a 1 bit odd/even phase generator to p bits enabling $2^p=P$ phases to be generated from every reference sub-clock, as it is defined below.

The odd/even phase generator provides splitting of reference sub-clocks, generated by outputs of a reference propagation circuit built with serially connected gates which a reference clock is propagated through, into odd phase sub-clocks which begin during odd cycles of the reference clock and even phase sub-clocks which begin during odd cycles of the reference clock, wherein the odd/even phase selector comprises:

said reference propagation circuit connected to the reference clock;

serially connected flip-flops, wherein a clock input of a first flip-flop is connected to the reference clock and a data input of a first flip-flop is connected to an inverted output of the first flip-flop while a clock input of any other Nth flip-flop is connected to an (N−1) output of the reference propagation circuit and a data input of the N flip-flop is connected to an output of the (N−1) flip-flop;

connected to the serially connected flip-flops an odd/even selector generating the odd sub-clocks which begin during every odd reference clock cycle and the even sub-clocks which begin during every even reference clock cycle, wherein the output of the $1^{st}$ flip-flop is used to select odd and even reference clocks while the output of the Nth flip-flop is used to select odd and even reference sub-clocks from the (N−1) output of the reference propagation circuit.

The odd/even phase generator is extended into the 1-P phase generator splitting the reference sub-clocks into 1-P phase sub-clocks which begin during the corresponding 1-P cycles of the reference clock, wherein the 1-P phase selector further comprises:

a parallel 1-P sub-clock counter built as an extension to the first flip-flop working as 1-2 counter wherein the whole 1-P sub-clock counter is clocked by the first reference sub-clock, wherein an output of the 1-P sub-clock counter represents a 1-P phase number of the first sub-clock;

2-N parallel multi-bit buffers built as extensions to the original 2-N flip-flops working as 1 bit buffers wherein the whole 1-P sub-clock counter is clocked by the $2^{nd}$ reference sub-clock into the first multi-bit buffer which is clocked by the $3^{rd}$ reference sub-clock into the $2^{nd}$ multi-bit buffer and the content of the 1-P counter is similarly propagated into all next buffers until the Nth sub-clock loads the N−2 buffer into the N−1 buffer, wherein the 1" buffer defines a phase number minus 1 for the $2^{nd}$ reference sub-clock and next buffers define similarly phase numbers for their corresponding reference sub-clocks until the N−1 buffer defines a phase number minus (N−1) for the Nth reference sub-clock.

1-P phase selectors built as extensions to the corresponding odd/even selectors wherein a first 1-P selector is connected to the 1-P sub-clock counter and selects a phase, of the first reference sub-clock, defined by the 1-P sub-clock counter while every next N−K+1 phase selector is connected to its N−K buffer and to its N−K+1 reference sub-clock (0<K<N), wherein every next N−K+1 phase selector generates phases, of its N−K+1 sub-clock, defined by its buffer content plus (N−K).

The 1-P phase generator can use both solutions defined below:

using rising edges of the reference sub-clocks for clocking the 1-P sub-clock counter and the 2-P buffers while negative pulses of the reference sub-clocks are used for activating outputs of the 1-P selectors generating the 1-P phase sub-clocks;

or using rising edges of the reference sub-clocks for clocking the 1-P sub-clock counter and the 2-P buffers while negative pulses of the reference sub-clocks are used for activating outputs of the 1-P selectors generating the 1-P phase sub-clocks.

Furthermore the 1-P phase generator can use the serially connected gates of the reference propagation circuit, which are connected into a ring oscillator controlled by a PLL circuit or are connected into a delay line control by a delay locked loop (DLL) circuit or are connected into an open ended delay line.

Furthermore this 1-P phase generator includes extending the remaining 2-N flip-flops with parallel sub-clock counters, the same as the parallel sub-clock counter extending the $1^{st}$ flip-flop, instead of using the defined above 2-P multi-bit buffers. The use of the 2-P parallel counters requires adding preset means for all the 1-P counters, in order to maintain the same or predictably shifted content in all the 1-N parallel counters. Continues maintaining of said predictability of all the parallel counters content is necessary for generating predictable sequences of multiphase sub-clocks.

Said SSPP comprises a selection of one of multi sub-clocks for providing an edge of out-coming synthesized signal, where said sub-clocks are generated by the outputs of serially connected gates which an SSPP reference clock is propagated through.

The SSPP comprises calculating a binary positioning of a next edge of the out-coming wave-form versus a previous wave edge, which represents a number of reference clock cycles combined with a number of reference clock fractional delays which correspond to a particular sub-clock phase delay versus the reference clock.

Furthermore the SSPP comprises selective enabling of a particular sub-clock, which provides the calculated phase step between the previous and the current wave-form edges.

The SSPP further comprises a synchronous sequential processing (SSP) of incoming signal by using multiple serially connected processing stages with every stage being fed by data from the previous stage which are clocked-in by a clock which is synchronous with the reference clock. Since every consecutive stage is driven by a clock which is synchronous to the same reference clock, all the stages are driven by clocks which are mutually synchronous but may have some constant phase displacements versus each other.

The synchronous sequential processor (SSP) multiplies processing speed by splitting complex signal processing operation into a sequence of singular micro-cycles, wherein:

every consecutive micro-cycle of the complex operation is performed by a separate logical or arithmetical processing stage during a corresponding consecutive time slot synchronous with a reference clock providing a fundamental timing for a synthesized wave-form;

serially connected sequential stages are connected to a programmable control unit (PCU), wherein the sequential stages are clocked by reference sub-clocks generated by a reference propagation circuit built with serially connected gates which the reference clock is propagated through;

whereby inputs from the PCU are processed into a phase delay between a next edge of the synthesized wave-form versus a previous edge and a position of the next edge is calculated by adding the phase delay to a position of the previous edge, wherein the positions of wave-form edges are provided by a last of the sequential stages and said positions are expressed as numbers identifying reference sub-clocks needed for generating said wave-form edges.

The above defined SSP can be implemented by processing said inputs from the PCU into a phase modification step which is added to a period of the reference clock in order to calculate the phase delay.

Furthermore this invention includes the SSP circuit upgraded into a parallel multiphase processor (PMP) by extending the time slot allowed for the micro-cycles of the synchronous sequential processor by a factor of P, wherein:

2-P stages are added to the original sequential stage and every one of the resulting 1-P parallel multiphase stages is clocked with a corresponding 1-P phase sub-clock, wherein such 1-P phase sub-clock begins during the corresponding to that phase 1-P cycle of the reference clock and has a cycle which is P times longer than the reference clock cycle;

whereby consecutive 1-P parallel multiphase stages have processing cycles overlapping by 1 cycle of the reference clock wherein every 1-P parallel processing stage has P times longer cycle time equal to the cycle time of the corresponding 1-P phase sub-clock used for timing that stage.

The parallel multiphase processor further comprises:

a parallel processing phase 2-P built with plurality of 2-P parallel multiphase stages which are connected serially and are driven by the phase sub-clocks belonging to the same 2-P phase.

The SSPP invention comprises the use of the parallel multiphase processing for synthesizing a target wave-form by assigning consecutive parallel phases for the processing of a synthesized signal phase using signal modulation data provided by a programmable control unit (PCU) or by any other source.

Consequently the SSPP comprises using 1 to N parallel phases which are assigned for processing incoming signal data with clocks corresponding to-reference clock periods number 1 to N, as it is further described below:

circuits of phase1 process edge skews or phase skews or other incoming signal data with a clock which corresponds to the reference clock period number 1;

circuits of phase2 process edge skews or phase skews or other incoming signal data with a clock which corresponds to the reference clock period number 2;

finally circuits of phaseN process edge skews or phase skews or other incoming signal data with a clock which corresponds to the reference clock period number N.

Said parallel multiphase processing allows N times longer processing and/or sub-clocks selection times for said multiphase stages, compared with a single phase solution.

The above mentioned sub-clock selecting methods further include:

using falling edges of said sub-clocks for driving clock selectors which select parallel processing phases during which positive sub-clocks are enabled to perform said synthesized wave-form timing, or using rising edges of said sub-clocks for driving selectors which select parallel processing phases during which negative sub-clocks are enabled to perform said synthesized wave-form timing;

using serially connected clock selectors for enabling consecutive sub-clocks during said processing phases, in order to assure that the enabled sub-clocks will occur within a selected processing phase and to enable selection of a sub-clock specified by a number contained in a fraction selection register of a particular processing phase.

The SSPP includes using said serially connected gates:
as being an open ended delay line;
or being connected into a ring oscillator which can be controlled in a PLL configuration;
or being connected into a delay line which can be controlled in a delay locked loop (DLL) configuration.

Every said sub-clock phase delay versus the reference clock phase amounts to a fraction of a reference clock period which is defined by a content of a fraction selection register which is assigned for a particular processing phase and is driven by the SSPP.

The SSPP includes a parallel stage processing of an incoming signal by providing multiple processing stages which are driven by the same clock which is applied simultaneously to inputs of output registers of all the parallel stages.

The SSPP further comprises:
a merging of processing phases which occurs if multiple parallel processing phases are merged into a smaller number of parallel phases or into a single processing phase, when passing from a one processing stage to a next processing stage;
a splitting of processing phases which occurs if one processing phase is split into multiple processing phases or multiple processing stages are split into even more processing stages, when passing from a one processing stage to a next processing stage.

The SSPP includes using the 1-P phase generator defined above to generate SSPP clocks which drive said parallel phases and said sequential stages, and to generate selector switching signals for said merging and splitting of processing phases.

The SSPP includes time sharing of said parallel phases: which is based on assigning a task of processing of a next wave-form edge timing to a next available parallel processing phase.

The SSPP comprises a timing control (TC) circuit, which uses decoding of reference clock counters and/or other wave edge decoding and said SSPP clocks, for performing said time sharing phase assignments and for further control of operations of an already assigned phase.

The SSPP comprises passing outputs of a one parallel phase to a next parallel phase, in order to use said passed outputs for processing conducted by a following stage of the next parallel phase.

The outputs passing is performed: by re-timing output register bits of the one phase by clocking them into an output register of the next parallel phase simultaneously with processing results of the next parallel phase.

The SSPP further comprises all the possible combinations of the above defined: parallel multiphase processing, parallel stage processing, synchronous sequential processing, merging of processing phases, splitting of processing phases, and outputs passing.

The SSPP includes processing stage configurations using selectors, arithmometers, and output registers, which are arranged as it is defined below:
input selectors select constant values or outputs of previous stages or outputs of parallel stages or an output of the same stage to provide arithmometer inputs, and arithmometer output is clocked-in to an output register by a clock which is synchronous to the reference clock;
multiple arithmometers are fed with constant values or outputs of previous stages or outputs of parallel stages or an output of the same stage, and an output selector selects an arithmometer output to be clocked-in to an output register by a clock synchronous to the reference clock;
the above defined configuration as being supplemented by using an output of an output selector of a parallel processing stage for controlling functions of other output selector.

The SSPP comprises:
using switching signals of said input selectors for producing pulses which clock data into output registers of previous stages;
using switching signals of said output selectors for producing pulses which clock data into output registers of previous stages;

The SSPP also comprises:
using results obtained in earlier stages for controlling later stages operations, and using results obtained in the later stages for controlling the earlier stages operations.

Proper arrangements of said parallel and sequential combinations and said stages configurations provide real time processing capabilities for very wide ranges of signal frequencies and enable a wide coverage of very diversified application areas.

The DWS MSC comprises two different methods for accommodating a phase skew between the reference clock and a required carrier clock frequency of the transmitted signal, and both methods allow elimination of ambiguities and errors in encoding of output signal data patterns. Said two methods are further defined below:
a source of the reference clock provides frequency or phase alignment with the timing of the data which are being encoded and sent out in the synthesized output waveform;
phase skews between the reference clock and the timing of the destined for transmission data are digitally measured and translated into implemented by the SSPP phase adjustments of the synthesized signal which provide required carrier frequency of the transmitted output signal;
both above mentioned methods include measurements of phase or frequency deviations of the destined for transmission data versus the reference clock, and using said measurements results to assure required carrier frequency of the synthesized signal.

Furthermore the DWS MSC method comprises phase modulations of the synthesized wave-form by adding or subtracting a number of reference clock periods and/or a number of fractional delays to a phase of any edge of the synthesized wave-form.

Said adding or subtracting of a number of reference clock periods is further referred to as a periodical adjustment, and said adding or subtracting of fractional delays is further called a fractional adjustment.

The DWS MSC method allows synthesizing of any wave-form by modulating a phase of the reference clock with periodical and/or fractional adjustments of any size.

6 Phase Synthesizer

The invention also includes the Phase Synthesizer (PS) for carrying out the DWS MSC method; as it is further explained below and is shown in FIG. 4, FIG. 4A, FIG. 5, and FIG. 6. The Timing Diagram of the PS is shown in the FIG. 7.

Said phase synthesizer provides programmable modifications of a phase of a synthesized clock by unlimited number of gate delays per a modification step with step resolution matching single gate delay at steps frequencies ranging from 0 to ½ of maximum clock frequency, wherein:
a delay control circuit is connected to a programmable control unit (PCU) wherein the delay control circuit defines size and frequency of phase delay modifications of the synthesized clock versus a reference clock, the delay control circuit also having a terminal connected to reference sub-clocks generated by a reference propagation circuit or connected to odd/even sub-clocks generated by an odd/even phase selector;

the reference clock is connected to the reference propagation circuit consisting of serially connected gates wherein outputs of the gates generate the reference sub-clocks providing variety of phase delays versus the reference clock;

the reference sub-clocks are connected to an odd/even phase selector which splits the reference sub-clocks by generating separate odd sub-clocks and even sub-clocks, wherein the odd sub-clocks begin during odd cycles of the reference clock and the even sub-clocks begin during even cycles of the reference clock;

a clock selection register is loaded by the odd sub-clocks and by the even sub-clocks with the outputs of the delay control circuit, wherein the odd sub-clocks or the even sub-clocks beginning during an earlier cycle of the reference clock download outputs of the delay control circuit which select the even sub-clocks or the odd sub-clocks beginning during a later cycle of the reference clock for providing the synthesized clock;

an output selector is connected to the output of the clock selection register and to the outputs of the odd/even phase selector, wherein the output selector uses inputs from the clock selection register for selecting output of the odd/even phase selector which is passed through the output selector for providing the synthesized clock.

The above defined PS can use the odd/even phase generator or the 1-P phase generator, which have been already defined above.

The PS can use the delay control circuit implemented with the parallel multiphase processor (PMP) which has been already defined above.

The PS comprises 2 different implementation methods, which are explained below.

The first PS implementation method is based on moving a synthesized clock selection point from a delay line which propagates a reference clock (see the FIG. 4); wherein:

said phase increases are provided by moving said selection point of the synthesized clock from the reference clock propagation circuit, in a way which adds gate delays to a present delay obtained from the propagation circuit;

said phase decreases are provided by moving said selection point of the synthesized clock from the reference clock propagation circuit, in a way which subtracts gate delays from a present delay obtained from the propagation circuit;

The first PS implementation method is conceptually presented in FIG. 4 & FIG. 6, and its principles of operations are explained below.

The PLL×L Freq. Multiplier produces the series of sub-clocks Clk0, ClkR–Clk1.

The sub-clock Clk0 keeps clocking in a reversed output of its own selector PR0.

The sub-clocks CLkR–Clk1 keep clocking in outputs of the previous selectors PR0, PRR–PR2 into their own selectors PRR–PR1.

Since the selector PR0 is being reversed by every Clk0, every selector in the PR0, PRR–PR1 chain is being reversed as well by a falling edge of its own sub-clock Clk0, ClkR–Clk1, and every selector in the chain represents reversal of its predecessor which is delayed by a single sub-clock fractional delay.

Consequently the PR0, PR1N–PRR select sub-clocks Clk0, Clk1–ClkR during any odd processing phase, and their reversals PR0N, PR1–PRRN select sub-clocks Clk0, Clk1–ClkR during any even processing phase.

The odd/even processing phase has been named phase1/phase2, and their sub-clocks are named 1Clk0,1Clk1–1ClkR/2Clk0,2Clk1–2ClkR accordingly.

Since said phase1/phase2 sub-clocks are used to run a phase synthesis processing in separate designated for phase1/phase2 phase processing stages which work in parallel, a time available for performing single stage operations is doubled (see also the FIG. 6 for more comprehensive presentation of said parallel processing).

Furthermore, the Clock Selection Register 1 (CSR1) can be reloaded at the beginning of the phase2 by the 2Clk0 and its decoders shall be ready to select a glitch free phase1 sub-clock which is defined by any binary content of the CSR1.

Similarly the CSR2 is reloaded by the 1Clk0, in order to select a single glitch free sub-clock belonging to the phase2.

The second PS implementation method is based on adjusting alignment between an exit point of the synthesized clock from the reference propagation circuit versus an input reference clock; in a way which adds gate delays for phase increases, and subtracts gate delays for phase decreases. The second method is presented in FIG. 4A, and its differences versus the FIG. 4 are explained below.

The moving exit point from the driven by Fsync/2Dsel phase locked delay line is used as a return clock for the PLL×2Dsel multiplier, instead of using a fixed output of the INV0 to be the PLL return clock.

The fixed output of the INV0 is divided by the programmable frequency divider (PFD) in order to provide the synthesized clock Fsynt, instead of the moving synthesized clock selection point.

The first method exit point alignments, introduce phase jumps which cause synthesized clock jitter.

The second method configuration shown in FIG. 4A, filters out Fsynt jitter frequencies which are higher than a bandwidth of the multiplier's PLL.

While any of the two PS implementation methods is shown above using a particular type of a reference clock propagation circuit, the PS comprises using all the listed below reference clock propagation circuits by any of the two methods:

an open ended delay line built with serially connected logical gates or other delay elements;

a ring oscillator built with serially connected logical gates or other delay elements, which have propagation delays controlled in a PLL configuration;

a delay line built with serially connected logical gates or other delay elements, which have propagation delays controlled in a Delay Locked Loop (DLL) configuration.

It shall be noticed that further splitting to more than 2 parallel phases is actually easier than the splitting to the original 2 processing phases; because while one of the phases is active, its earlier sub-clocks can be used to trigger flip-flops which can segregate sub-clocks which belong to multiple other phases and can be used to drive the other parallel phases.

Consequently using this approach; allows increasing parallel stages processing times to multiples of reference clock periods, and provides implementation of said DWS MSC multiple phase processing which has been introduced in the previous section.

Said selection of a sub-clock for synthesized clock timing, can be physically implemented in two different ways:

by using phase producing gates from 1inv0 to 1invR and from 1inv0 to 1invR, as having 3 state outputs with enable inputs EN, one of which is enabled by one of the outputs of the sub-clock selection gates from 1sel0 to 1selR and from 2sel0 to 2selR;

or by using the sub-clock selection gates which have all their outputs connected into a common collector configuration (instead of having them followed by the 3state gates), in order to allow a currently active output of one of the sub-clock selection gates to produce a phase of the synthesized clock FselN.

The PS comprises fractional adjustments of synthesized clock phase for providing high resolution phase modifications by fractional parts of a reference clock period.

The PS comprises combined periodical and fractional adjustments of synthesized clock phase, which use counters of reference clock periods for generating counter end (CE) signals when a periodical part of a phase adjustment is expired.

The PS further comprises using said counter end signals for generation of control signals which assign and/or synchronize consecutive parallel processing phases for processing consecutive combined or fractional phase adjustments of the synthesized clock.

The PS comprises:
Using a basic periodical adjustment and a basic fractional adjustment for providing a basic phase step, which can remain the same for multiple edges of the synthesized clock.
Using a modulating periodical adjustment and a modulating fractional adjustment, which can be different for every specific edge of the synthesized clock.
Using said DWS MSC and SSPP methods for processing of said basic periodical adjustments, basic fractional adjustments, modulating periodical adjustments and modulating fractional adjustments for calculating periodical and fractional parts of combined adjustments.

Processing of said calculated combined adjustment with a positioning of a synthesized clock previous edge for calculating a periodical and a fractional part of the next edge position of the synthesized clock.

7. Frame Phase Detector

The Frame Phase Detector (FPD) operates as follows:
local clock phase is measured continuously by counting time units signaled by the local clock;
abstract frame, consisting of time intervals defined by software, is used for high resolution measurements of local clock phase error versus an external clock phase defined by it's frame signaled by external events, wherein such time intervals expected by software and expressed in local time units are subtracted from time intervals, occurring between said external events, measured in local clock units;
resulting phase error is read back by software subroutines.

Using such software defined frame instead of using an equivalent frame produced by hardware is advantageous, as it eliminates circuits and errors associated with using such electrical local frame and allows instant phase adjustments to be applied after the arrival of the external frame thus resulting in more stable DPLL operations.

Furthermore such software frame is more suitable for time messaging protocols such as IEEE 1588.

Subtracting a nominal number of local clock cycles corresponding to an imaginary frame has been anticipated by Bogdan in U.S. Pat. No. 6,864,672 wherein basic circuits and timing diagrams are shown, however this invention comprises further contributions, such as:
more comprehensive programming of said software frame, in order to allow timing adjustments in more complex systems with rapidly changing references frequencies and references phase hits;
programmable presetting of numerical first edge allows elimination of an initial phase error when phase error measurements begun, in order to enable the use of the FPD for very precise delay measurements in critical traffic control applications;
elimination of any accumulation of digitization errors with an alternative solution simpler than presently existing arrangement.

The FPD comprises solutions described below.

1. A frame phase detector (FPD) for measuring a frame phase skew between a first frame consisting of a programmable sequence of expected numbers of sampling local clocks, and a second frame defined with a series of time intervals located between second frame edges defined by changes of an external frame signal or by changes of a frame status signal driven with external messages such as time stamps, wherein a frame measurement circuit captures a number of said sampling clocks occurring during an interval of the second frame and a phase processing unit subtracts the captured number from the expected number representing expected duration of the corresponding interval of the first frame; wherein-the frame phase detector comprises:
a means for a detection of said second frame edges, by detecting said changes of the external frame signal, or by detecting said changes of the frame status driven by the external messages;
the frame measurement circuit using the sampling local clock, which is a higher frequency signal, to measure said time intervals of the second frame having lower frequency, wherein the frame measurement circuit counts said sampling clocks occurring during every interval of the second frame and captures and buffers the counted value until it is read by a phase processing unit; the phase processing unit for subtracting the expected number of the sampling clocks from the counted number of the sampling clocks, in order to calculate an interval phase skew between the expected interval of the first frame and the corresponding interval of the second frame.
a means for combining said interval phase skews of particular frame intervals into said frame phase skew.

2. A frame phase detector as described in statement 1, wherein said second frame begins with a numerical first edge, representing initial phase of the second frame, defined as a number of sampling delays between an expected location of such numerical first edge and the first counted sampling clock, wherein the frame measurement circuit is preset to the numerical first edge before any said counting of the sampling clocks takes place; the frame phase detector comprising:
a means for presetting the frame measurement circuit to said numerical first edge before said counting of the sampling periods of the first interval of the second frame takes place;
a means for supplementing said preset numerical first edge by adding following sampling periods counted until the second edge of the second frame is encountered, and a means for capturing and buffering a resulting total number of sampling periods until it is read by a phase processing unit;
wherein the resulting total number of the sampling periods represents duration of such first interval of the second frame and is made available for further processing.

3. A frame phase detector as described in statement 1 receiving an incoming wave-form carrying the external frame signal or carrying the external message; the frame phase detector wherein:
said detection of the second frame edges from the incoming wave-form, is performed by a circuit synchronized with the local sampling clock and producing a known propagation delay.

4. An FPD as described in statement 1, wherein the frame phase skew is calculated without any accumulation of digitization errors of said intervals phase skews while the single intervals phase skews are still available for intermediate signal processing; the FPD comprising:

a means for rounding said counted number of the sampling periods by adding 1 such sampling period to the counted number defining length of said frame interval, wherein ½ of the added sampling period approximates a fraction of the sampling period occurring before said counting of the interval sampling periods and another ½ of the added sampling period approximates a fraction of the sampling period occurring after said counting;

whereby such addition of 1 sampling period to every interval measurement, provides all sampling periods occurring between said counted numbers of sampling periods relating to consecutive intervals of the second frame, and reduces a digitization error of any long frame to a time sampling error of a single interval.

5. A frame phase detector as described in statement 1 including a high resolution circuit for extending resolution of phase measurements below a period of the local clock, wherein the high resolution circuit propagates the local clock through a delay line built with serially connected gates producing different phases of the local clock; the frame phase detector comprising:

the high resolution circuit using a phase capture register for capturing a state of outputs of the serially connected gates, which the local clock is propagated through, at an edge of the interval of the second frame;

or the high resolution circuit using a phase capture register for capturing an edge of the interval of the second frame by using the outputs of the serially connected gates as sampling sub-clocks applied to clocking-in inputs of the phase capture register while said second frame, defined with the frame signal or the frame status, is applied to data inputs of the phase capture register.

6. A frame phase detector as described in statement 1 including a high resolution circuit for extending resolution of phase measurements below the period of the local clock, wherein the high resolution circuit propagates the second frame, defined with the frame signal or the frame status, through a delay line built with serially connected gates producing different phases of the second frame; the frame phase detector comprising:

the high resolution circuit using a phase capture register for capturing a phase of an edge of the interval of the second frame by applying the outputs of the serially connected gates which the second frame is propagated through to data inputs of the phase capture register while the local clock is used for clocking the data inputs in;

or the high resolution circuit using a phase capture register for capturing a phase of an edge of the interval of the second frame by using the outputs of the serially connected gates-which the second signal frame is propagated through-as clocking in signals while the local clock is applied to data inputs of the phase capture register.

7. A frame phase detector as described in statement 1 including a noise filtering edge detector (NFED) improving reliability and precision of said detection of the second frame edges by removing phase noise from wave-form edges and amplitude glitches from wave-form levels through continues over-sampling and digital filtering of an entire incoming wave-form carrying said external frame signal or said external messages, wherein the incoming wave-form is over-sampled with sampling sub-clocks generated by a delay line built with serially connected gates which the sampling local clock is propagated through, and waveforms variable length pulses are processed by comparing an edge mask, which provides an expected pattern of waveform samples corresponding to an edge of the wave-form, with a sequence of wave-form samples surrounding a consecutive analyzed sample; the FPD wherein the NFED further comprises:

a wave capturing circuit for capturing results of sampling the incoming wave-form in time instances produced by the outputs of the delay line which the sampling local clock is propagated through;

means for performing logical or arithmetic operations on particular samples of the edge mask and their counterparts from the wave-form samples surrounding the consecutive analyzed sample of the captured wave-form;

means for using the results of said operations for deciding if said operations can determine a filtered location of an edge of a filtered wave-form, wherein such filtered location is further used for said detection of boundaries of the second frame.

8. Noise Filtering Edge Detector

The NFED is directed to signal and data recovery in wireless, optical, or wireline transmission systems and measurement systems.

The noise filtering edge detector (NFED) provides digital filtering of waveform pulses transmitting serial streams of data symbols with data rates reaching ½ of maximum clock frequency of IC technology.

The NFED enables:

continues waveform over-sampling with sampling frequencies 5 times higher than the maximum clock frequency;

elimination of phase jitter from edges of the pulses and elimination of amplitude glitches from insides of the pulses as well;

and a system for adaptive noise filtering based on analysis of captured unfiltered portions of the over-sampled waveform.

The noise filtering edge detectors (NFED) shall be particularly advantageous in system on chip (SOC) implementations of signal processing systems.

The NFED provides an implementation of programmable algorithms for noise filtering for a very wide range of low and high frequency wave-forms.

The NFED is based on a synchronous sequential processor (SSP) which allows >10 times faster processing than conventional digital signal processors.

The NFED comprises:

the SSP used for capturing and real time processing of an incoming waveform (see the end of this Subsection);

a wave-from screening & capturing circuit (WFSC) (see the end of this Subsection);

a programmable control unit (PCU) for supporting adaptive noise filtering and edge detection algorithms;

The NFED compares: a captured set of binary values surrounding a particular bit of a captured waveform, with an edge mask comprising a programmed set of binary values.

Such comparison produces an indicator of proximity between the surrounded bit and an expected edge of the waveform. The indicator is named edge proximity figure (EPF).

Said comparison comprises:

performing logical and/or arithmetic operation on any bit of the captured set and its counterpart from the edge mask;

integrating results of said operations performed on all the bits of the captured set, in order to estimate the EPF for the surrounded bit;

defining a waveform transition area by comparing the EPF with an edge threshold, wherein a set of bits having EPFs exceeding the threshold defines the waveform transition area where an edge is expected.

Finding the most extreme EPF by comparing all the EPFs belonging to the same waveform transition area, wherein such EPF identifies a bit position localizing a filtered edge.

The NFED further comprises:

modulating locations of detected rising and/or falling waveform edges by an edge modulating factor (EMF) used to modify edge thresholds which are subtracted from the EPFs, wherein such reduced EPFs are used for finding edge location;

using an edge modulation control register (EMCR) programmed by the PCU, for defining function transforming said EMFs into said modifications of edge thresholds.

The NFED still further comprises displacing detected edges by a preset number of bits, in order to compensate for inter-symbol interference ISI or other duty cycle distortions.

The NFED further includes:

using the WFSC for programmable screening of the over-sampled unfiltered wave-form, and for capturing screened out wave-form intervals, and for communicating said captured intervals and other results to the PCU;

programmable waveform analysis and adaptive noise filtering algorithms;

edge mask registers for providing said edge masks used for detecting rising and/or falling waveform edges;

edge threshold registers for providing said edge thresholds used for detecting rising and/or falling waveform edges;

edge displacement registers for providing said edge displacement numbers used for shifting detected rising and/or falling edges by a programmable number of bits of waveform processing registers;

filter control registers which control; said logical and/or arithmetic operations conducting the comparison of captured waveform bits with the edge mask, and said edge displacements in the processed waveforms;

using the PCU for calculating and loading said edge mask registers and/or said edge threshold registers and/or said edge displacement registers and/or said filter control registers;

using the PCU for controlling said calculations of the EMF by presetting the EMCR in accordance with adaptive noise filtering algorithms.

using the PCU for controlling and using the WFSC operations for implementing adaptive filters by controlling noise filtering edge detection stages of the SSP.

Further description of the NFED is provided below.

The NFED comprises:

a wave capturing circuit for capturing an incoming waveform sampled by sub-clocks produced by the outputs of the delay line which the sampling clock is propagated through;

a circuit performing logical or arithmetic operations on particular samples of the edge mask and their counterparts from the wave-form samples surrounding the consecutive analyzed sample of the captured wave-form;

using the results of said operations for defining a filtered location of an edge of the waveform.

Such NFED further comprises:

a filter arithmometer for comparing the edge mask with the captured wave-form in order to introduce noise filtering corrections of the edges of the filtered wave-form;

a filter mask register providing the edge mask which is compared with the captured wave-form of an input signal and/or filter control register which provides code for controlling operations of said filter arithmometer in order to provide said corrections of the filtered wave-form.

The NFED compares said edge mask samples of the expected edge pattern with samples from a consecutive processed region of the captured wave-form.

Consequently the NFED comprises:

accessing any said consecutive processed region of the captured wave-form and using such region as comprising samples corresponding to the edge mask samples;

selection of a consecutive sample from the edge mask and simultaneous selection of a corresponding consecutive sample from the processed region of the captured waveform;

calculating a correlation component between such selected samples by performing an arithmetical or logical operation on said selected samples;

calculating a digital correlation integral by adding said correlation components calculated for single samples of the edge mask.

The NFED includes calculating correlation integrals for said consecutive processed regions uniformly spread over all the captured wave-form, wherein the calculated correlation integrals are further analyzed and locations of their maximums or minimums are used to produce said filtered locations of said edges of the filtered wave-form;

Such NFED operations comprise:

moving said processed region by a programmable number of samples positions of the captured wave-form;

storing and comparison of said correlation integrals calculated for different processed regions, in order to identify said maximums or minimums and their locations;

using said locations of said maximums or minimums for producing the filtered locations of the edges of the filtered wave-from.

The NFED includes compensation of inter-symbol interference (ISI) or other predictable noise by adding a programmable displacement to said filtered location of the edge of the wave-form.

Therefore the NFED comprises:

programmable amendment of the filtered location of the wave-form edge by presetting said programmable displacement with a new content;

using such newly preset displacement for shifting the filtered location of the next detected edge.

The NFED includes compensation of periodical predictable noise with programmable modulations of said filtered locations of the wave-form edges by using an edge modulating factor (EMF) for a periodical diversification of said edge thresholds corresponding to different said regions of the wave-form; wherein the NFED comprises:

modulation of the filtered locations of the wave-form edges by using the edge modulating factor EMF) for modulating said edge thresholds;

subtracting such modulated thresholds from the correlation integrals calculated in said different wave-form regions;

using such reduced correlation integrals for locating said maximums defining locations of filtered edges.

whereby said EMF provides such modulation of the edge thresholds, that predictable noise introduced to consecutive wave-form samples by known external or internal sources, is compensated.

The NFED further includes:

using an edge modulation control register (EMCR) programmed by the PCU, for said modulation of the edge thresholds.

The NFED comprises:

sequential processing stages configured into a sequential synchronous processor driven synchronously with said sampling clock.

The NFED further comprises parallel processing phases implemented with said synchronous sequential processors; wherein:

said parallel processing phases are driven by clocks having two or more times lower frequencies than said sampling clock;

consecutive parallel phases are driven by clocks which are shifted in time by one or more periods of said sampling clock;

The NFED comprises using multiple noise filtering sequential stages in every parallel processing phase for extending said wave-form filtering beyond a boundary of a single phase.

Such NFED further includes an over-sampled capturing of consecutive wave-form phases in corresponding phases wave registers which are further rewritten to wave buffers with overlaps which are sufficient for providing all wave samples needed for a uniform filtering of any edge detection despite crossing boundaries of the wave buffers which are loaded and used during different said phases; wherein the NFED comprises:

rewriting the entire wave register belonging to one phase into the wave buffer of the same phase and rewriting an end part of said wave register into a front part of the next phase wave buffer, while the remaining part of the next wave buffer is loaded from the wave register belonging to the next phase;

whereby every wave buffer contains entire said wave-form regions needed for calculating said EPF's corresponding to the samples belonging to the phase covered by this buffer.

The NFED includes:

merging of said parallel processing phases, wherein multiple said parallel processing phases are merged into a smaller number of parallel phases or into a single processing phase, when passing from one said sequential processing stage to the next sequential stage.

splitting of said parallel processing phases, wherein one said processing phase is split into multiple parallel processing phases or multiple parallel processing phases are split into even more parallel phases, when passing from one said sequential processing stage to the next sequential stage.

The NFED includes said PCU for analyzing results of said real time signal processing form the SSP and for controlling operations of the SSP; wherein the PCU comprises:

means for reading results of captured signal processing from the SSP;

means for programming the filter mask register and/or the filter control register and/or said presetting of the programmable displacement and/or the edge modulating factor, which are applied for achieving said filtering of the captured wave-forms.

The NFED includes a wave-form screening and capturing circuit (WFSC) for capturing pre-selected intervals of unfiltered over-sampled wave-form; wherein the WFSC comprises:

using programmable screening masks and/or programmable control codes for verifying incoming wave-form captures for compliance with said programmable screening masks.

buffering captured wave-form for which the pre-programmed compliance or non-compliance has been detected, or for counting a number of said detections;

communicating said buffered wave-form and a detections counter to the PCU.

The PCU reads resulting captured signals from the WFSC and controls operations of the WFSC;

wherein the PCU comprises:

programming the screening masks and/or the control codes for performing said verification of captured wave-forms compliance or non-compliance with said screening patterns;

reading verification results and/or reading captured wave-forms which correspond to the preprogrammed verification criteria.

The NFED includes using said PCU for adaptive noise filtering; wherein the PCU comprises:

means for programmable waveform analysis;

means for loading edge mask registers which provide said edge masks used for detecting rising and/or falling waveform edges;

or means for loading edge threshold registers which provide said edge thresholds used for detecting rising and/or falling waveform edges;

or means for loading edge displacement registers which provide said edge displacements used for shifting detected rising and/or falling edges by a programmable number of samples positions of the captured wave-form;

or means for loading filter control registers which control said logical and/or arithmetic operations conducting the comparison of captured wave-form samples with the edge mask, and said edge displacements in the processed waveforms;

or means for controlling said EMF by presetting the EMCR in accordance with adaptive noise filtering algorithms.

General definition of the SSP is provided below.

The SSP includes real time capturing and processing of in-coming wave-form and a programmable computing unit (PCU) for controlling SSP operations and supporting adaptive signal analysis algorithms.

Said SSP comprises an over-sampling of incoming wave-form level by using a locally generated sampling clock and its sub-clocks generated by the outputs of serially connected gates which the sampling clock is propagated through. If an active edge of the wave-form is detected by capturing a change in a wave-form level, the position of the captured signal change represents an edge skew between the wave-form edge and an edge of the sampling clock.

In addition to the above wave-form capturing method, the SSP includes 3 other methods of the edge skew capturing which are defined below:

the sampling clock captures the outputs of serially connected gates which the incoming wave-form is propagated through;

the outputs of serially connected gates which the incoming wave-form is propagated through, provide wave-form sub-clocks which capture the sampling clock.

the incoming wave-form captures the outputs of serially connected gates which the sampling clock is propagated through;

The above mentioned edge skew capturing methods further include:

using falling edges of said sub-clocks for driving clock selectors which select parallel processing phases during which positive sub-clocks are enabled to perform said edge skew capturing, or using rising edges of said sub-clocks for driving selectors which select parallel processing phases during which negative sub-clocks are enabled to perform said edge skew capturing;

using serially connected clock selectors for enabling consecutive sub-clocks, in order to assure that consecutive sub-clocks will target appropriate consecutive bits of appropriate capture registers.

The SSP invention includes using said serially connected gates:
as being an open ended delay line;
or being connected into a ring oscillator which can be controlled in a PLL configuration;
or being connected into a delay line which can be controlled in a delay locked loop (DLL) configuration.

Every said edge skew amounts to a fraction of a sampling clock period.

The SSP comprises measuring time intervals between active wave form edges, as being composed of said edge skew of a front edge of the incoming waveform, an integer number of sampling clock periods between the front edge and an end edge, and said edge skew of the end edge of the wave-form.

The SSP further comprises a parallel multiphase processing of incoming signal by assigning consecutive parallel phases for the capturing of edge skews and/or processing of other incoming wave-form data with clocks which correspond to consecutive sampling clocks.

Consequently the SSP invention comprises using 1 to N parallel phases which are assigned for processing incoming signal data with clocks corresponding to sampling clock periods numbered from 1 to N, as it is further described below:
circuits of phase1 process edge skews or phase skews or other incoming signal data with a clock which corresponds to the sampling clock period number 1;
circuits of phase2 process edge skews or phase skews or other incoming signal data with a clock which corresponds to the sampling clock period number 2;
finally circuits of phase N process edge skews or phase skews or other incoming signal data with a clock which corresponds to the sampling clock period number N.

Said parallel multiphase processing allows N times longer capturing and/or processing times for said multiphase stages, compared with a single phase solution.

The SSP includes parallel stage processing of incoming signal by providing multiple processing stages which are driven by the same clock which is applied simultaneously to inputs of output registers of all the parallel stages.

The SSP further comprises a synchronous sequential processing of incoming signal by using multiple serially connected processing stages with every stage being fed by data from the previous stage which are clocked-in by a clock which is synchronous with the sampling clock. Since every consecutive stage is driven by a clock which is synchronous to the same sampling clock, all the stages are driven by clocks which are mutually synchronous but may have some constant phase displacements versus each other.

The SSP further comprises:
emerging of processing phases which occurs if multiple parallel processing phases are merged into a smaller number of parallel phases or into a single processing phase, when passing from a one processing stage to a next processing stage;
splitting of processing phases which occurs if one processing phase is split into multiple processing phases or multiple processing stages are split into even more processing stages, when passing from a one processing stage to a next processing stage.

The SSP includes a sequential clock generation (SCG) circuit which uses said clock selectors and said sub-clocks: to generate SSP clocks which drive said parallel phases and said sequential stages, and to generate selector switching signals for said merging and splitting of processing phases.

The SSP includes time sharing of said parallel phases: which is based on assigning a task of processing of a newly began wave-form pulse to a next available parallel processing phase.

The SSP comprises a sequential phase control (SPC) circuit, which uses results of a wave edge decoding and said SSP clocks, for performing said time sharing phase assignments and for further control of operations of an already assigned phase.

The SSP comprises passing outputs of a one parallel phase to a next parallel phase, in order to use said passed outputs for processing conducted by a following stage of the next parallel phase.

The outputs passing is performed: by re-timing output register bits of the one phase by clocking them into an output register of the next parallel phase simultaneously with processing results of the next parallel phase.

The SSP further comprises all the possible combinations of the above defined: parallel multiphase processing, parallel stage processing, synchronous sequential processing, merging of processing phases, splitting of processing phases, and outputs passing.

The SSP includes processing stage configurations using selectors, arithmometers, and output registers, which are arranged as it is defined below:
input selectors select constant values or outputs of previous stages or outputs of parallel stages or an output of the same stage to provide arithmometer inputs, and arithmometer output is clocked-in to an output register by a clock which is synchronous to the sampling clock;
multiple arithmometers are fed with constant values or outputs of previous stages or outputs of parallel stages or an output of the same stage, and an output selector selects an arithmometer output to be clocked-in to an output register by a clock synchronous to the sampling clock;
the above defined configuration as being supplemented by using an output of an output selector of a parallel processing stage for controlling output selector functions.

Proper arrangements of said parallel and sequential combinations and said stages configurations provide real time processing capabilities for very wide ranges of signal frequencies and enable a wide coverage of very diversified application areas.

Summary of the WFSC is provided below (see the Subsection 4 of the next section for preferred embodiment of WFSC).

The wave-form screening and capturing circuits (WFSC) comprises:
using programmable data masks and programmable control codes for verifying incoming wave-form captures for compliance or non-compliance with a pre-programmed screening patterns;
buffering captured data for which the pre-programmed compliance or non-compliance have been detected;
counting a number of the above mentioned detections;
communicating both the buffered captured data and the number of detections, to an internal control unit and/or to an external unit;
using programmable time slot selection circuits for selecting a time interval for which wave-form captures shall be buffered and communicated to the PCU.

Said PCU comprises implementation of the functions listed below:
- programming of verification functions and patterns for checking captured wave-forms for compliance or non-compliance with the patterns;
- reading verification results and reading captured wave-forms which correspond to the preprogrammed verification criteria;
- reading captured wave-forms which can be pre-selected by the PCU arbitrarily or based on other inputs from the SSP;
- programming of noise filtering functions and noise filtering masks for filtering captured wave-forms;
- reading results of real-time wave-form processing from the SSP, processing the results and providing control codes and parameters for further real-time wave-form processing in the SSP, in accordance with adaptive signal processing algorithms;
- reading output data from the SSP, interpreting the data, and communicating the data to external units.

9. Summary of SCCS

SCCS introduced above comprises methods, systems and devices described below (listed as claims in PCT/CA2006/001120).

1. A phase synthesizer providing programmable modifications of a phase of a synthesized clock by unlimited number of gate delays per a modification step with step resolution matching single gate delay at steps frequencies ranging from 0 to ½ of maximum clock frequency; the phase synthesizer comprising:
a delay control circuit connected to a programmable control unit (PCU) wherein the delay control circuit defines size and frequency of phase delay modifications of the synthesized clock versus a reference clock, the delay control circuit also having a terminal connected to reference sub-clocks generated by a reference propagation circuit or connected to odd/even sub-clocks generated by an odd/even phase selector;
the reference propagation circuit, connected to the reference clock, consisting of serially connected gates wherein outputs of the gates generate the reference sub-clocks providing variety of phase delays versus the reference clock;
an odd/even phase selector, connected to the reference sub-clocks, for splitting the reference sub-clocks by generating separate odd sub-clocks and even sub-clocks, wherein the odd sub-clocks begin during odd cycles of the reference clock and the even sub-clocks begin during even cycles of the reference clock;
a clock selection register loaded by the odd sub-clocks and by the even sub-clocks with the outputs of the delay control circuit, wherein the odd sub-clocks or the even sub-clocks beginning during an earlier cycle of the reference clock download outputs of the delay control circuit which select the even sub-clocks or the odd sub-clocks beginning during a later cycle of the reference clock for providing the synthesized clock;
an output selector connected to the output of the clock selection register and to the outputs of the odd/even phase selector, wherein the output selector uses inputs from the clock selection register for selecting output of the odd/even phase selector which is passed through the output selector for providing the synthesized clock.

2. A phase synthesizer providing programmable modifications of a phase of a synthesized clock by a programmable number of gate delays per a modification step with step resolution matching single gate delay at steps frequencies ranging from 0 to ½ of maximum clock frequency, wherein uncontrolled phase transients inherent for frequency synthesizers are eliminated; the phase synthesizer comprising:
a reference propagation circuit, connected to a reference clock, consisting of serially connected gates wherein outputs of the gates generate reference sub-clocks providing variety of phase delays versus the reference clock;
a delay control circuit, connected to a programmable control unit (PCU) and to the reference propagation circuit, for applying phase delay modifications of the synthesized clock versus a reference clock by modifying selections of said reference sub-clocks chosen for sourcing the synthesized clock;
the PCU, connected to an interrupt signal generated by the delay control circuit, for supplying programmable sequences of said phase delay modifications in response to interrupt signals sent by the delay control circuit.

3. A noise filtering edge detector (NFED) for recovering digital signal transitions and their phases from noisy wave-forms while assuming ideal signal shape between the transitions, in order to identify digitally transmitted data, by continues over-sampling and digital filtering of the incoming waveform based on comparing an edge mask, representing an expected pattern of wave-form samples corresponding to an edge of the original wave-form, with a sequence of wave-form samples surrounding a consecutive analyzed sample; the NFED comprising:
a wave capturing circuit for capturing results of sampling the incoming wave-form in time instances produced by the outputs of the delay line which the sampling clock is propagated through;
a correlation calculating circuit for performing logical or arithmetic operations on particular samples of the edge mask and their counterparts from a wave samples region surrounding the consecutively analyzed sample of the captured wave-form, in order to calculate a correlation integral between the wave samples region and the edge mask;
a proximity estimating circuit for deciding if there is an edge occurrence at the consecutively analyzed sampling instant based on processing of such correlation integrals calculated for samples belonging to a surrounding wave region.

4. A noise filtering edge detector (NFED) for recovering digital signal transitions and their phases from noisy wave-forms while assuming ideal signal shape between the transitions, in order to identify digitally transmitted data, by continues over-sampling and digital filtering of the incoming waveform based on comparing an edge mask, representing an expected pattern of wave-form samples corresponding to an edge of the original wave-form, with a sequence of wave-form samples surrounding a consecutive analyzed sample; the NFED comprising:
a wave capturing circuit, connected to a sampling clock and to the incoming waveform, for continues over-sampling of the incoming wave-form;
a correlation calculating circuit for performing logical or arithmetic operations on particular samples of the edge mask and their counterparts from a wave samples region surrounding the consecutively analyzed sample of the captured wave-form, in order to calculate a correlation integral between the wave samples region and the edge mask;
a proximity estimating circuit for deciding if there is an edge occurrence at the consecutively analyzed sampling instant based on processing of such correlation integrals calculated for samples belonging to a surrounding wave region.

5. A hybrid phase locked loop (HPLL) producing a stable low jitter output clock while enabling very high frequency multiplication factor which can be programmed to any real number belonging to a continues range from 1 to tens of thousands, wherein a low frequency reference clock multiplied by such factor produces such HPLL output clock while a desirable preprogrammed phase and frequency transfer function (PFTF) is maintained by a micro-controller (MC); the HPLL comprising:

an analog phase locked loop (APLL) having one input of it's analog phase detector (APD) connected to the HPLL output clock while another APD input is connected to a local synthesized clock produced by a local phase synthesizer (LPS) connected to the HPLL output clock;

a frequency phase detector (FPD) for measuring a digital phase error between the output clock and the reference clock, wherein such digital phase error is read by said micro-controller which controls operations of said local phase synthesizer;

a digital phase locked loop (DPLL) comprising the frequency phase detector and the micro-controller and the local phase synthesizer, wherein the MC drives said local phase synthesizer into producing phase differences between the APD inputs needed for implementing said preprogrammed PFTF between the output clock and the reference clock.

6. An open-ended software controlled synchronizer (OE-SCS) using micro-controller (MC) subroutines for providing programmable phase frequency transfer function (PFTF) between a reference clock and an output clock generated by a phase synthesizer totally avoiding uncontrolled phase transients inherent for frequency synthesizers, wherein such phase synthesizer works in an open loop configuration enabling inherently stable generation of said output clock and maintains low phase jitter of the output clock independent of phase jitter levels in the reference clock; the OE-SCS comprising:

a frequency phase detector (FPD) measuring digital phase error between a local clock and said reference clock;

the MC for reading said digital phase error and for processing it and for driving said phase synthesizer into generating the output clock implementing said PFTF between the output clock and the reference clock;

the phase synthesizer, connected to a local clock and controlled by the MC, for producing said output clock in the open loop configuration.

7. The OE-SCS configuration of claim 6 further including an external synchronization mode (ESM) enabling analog phase locking of the output clock to an external clock which can be provided by a local reference clock or an output clock from a backup synthesizer unit, wherein such OE-SCS with ESM comprises:

an analog PLL (APLL-ESM), connected alternatively to the phase synthesizer output clock or to such external clock, for producing such phase locked output clock.

8. The OE-SCS configuration of statement 7, wherein the APLL-ESM further comprises:

a reference selector (RFS) for selecting the phase synthesizer output clock or said external clock as sourcing an APLL-ESM reference clock which the output clock has to be phase locked to.

9. A heterodyne timing configuration of a software controlled synchronizer (HTC-SCS) using a local oscillator which can have very low frequency and a micro-controller (MC) for securing programmable phase frequency transfer functions (PFTF) between a reference clock and an output clock while enabling very high frequency multiplication factor which can be programmed to any real number belonging to a continues range from 0 to tens of thousands, wherein very low phase jitter of the output clock is maintained independent of phase jitter levels in the reference clock; the HTC-SCS comprising:

a frequency phase detector (FPD) for measuring a digital phase error between the reference clock and the output clock;

the MC for reading the digital phase error and for implementing the PFTF by controlling operations of a phase synthesizer defining analog phase errors produced by an analog phase detector (APD) of an analog phase locked loop (APLL), wherein such analog phase errors control phase and frequency of the output clock produced by the APLL;

the phase synthesizer, controlled by the MC while connected to the output clock and supplying an input of the APD, for introducing the analog phase errors programmed by the MC;

an analog phase locked loop (APLL), having one input connected to the output of the phase synthesizer while another input is connected to the output clock, for generating said output clock;

a digital phase locked loop (DPLL) using the FPD and the MC and the phase synthesizer for controlling operations of the APLL in order to implement the PFTF between the output clock and the reference clock.

10. The HTC-SCS of statement 9 further including the HPLL of statement 5 in order to multiply a very low frequency of an inexpensive local oscillator to much higher frequency range needed to synthesize the output clock required; such configuration comprising:

an additional frequency phase detector (A-FPD) for measuring a digital phase error between the output clock and the local oscillator applied as an additional reference clock;

an additional DPLL subroutine in the MC for implementing another PFTF applicable to the relation between the output clock and the additional reference clock.

11. The HTC-SCS of statement 9 further including an external synchronization mode (ESM) enabling analog phase locking of the output clock to an external clock which can be provided by a local reference clock or an output clock from a backup synthesizer unit, wherein such HTC-SCS with ESM comprises:

an additional clock selector (CLK-SEL) inserted between the output clock and said another input of the APLL for providing alternative selection of the output clock or such external clock for being connected to said another input of the APLL.

12. The OE-SCS configuration of statement 6 or the HTS-SCS of statement 9 further including the NFED of claim 4 for time domain phase noise filtering from an external reference waveform in order to produce a filtered reference waveform used further on as the reference clock, wherein the NFED can enable by one order more accurate phase detection when the external reference waveform is coming from a noisy serial link such as those utilized by network time protocols; wherein such synchronizer configuration comprises:

the NFED circuit, controlled by the MC and connected to the MC and to the external reference waveform, for producing the filtered reference waveform which is further used as the reference clock by the synchronizer.

13. The OE-SCS configuration of statement 6 or the HTS-SCS of statement 9 further including a time stamp decoder (TSD) circuit for decoding time stamp messages received from a remote serial link in order improve accuracy of phase/frequency detection by eliminating timing uncertainties caused otherwise by interrupts decoding software sub-routines; wherein such synchronizer configuration comprises:

the time stamp decoder, connected to a serial link receiver recovering a message signal, for producing time stamp messages communicated to the MC and for signaling time stamp detections to the FPD;

network time protocol subroutines residing in the MC for reading the digital phase errors occurring between message signal transitions and for reading the time stamp messages and for controlling operations of the phase synthesizer;

wherein such MC subroutines implement said programmed PFTF between the output clock and the reference clock signal defined with pulses occurring between those message signal transitions which are specified by stamp messages as signaling arrivals of such stamp messages.

14. A frame phase detector (FPD) for measuring a frame phase skew between a first frame consisting of a programmable expected number of sampling local clocks, and a second frame defined with a series of time intervals located between second frame edges defined by changes of an external frame signal or by changes of a frame status driven with external messages such as time stamps, wherein a frame measurement circuit captures a number of said sampling periods occurring during an interval of the second frame and a phase processing unit subtracts the captured number from the expected number representing expected duration of the corresponding interval of the first frame; wherein-the frame phase detector comprises:

a circuit for a detection of said second frame edges, by detecting said changes of the external frame signal, or by detecting said changes of the frame status driven by the external messages;

the frame measurement circuit using the sampling local clock, which is a higher frequency signal, to measure said time intervals of the second frame having lower frequency, wherein the frame measurement circuit counts said sampling periods occurring during every interval of the second frame and captures and buffers the counted value until it is read by a phase processing unit;

the phase processing unit for subtracting the expected number of the sampling periods from the counted number of the sampling periods, in order to calculate an interval phase skew between the expected interval of the first frame and the corresponding interval of the second frame.

a circuit and/or a subroutine for combining said interval phase skews of particular frame intervals into said frame phase skew.

15. A frame phase detector as described in statement 14, wherein said second frame begins with a numerical first edge, representing initial phase of the second frame, defined as a number of sampling delays between an expected location of such numerical first edge and the first counted sampling clock, wherein the frame measurement circuit is preset to the numerical first edge before any said counting of the sampling clocks takes place; the frame phase detector comprising:

a circuit for presetting the frame measurement circuit to said numerical first edge before said counting of the sampling periods of the first interval of the second frame takes place;

a circuit and/or a subroutine for supplementing said preset numerical first edge by adding following sampling periods counted until the second edge of the second frame is encountered, and a means for capturing and buffering a resulting total number of sampling periods until it is read by a phase processing unit;

wherein the resulting total number of the sampling periods represents duration of such first interval of the second frame and is made available for further processing.

16. A frame phase detector as described in statement 14 receiving an incoming wave-form carrying the external frame signal or carrying the external message; the frame phase detector wherein:

said detection of the second frame edges from the incoming wave-form, is performed by a circuit synchronized with the local sampling clock and producing a known propagation delay.

17. An FPD as described in statement 14, wherein the frame phase skew is calculated without any accumulation of digitization errors of said intervals phase skews while the single intervals phase skews are still available for intermediate signal processing; the FPD comprising:

a circuit and/or a subroutine for rounding said counted number of the sampling periods by adding 1 such sampling period to the counted number defining length of said frame interval, wherein ½ of the added sampling period approximates a fraction of the sampling period occurring before said counting of the interval sampling periods and another ½ of the added sampling period approximates a fraction of the sampling period occurring after said counting; whereby such addition of 1 sampling period to every interval measurement, provides all sampling periods occurring between said counted numbers of sampling periods relating to consecutive intervals of the second frame, and reduces a digitization error of any long frame to a time sampling error of a single interval.

10. Receiver Synchronization Techniques

RST comprises methods and systems utilizing said referencing frame for achieving substantially more accurate and more stable of synchronization OFDM receiver to composite signal frame.

Furthermore RST comprises methods and systems enabling more accurate recovery of said referencing frame from OFDM data tones only and thus RTS enables both; better accuracy and improved efficiency resulting from elimination of preambles or pilots needed previously.

RST includes a method, a system and an apparatus for recovering said referencing frame signal from received composite frames carrying transmitted data or control pilot information, and for using such recovered referencing frame for synchronizing timing and frequency of receiver's local oscillator and data recovering circuits.

The RST comprises a method for recovering a referencing frame signal from OFDM composite frames carrying transmitted data or control pilot information, and for using such recovered referencing frame for synchronizing timing and frequency of receiver's local oscillator and data sampling circuits wherein a recovered frame lengths of such referencing frame interval represents a combined length of single or multiple composite frame intervals originating this referencing frame interval; wherein such RST comprises:

detection of boundaries of the data carrying frames or pilot frames by processing received OFDM composite signal or a recovered sub-carrier signal;

using such boundaries detections for specifying said referencing frame signal, wherein such detections delimit said referencing frame interval;

calculating a lengths difference between the recovered frame length and a measured frame length wherein such measured frame length of an equivalent symbol frame is the combined length of symbol frame intervals corresponding to said composite frame intervals originating this referencing frame, wherein the symbol frame defines a set of composite signal samples belonging to the same OFDM composite frame;

calculating frequency offset between the referencing frame and such equivalent symbol frame by dividing such lengths difference by the recovered frame lengths or by the measured frame lengths; using such frequency offset for adjusting frequency of said local oscillator in order to maintain frequency alignment between a local oscillator clock and an OFDM transmitter clock;

using such length difference for measuring a time offset between the composite frame and the symbol frame;

using such time offset to synthesize phase of the symbol frame from the local oscillator clocks, in order to maintain correct time alignment between the symbol frame and the composite signal frame.

The RST further comprises:

application of time or frequency domain filters and/or statistical methods for evaluating reliability of such boundary detection, wherein:

if said boundary detection signal is evaluated as reliable, it is used for delimiting said referencing frame interval corresponding to said single or multiple symbol frames;

if said boundary detection signal is dismissed as unreliable, said measured frame length of equivalent symbol frame is increased by the length of symbol frame interval corresponding the composite frame interval which the boundary detection has failed for.

The RST further includes a frequency locked phase synthesis (FLPS) method and system for producing said symbol frame maintaining frequency and phase alignment to said referencing frame providing frequency and phase transmittal from an external source, wherein a frequency locked loop utilizes said local oscillator clock for producing frequency aligned symbol frame and a programmable phase synthesizer utilizes such local oscillator clock for producing the frequency and phase aligned symbol frame; wherein such FLPS comprises:

measuring a frequency error between the referencing frame and the symbol frame;

using such frequency error for maintaining frequency alignment between the symbol frame and the referencing frame by controlling frequency of said local oscillator clock;

presetting said phase synthesizer to an initial phase displacement needed to maintain a phase alignment between the referencing frame and the symbol frame;

measuring a phase error between the referencing frame and the symbol frame;

using such phase error for maintaining said phase alignment between the symbol frame and the referencing frame by controlling phase synthesis functions of said phase synthesizer from the local oscillator clock.

Such RST methods systems and apparatus are described below.

The RST comprises:

detection of boundaries of the data carrying frames or pilot frames by processing received OFDM composite signal or recovered sub-carrier signal;

using such boundaries detections for specifying said referencing frame signal, wherein such detections delimit referencing frame interval and/or are utilized to define a nominal number of local oscillator output clocks expected to occur during such interval if frequency offset between the local oscillator clock and a transmitter clock equals zero;

The RTS further comprises using such referencing frame signal for measuring a normalized phase skew (equal to said frequency offset) and said time offset between the receiver and transmitter, wherein:

the local oscillator clock is counted during such referencing frame interval, and the counted value is buffered until it is used for calculating a phase skew between a local oscillator interval consisting of said nominal number of local oscillator clocks and the referencing frame interval;

said phase skew is calculated as equal to a difference between the counted number of said local oscillator clocks and the nominal number;

said normalized phase skew is calculated by dividing such phase skew by the nominal number;

such normalized phase skew is used for synchronizing local oscillator frequency to a transmitter oscillator frequency;

time offset is measured utilizing a phase difference between the referencing frame and a receiver symbol frame which defines a set of composite signal samples carrying an OFDM symbol, or between the referencing frame and an local oscillator frame consisting of the nominal number of said local oscillator clocks;

such time offset is used to synthesize phase of the receiver symbol frame from the local oscillator clocks, in order to maintain correct time displacement between the receiver symbol frame and the composite signal frame.

The RST includes using such boundary detections for defining referencing frame intervals corresponding to multiple composite frames detected and thus such inter-detection intervals can represent multiple OFDM symbol intervals.

Accuracy of time offset measurement (evaluating timing difference between such boundary detection and a corresponding boundary of local symbol frame) is determined by a pilot/preamble form and/or processing method used.

Said frequency offset (equal to the normalized phase skew) measured over referencing frame interval is derived by dividing said phase skew, detected within the interval, by the expected interval length specified by the nominal number.

Accuracy of such phase skew detection is similar to that of the time offsets, since all of them are defined using said boundary detections.

Consequently such use of said referencing frame consisting of such prolonged intervals, greatly improves accuracy of frequency offset measurements.

RST includes:

maintaining known or predictable processing delay between reception of composite frame samples supplying direct or embodied definition of composite frame boundary, and a detection signal of such frame boundary produced by said synchronous processor operating synchronously with the local oscillator while processing such composite signal samples;

The RST further comprises:

using the synchronous sequential processing method and circuit (such SSP is defined in Subsection 8 of SUMMARY OF THE INVENTION), for implementing such synchronous processor maintaining said known or predictable processing delay.

RST comprises application of time or frequency domain filters and/or statistical methods for evaluating reliability of such boundary detections, wherein:

if said boundary detection signal is evaluated as reliable, it is used for delimiting said referencing frame interval corresponding to a singular or multiple said received symbol frames;

if said boundary detection signal is dismissed as unreliable;

an expected filtered lengths of said symbol frame period specifies generation time of a signal delimiting said referencing frame interval, or said nominal number of local oscillator clocks, corresponding to zero frequency offset within the last symbol frame, is added to said nominal number, corresponding to zero frequency offset within the current referencing frame interval, instead of generating such delimiting signal.

The RST covers both versions explained below:
utilizing said conventional DSP techniques and processors, implemented already by conventional solutions for the time offset measurement, for the detection of composite frame boundaries;
or using said real-time synchronous processing techniques for such detection of composite frame boundaries (by ~10× more accurate than that of such conventional DSP techniques).

Even if such conventional less accurate boundary detection is implemented; said RTS frequency offset measurement (10 times more accurate) will similarly improve amount of time offset introduced between consecutive boundary detections. Therefore time offset tracking and protection from any inter-symbol interference will be greatly improved as well, despite implementing such less accurate boundary detection.

RST includes an inherently stable frequency locked phase synthesis (FLPS) method and system producing said symbol frame maintaining frequency and phase alignment to a referencing frame providing frequency and phase transmittal from an external source, wherein a frequency locked loop utilizes an oscillator for producing a frequency aligned oscillator clock and a programmable phase synthesizer utilizes such frequency aligned oscillator clock for producing the frequency and phase aligned symbol frame (see FIG. 13 and FIG. 15); wherein:
the oscillator clock is counted during an interval of the referencing frame, and the counted value is buffered until it is used for calculating a phase skew between an oscillator nominal frame, consisting of a nominal number of said oscillator clocks, and said referencing frame, wherein the nominal number is such number of oscillator clocks which is expected to occur during such referencing frame interval if the phase skew equals zero;
said phase skew is calculated as equal to a difference between the counted number of said oscillator clocks and the nominal number;
if said referencing frame intervals are expected to have varying lengths specified by their nominal numbers varying accordingly, a normalized phase skew is calculated by dividing such phase skew by the nominal number assigned to such interval;
said phase skew or normalized phase skew is applied back to the oscillator, in order to maintain said frequency alignment of the oscillator clock to the referencing frame;
the referencing frame is applied to the phase synthesizer which utilizes said such oscillator clock for synthesizing said symbol frame maintaining frequency and phase alignment to the referencing frame;
wherein such phase synthesizer (PS) (described in Subsections 5 and 6 of SUMMARY OF THE INVENTION) has its phase synchronization acquisition initialized by presetting initial phase of the synthesized frame (as it is exemplified in Subsection 5 of DESCRIPTION OF THE PREFERRED EMBODIMENT).

Furthermore RST comprises a second version of the FLPS offering better stability than that of conventional phase locked loops combined with highly accurate phase control (see FIG. 14); wherein the last step of the described above first version is replaced with the 2 steps listed below:
phase error (time offset) is measured as a phase difference between the referencing frame interval and a symbol frame interval produced by the phase synthesizer;
such phase error is applied back to the phase synthesizer which utilizes said oscillator clocks for synthesizing the symbol frame maintaining frequency and phase alignment to the referencing frame.

Such phase synthesizer can be implemented; by utilizing methods and circuits defined in said Subsections 5 and 6 of this section.

Such second version comprises using much simpler phase synthesizer (without phase jitter control & reduction), which can be implemented as modulo (nominal-number) counter of oscillator clocks wherein such phase error is applied as counter preset value.

In addition to the stability improvements, both FLPS versions explained above enable by one order (~10×) faster acquisition of frequency/phase alignment than that of conventional configurations for phase/frequency synchronization or control.

Such much faster synchronization acquisition shall be advantageous; in reducing mobile phone hand-over losses, or improving reliability of Wi/Fi or WiMAX connection switching.

RST comprises methods and systems enabling recovery of referencing frame phase (i.e. time offset) from OFDM data sub-carriers (or tones) only, without any use of bandwidth consuming preambles or pilot tones needed in conventional solutions.

Such phase (time offset) recovery from data sub-carriers (PRDS) methods comprise using said real-time synchronous processing techniques for recovering amplitudes and phases of sinusoidal cycles or half-cycles of a sub-carrier (tone) selected as being most reliable based on previous training session and/or on-fly channel evaluation. Such synchronous processing techniques are shown in the U.S. 60/894,433 claimed as priority application.

Such synchronous processing performed in phase with OFDM waveform capturing circuit, uses frequency sampling filters for recovering time domain sinusoidal representations of two tones (sub-carriers) elected as being reliable enough and spaced sufficiently in frequency domain.

Every half-cycle of such recovered sinusoid identifies phase and amplitude of the tone (or sub-carrier) signal.

Such redundancy enables using statistical and deterministic filtering methods, much more efficient than DFT/FFT averaging effect, for selecting the half-cycle supplying most reliable and accurate tone parameters.

Such in phase synchronous processing implementing said SSP is used to provide said time domain recovery of only one or several such tones (sub-carriers), selected to facilitate said recovery of the referencing frame.

Such in phase processing assures maintaining said known or predictable processing delay between; said reception of composite frame, and said detection signal of referencing frame boundary.

By evaluating amplitudes and/or phases of such recovered sinusoidal cycles or half-cycles, said received symbol boundary is detected when correlation between consecutive amplitudes and/or phases recovered falls down after maintaining a middle-symbol plateau, thus indicating the end of the received symbol frame.

Such in phase synchronous processing enables recovery of single half-cycles of said selected sub-carrier. Therefore the phase of the end of last negative half-cycle recovered during such symbol frame, can be treated as the end boundary $E_B$ of this symbol frame.

Furthermore such ending phase enables detection of the received symbol boundary (time offset) with accuracy by ~10× better than that of conventional solutions, when a data coding phase displacement $C_D$ of such selected tone is recovered and used to correct this ending phase, as it is explained below.

For a displacement code $D_C$ equal to 0, 1, 2 or 3, and for tone period $T_T$, such coding displacement $C_D$ shall be calculated as:

$$C_D = D_C \frac{T_T}{4}$$

Plurality of half-cycles detected over symbol interval supplies a lot of redundant timing information about in phase processed tones (sub-carriers). If another selected tone T2 is similarly in phase processed, than both tones coding displacements ($C_{DT1}$ for T1, $C_{DT2}$ for T2) can be calculated by analyzing time delay $T_{KT1-KT2}$ measured between T1 cycle number $K_{T1}$ and T2 cycle number $K_{T2}$.

Such displacement code can be calculated first as explained below:

$$T_{KT1-KT2} = K_{T1} \cdot T_{T1} + C_{DT1} - (K_{T2} \cdot T_{T2} + C_{DT2}),$$

consequently:

$$D_{CT1} \frac{T_{T1}}{4} - D_{CT2} \frac{T_{T2}}{4} = T_{KT1-KT2} - (K_{T1} \cdot T_{T1} + K_{T2} \cdot T_{T2}) = \Delta,$$

$$D_{CT1} = D_{CT2} \frac{T_{T2}}{T_{T1}} + \Delta \frac{4}{T_{T1}}$$

wherein final $D_{CT1}$ digit can be derived by substituting $D_{CT2}$=0, 1, 2, 3 into the above equation and by choosing for $D_{CT1}$ this one of integers 0, 1, 2, 3 which is the closest to one of $D_{CT1}$ values calculated with the above equation.

Knowing the $D_{CT1}$ number said coding displacement of T1 can be calculated as:

$$C_{DT1} = D_{CT1} \frac{T_{T1}}{4}$$

It shall be noticed that if Tone 1 frequency is by 4 times greater than that of Tone 2; than the multiplier $T_{T2}/T_{T1}=4$ and consequently a time delay between a T1 cycle and closest to it T2 cycle supplies the value of the coding displacement $C_{DT1}$ directly.

Furthermore in phase tones processing circuits implemented using said SSP techniques, define efficient and accurate registration of such time delays (between neighbor cycles of different tones), which can represent said direct $C_{DT1}$ measurement.

RST comprises methods and systems enabling referencing frame phase recovery from OFDM data sub-carriers with ~10× greater accuracy than that of conventional solutions without even requiring said preambles or pilot tones; wherein such high accuracy phase recovery (HAPR) method comprises steps listed below:

said in phase processing techniques are used for recovering amplitudes and phases of sinusoidal cycles or half-cycles of selected sub-carriers (tones), wherein such in phase processing assures maintaining said known or predictable processing delay between; said reception of composite frame, and said detection signal of referencing frame boundary;

delay time between sinusoidal cycles of different selected tones is registered and used to recover data coding displacements occurring in the selected tones of the received composite frame;

an approximate symbol frame boundary is detected by evaluating amplitudes and/or phases of such recovered sinusoidal cycles or half-cycles, when correlation between consecutive amplitudes and/or phases recovered falls down after maintaining a middle-symbol plateau, thus indicating the end of the received symbol frame;

a phase of last cycle of such recovered sinusoidal tone is derived by analyzing amplitudes and/or phases of said sinusoidal cycles or half-cycles recovered before the end of symbol frame;

an accurate symbol boundary is derived by correcting such phase of last cycle with the data coding displacement.

BRIEF DESCRIPTION OF THE DRAWINGS

FIG. 1 Shows an Open Ended Configuration of Software Controlled Clock Synchronizer.

FIG. 2 Shows Open Ended Configuration of SCCS with External Synchronization Mode FIG. 3 Shows Heterodyne Timing Configuration of SCCS enabling acceptance of very. range of referencing clock frequencies.

FIG. 4 Shows Sequential Clocks Generator (SCG) and Output Selection Circuits (OSC) enabling high resolution selections of mutually overlapping sub-clocks.

FIG. 4A Shows Sequential Clocks Generator (SCG) and Return Selection Circuits (RSC), lowering output clock jitter FIG. 5 Shows Timing Control (TC) and Clocks Equalization (CE), which control timing of high frequency switching of synthesized clock FIG. 6 Shows Synchronous Sequential Phase Processor (SSPP), which performs programmable high-speed phase synthesis.

FIG. 7 Shows Timing Diagram of Phase Synthesizer.

FIG. 8 Shows Wave Capturing including Edge Regions (WCER), which enable continues capturing of a an oversampled high frequency waveform.

FIG. 9 Shows Sequential Clocks Generation for the NFED (SCG NFED), which provides mutually overlapping sub-clocks enabling high accuracy detection of noisy signal edges.

FIG. 10 Shows Noise Filtering Edge Detectors (NFED)

FIG. 11 Shows Wave Form Screening & Capturing (WFSC), which enables analysis of incoming noisy waveform facilitating adaptive noise filtering FIG. 12 Shows Timing Diagrams of the WFSC.

FIG. 13 Shows a block diagram of Inherently Stable Synchronization System.

Notes referring to FIG. 13, are provided below:

Boundary detection delay (Tbd) determines predictable part of referencing frame delay to OFDM composite frame.

Frequency offset (Fos) is not affected by the boundary detection delays Tbd for as long as Tbd remains constant.

In order to make up for the boundary detection delay, Phase Synthesizer (PS) positions Local Symbol Frame forward in time compared to Referencing Frame.

Frequency offset Fos derived using counted number of sampling clocks (Fcnt) and the nominal number (Fnom), can be measured with over 10× greater accuracy if it is measured over a reference frame interval over 10× longer.

FIG. 14 Shows a block diagram of Synchronization System with Improved Stability.

Notes referring to FIG. 14, are provided below:

Boundary detection delay (Tbd) determines predictable part of referencing frame delay to OFDM composite frame.

Frequency offset (Fos) is not affected by the boundary detection delays Tbd for as long as Tbd remains constant.

Time error (Terr) between local symbol frame and composite frame, amounts to boundary detection delay added to the phase error between reference frame and local symbol frame i.e. Ter=Tbd+(Trf−Is).

FIG. 15 Shows an Inherently Stable Frequency Locked Phase Synthesis system.

FIG. 16 Shows a similar FLPS system with its Frequency Detector utilizing local XTAL clock.

FIG. 17 Shows a similar FLPS with Improved Stability.

FIG. 18 Shows a similar FLPS but enabling more accurate generation of a synchronized clock.

DESCRIPTION OF THE PREFERRED EMBODIMENTS

1. Phase Synthesizer

The above mentioned first PS implementation is selected for the preferred embodiment, and it is shown in the FIG. 4, FIG. 5, FIG. 6 and FIG. 7.

The PS comprises wave timing definition, which includes two major components downloaded to the PS from the PCU: basic less frequently changed phase adjustments, which can include both periodical adjustments and fractional adjustments, define more stable components of wave-form phase; high frequency phase modulations, which can include both the periodical adjustments and the fractional adjustments, allow every leading edge phase and/or every falling edge phase to be modulated with a different modulation factor.

Said phase modulations are downloaded to the PS simultaneously in batches containing multiple different modulation factors, where every said batch refers to a series of consecutive wave edges.

The PS has internal selection circuits, which select and use consecutive modulation factors for modulating phases of consecutive edges.

In order to allow higher wave generation frequencies, 2 parallel processing circuits are implemented which use consecutive phase1/phase2 circuits for synthesizing phases of consecutive odd/even edges.

As it is shown in the FIG. 6, said basic phase adjustments are loaded to the Periodical Number Buffer (PNB) and to the Fractional Number Buffer (FNB); where they remain unchanged until PS internal Modulations Counter (MC) reaches MC=0 condition.

On the other hand, said modulation factors M1, M2-M6, M7 are shifted left, by one factor for every new edge, in the Phase Modulation Buffers (PMB1/PMB2) for providing consecutive modulation factor needed for a next edge in the left end of the PMB1/PMB2.

Such updated modulation factor is then added to the basic phase adjustments and resulting modulated phase adjustments are downloaded into the Periodical Number Registers (PNR1/PNR2) and into the Fractional Number Registers (FNR1/FNR2).

In order to synthesize an actual position of a new edge of the synthesized waveform; said downloaded modulated phase adjustments need to be added to a current edge position, and the results of said addition are downloaded into the Periods Counters (PC1 or PC2) and into the Fractional Selection Register (FSR)

The Sequential Clocks Generator (SCG) and Output Selection Circuits (OSC) are shown in the FIG. 4 and have been already explained in the Subsection "6. General Definition of Phase Synthesizer" of the previous section.

The Clock Selection Register 1/2 (CSR1/CSR2) specifies a sub-clock which will be selected in a forthcoming Phase2/Phase1 cycle of the reference clock fsync.

In order to remain settled during a whole next cycle of the fsync, the CSR1/CSR2 registers are loaded by the early sub-clocks of the present Phase2/Phase1 cycle of the fsync.

The CSR1/CSR2 are loaded:

with a current content of the Fractional Selection Register (FSR) (shown in FIG. 6), if the LD_C1 or LD_C2 (Load Counter 1 or Load Counter2) signal indicates that an end period of the present phase adjustment is indicated by the C2E or C1E (Counter 2 End or Counter 1 End) accordingly (see FIG. 2 and FIG. 3);

with the binary value $2^S-1=R+1$ which exceeds ranges of the $1^{st}$ Clock Selector (1CS) and the $2^{nd}$ Clock Selector (2CS) and results in none of selectors outputs being activated and none of sub-clocks being selected during a following phase cycle.

The Timing Control (TC) circuits are shown in FIG. 5, the resulting Timing Diagram of Phase Synthesizer (TDPS) is shown in FIG. 7, and TC operations are explained below.

The LD_C1 signal enables loading of the Period Counter 1 (PC1) with a number of periods which the previous stages of the Synchronous Sequential phase Processor (SSPP) have calculated for the current phase adjustment.

Said download deactivates/activates the C1E signal if a downloaded value is (bigger than 1)/(equal to 1) accordingly. When said downloaded value is bigger than 1, the C1EN=1 enables decreasing the PC1 content by 1 at every leading edge of the Clk1.1 until the PC1=1 condition is achieved and is detected by the PC1-OVF Detector which signals it with the C1E=1 signal.

It shall be noticed that: when a fractional part of a phase adjustment calculated in said FSR reaches or exceeds a whole period of the fsync, the overflow bit FSR(OVF)=1 is activated and switches the PC1=1-OVF DETECTOR from said 1 detection mode to a 0 detection mode which prolongs current phase adjustment by 1 fsync period.

The phase 2 control circuit is driven by the C1E and by the LD_C1, and controls phase 2 operations with signals LD_C2, LD_RE2, LD_BU2; as it is further explained below:

The first C1E activation period generates the LD_C2 signal, and is followed by setting the LDR2_FF which terminates the LD_C2.

The LD_C2 signal; enables loading of PC2 with a periods number for the next phase adjustment, enables loading of the FSR with a fractional adjustment for the next phase adjustment, and enables a downloading of the FSR to the CSR1 or to the CSR2.

The LDR2_FF=1 generates the leading edge of the LD_RE2 signal.

The LD_RE2 signal clocks in; a new modified fractional adjustment to the Fractional Number Register 2 (FNR2), and a new modified periodical adjustment to the Periodical Number Register 2 (PNR2).

When the period number loaded by the LD_C2 is counted down to its end by the PC2, the C2E signal activates the LD_C1 similarly as the C1E has activated the LD_C2.

The LD_C1=1 resets both the C1E and the LDR2_FF in the next cycle;

The LDR2_FF=0 generates the leading edge of the LD_BU2 signal.

The LD_BU2 signal clocks in; a previous PMB2 content shifted left by S+1 bits, or a new PM[M6,M4,M2,M0] content from the PCU when the Modulations Counter (MC) is decoded as MC=0.

The phase 1 control circuit is similarly driven by the C2E and by the LD_C2; and similarly generates the LD_C1, LD_RE1, LD_BU1 signals for controlling phase1 operations.

The only differences in the phase 1 versus phase 2 operations, are specified below:

The LD_BU1 signal clocks in a decreased by 1 value to the MC which is the modulo 4 counter.

The DECODER MC=0 generates the MC=0 signal which selects provided by the PCU; the Periodical Number (PN)/the Fractional Number (FN)/the Phase Modifications (PM) to be loaded into the Periodical Number Buffer (PNB/the Fractional Number Buffer/the Phase Modifications Buffer 1(PMB1) by the leading edge of the LD_BU1.

The DECODER MC=1 generates the MC=1_INT interrupt signal to the PCU, which informs the PCU that all the above mentioned phase adjustment parameters have been already stored in the PS buffers and can be replaced by new phase adjustment parameters.

2. Heterodyne Timing Configuration

FIG. 3 shows the heterodyne timing configuration (HTC) according to the preferred embodiment. The HTC integrates both Digital PLLs (DPLLs) and Analog PLLs (APLLs) into a single CMOS ASIC, with the exception of the external VCXO which provides a stable clock (Fil_LocClk) having very low phase jitter.

Said APLL mode of the HTC is described below.

The Reference Selector (RFS) is programmed by the PCU to select one of the external reference clocks (Ext_RefClk). Such selected external reference clock is applied to the reference input of the Analog Phase Detector (APD) which drives the Loop Filter of the VCXO which provides the stable low jitter output f_filter.

The Fil_OutClk; drives the Output PLL (OUT_PLL), and is connected to the fsync/L input of the Return Clock Synthesizer (RET_PS) which is implemented with the PS embodiment described in the previous section.

The RET_PS synthesizes the RetClk, which is connected to the APD return input.

It shall be noticed that very wide ranges of the RET_PS frequency adjustments, enable the PCU to tune the RET_PS to any frequency which the selected external reference may have.

Said OUT_PLL generates the output reference clock (OutRef) which drives the Output Clocks Generator (OCG) which provides all the major HTC output clocks OutClk(T:1).

Since the OCG consists of frequency dividers having very tightly controlled and well matched propagation delays, all the OutClk(T:1) are phase aligned with the Fil_OutClk and between themselves.

The DPLL mode of the HTC is described below.

The Fil_OutClk signal is programmed to be selected by the RFS for the APD reference signal, and the RET_PS provides the APD return signal which is synthesized from the same Fil_OutClk signal. One of the external reference waveforms (Ext_RefWfm) is selected by a selector controlled by the PCU for being processed by the NFED providing the filtered reference waveform (Fil_RefWfm), which is connected to the Time Stamp Decoder (TSD) and to the FPD1.

Local oscillator fixed output (LocOsc) is connected to the FPD2.

Both frame phase detectors FPD1/FPD2 shall use the high frequency sampling clock (SampClk) for accurate digital measurements of the PhaErr1 and the PhaErr2.

Said sampling clock is generated by the frequency multiplier OutRefxR from the OutRef generated by the OUT_PLL.

Since the OutClk(T:1) output clocks are phase aligned with the OUT_PLL output clock OutRef, and the sampling clock SampClk is phase aligned with the OutRef as well; the SampClk is phase aligned with the HTC output clocks OutClk(T:1).

The FPD1 measures a phase error between the sampling clock SampClk and the Ext_RefWfm, as $\Delta\Phi1=\Phi\_samp—\Phi\_wfm$.

The FPD2 measures a phase error between the sampling clock SampClk and the LocOsc, as $\square\square2=\Delta\Phi2=\Phi\_samp—\Phi\_osc$.

The PCU reads the measured phase errors and uses the RET_PS to introduce digital phase displacements between the APD reference input and the APD return input which will drive the VCXO based PLL for providing required phase transfer functions between the Fil_OutClk and the Ext_RefWfm.

Since the Fil_OutClk drives the OUT_PLL which has much higher BW than the VCXO PLL and the OUT_PLL determines phase of the OutClk, the OutClk implements the same phase transfer function as the Fil_OutClk.

Based on the measurements of $\Delta\Phi1$ and $\Delta\Phi2$, the PCU calculates said Periodical Numbers (PN), Fractional Numbers (FN) and Phase Modifications (PM) which need to be provided to the Return Phase Synthesizer (RET_PS); in order to achieve a preprogrammed transfer function between the HTC output clocks and the selected DPLL reference clock Ext_RefWfm.

HTC free-run and hold-over modes use the above described DPLL mode configuration, as it is described below.

In the free-run mode; the PCU uses the phase error measurements for calculating phase differences which need to be inserted via the RET_PS for providing said OutClk locking to the local oscillator LocOsc.

In the hold-over mode; the PCU inserts phase differences via the RET_PS which cause the OutClk to maintain its last frequency displacement versus the LocOsc.

3. Noise Filtering Edge Detectors

The preferred embodiment implements the above defined general components of the NFED and is shown in FIG. 8, FIG. 9 and FIG. 10.

The NFED comprises over-sampling and capturing of consecutive wave-form intervals in specifically dedicated consecutive wave registers, wherein odd intervals are written into the wave register 1WR and even intervals are written into the wave register 2WR. Therefore incoming stream of samples is split into the two parallel processing phases (sometimes named as parallel synchronous pipelines). The first processing phase begins in the wave register 1WR and the second begins in the register 2WR. Such splitting into 2 parallel phases obviously doubles cycle time available in the sequential stages following the register 1WR and in the stages following the 2WR as well.

A sequential clock generation circuit (SCG) shows a method for splitting a steady stream of mutually overlapping sub-clocks spaced by a gate delay only into sub-sets of sub-clocks active during their dedicated phases only and non-active during all other phases. Such subsets are obviously used for providing timing for their dedicated phases.

The wave register 1WR is further split into 2 parallel sub-phases and the 2WR is split into other 2 parallel sub-phases, for the purpose of quadrupling cycle time available in said sub-phases (see the FIG. 8 showing the wave registers 1WR, 2WR followed by the wave buffers 11WB, 12WB, 21WB, 22WB).

In order to provide all wave samples needed for the filtering edge detection along a whole wave buffer, the NFED includes rewriting:
the end part 2WR(R:(R−M+1) of the wave register 2WR, into the front parts 11WB(M:1), 12WB(M:1) of the wave buffers 11WB,12WB;
the end part 1WR(R:(R−M+1) of the wave register 1WR, into the front parts 21WB(M:1), 22WB(M:1) of the wave buffers 21WB,22WB.

The preferred embodiment is based on the assumptions listed below:
the wave registers 1WR and the 2WR are 15 bit registers (i.e. R=14);
the rising edge mask REM(M:0) and the falling edge mask FEM(M:0) are 8 bit registers (i.e. M=7) and the PCU loads the same masks equal to 00001111 to both mask registers;
the rising edge threshold RET is loaded with 0110 (6 decimal), and the falling edge threshold FET is loaded with 0010 (2 decimal);
The digital filter arithmometers 21DFA1/22DFA1/11DFA1/12DFA1 perform all the comparison functions, between the edge mask registers REM/FEM and the waveform buffers 21WB/22WB/11WB/12WB involving the edge threshold registers RET/FET, with the 3 basic operations which are further explained below.

The first operation is performed on all the waveform bits and involves the edge mask bits as it is specified below:
For every waveform buffer consecutive bit $WB_k$ the surrounding bits $WB_{k-4}$, $WB_{k-3}$, $WB_{k-2}$, $WB_{k-1}$, $WB_k$, $WB_{k+1}$, $WB_{k+2}$, $WB_{k+3}$ are logically compared with the mask bits $B_0$, $B_1$, $B_2$, $B_3$, $B_4$, $B_5$, $B_6$, $B_M$ and the resulting 8 bit binary expression $BE_k(7:0)$ is created as equal to; $BE_k(0)=(WB_{k-4}=B_0)$, $BE_k(1)=(WB_{k-3}=B_1)$, $BE_k(2)=(WB_{k-2}=B_2)$, $BE_k(3)=(WB_{k-1}=B_3)$, $BE_k(4)=(WB_k=B_4)$, $BE_k(5)=(WB_{k+1}=B_5)$, $BE_k(6)=(WB_{k+2}=B_6)$, $BE_k(7)=(WB_{k+3}=B_7)$.

The second operation adds arithmetically all the bits of the binary expression $BE_k(7:0)$ and the resulting edge proximity figure $EPF_k$ is calculated as equal to $EPF_k=BE_k(0)+BE_k(1)+BE_k(2)+BE_k(3)+BE_k(4)+BE_k(5)+BE_k(6)+BE_k(7)$ which shall amount to a 0-8 decimal number. During the first and the second operations: all bits of any particular wave buffer have their specific edge proximity figures calculated at the same time during a cycle assigned for one of the arithmometers 21DFA1/22DFA1/11DFA1/12DFA1 attached to that buffer.

Since there are 15 bits in every wave buffer every such arithmometer consists of 15 parallel micro-arithmometers, wherein each such micro-arithmometer performs operation on an 8 bit edge mask and on 8 bit wave region.

Since this arithmometers perform the most intense processing, said quadrupling of cycle time by gradual splitting from the original 1 phase into the present 4 parallel phases was needed.

The third operation performs functions explained below:
In order to carry the same level from the last bit of the previous DFR1 into the following bits of the present phase digital filter register2 (DFR2), the last bit DFR1(R) of the previous DFR1 is always rewritten into the carry bit DFR1(C) of the present DFR1 and is used by the digital filter arithmometer2 (DFRA2) to fill front bits of the DFR2 with the same level as the last bit of the previous phase DFR1. The verification is made if the $EPF_k$ indicates a rising edge condition by exceeding the content of the rising edge threshold RET(T:0). Consequent detection of the $EPF_k$>RET=6 condition, sets to level=1 the corresponding $DFR1_k$ bit of the DFR1 and all the remaining bits of the present DFR1 until a falling edge is detected as it is explained below.

The verification is made if the $EPF_k$ indicates a falling edge condition by being smaller than the content of the falling edge threshold FET(T:0). Consequent detection of the $EPF_k$<RET=2 condition, sets to level=0 the corresponding $DFR1_k$ bit of the DFR1 and all the remaining bits of the present DFR1 unless a rising edge is detected as it explained above.

The digital filter arithmometers 21DFA2/22DFA2/11DFA2/12DFA2 perform; the inter-phase continuation of filling front bits of the present phase register in accordance with the level set in the last bit of the previous phase, followed by said edge displacement which compensates for duty cycle distortions due to inter-symbol interference (ISI), etc.

The edge displacement comprises the 3 basic operations described below.
Any DFR1 rising edge, indicated by a level 0 to 1 transition, is shifted left by a number of bits specified by a content of the rising edge displacement register (RED (D:0)) loaded by the PCU in accordance with its filtering algorithms.
Any DFR1 falling edge, indicated by a level 1 to 0 transition, is shifted left by a number of bits specified by a content of the falling edge displacement register (FED (D:0)) loaded by the PCU in accordance with its filtering algorithms.
In order to propagate said displacement operations from the present phase to the previous phase; the propagated sign of the edge bit (DFR2(Sp)) and the propagated bits (DFR2(Dp:0)), are calculated by the DFR2 and are written down into the DFR2 extension DFR2(Sp,Dp:0).
In order to propagate said displacement operations from the next phase DFR2 into end bits of the present phase digital filter register3 (DFR3); the propagated sign of the edge bit and the propagated displaced bits DFR2(Sp,Dp:0) from the next phase, are used by the digital filter arithmometer3 (DFRA3) to fill end bits of the digital filter register3 (DFR3) with the correctly displaced bits propagated form the next phase to the present phase.

4. Wave-Form Screening and Capturing

The wave-form screening and capturing (WFSC) of screened out intervals is performed by the circuits which are shown in FIG. 11 and the timing diagrams of the WFSC are shown FIG. 12.

The WFSC allows the PCU to perform screening and capturing of the incoming signal, for timing intervals which correspond roughly to a period of a single data bit, based on a content of the wave buffers 11WB, 12WB, 21WB and 22WB.

The WFSC allows the PCU to screen signal quality of incoming wave form, by applying programmable screening functions using programmable data masks, as it is listed below:
content of said wave buffers can be verified for compliance or non compliance with a mask provided by the PCU, based on verification functions and verification tolerances which are programmed by the PCU;

if any wave buffer verification detects preset by PCU screening out criteria to be met, the corresponding content of a wave buffer is captured and made available for PCU for further analysis;

in addition to the wave buffer capturing, a number of said screened out results will be counted and communicated to the PCU as well.

In addition to the above mentioned screening; the WFSC allows also the PCU to select arbitrarily a content of any of the wave buffers during any particular time slot; for being captured and made available for analysis by the PCU.

The above mentioned signal screening is implemented by the WFSC, as it is explained below. The Mask Detection Arithmometrs (11MDA and 12MDA) for the WFSC are positioned similarly as the DFAs of the NFED.

The second stage uses the mask detection arithmometers 11MDA/12MDA for identifying wave-forms which are beyond usually acceptable range defined by the PCU.

The programmable control unit (PCU) determines logical and/or arithmetical processing which the 11MDA/12MDA shall perform, by pre-loading the detection control register (DCR) with a control code applied as the DCR(P:0) to the 11MDA/12MDA.

Additionally the PCU determines the mask DMR(R:0) which the captured data 11WB(R:0)/12WB(R:0) shall be processed against, by pre-loading the detection mask register (DMR).

The 11SEL signal equal to I/O selects; the 11WB(R:0)/12WB(R:0) to be downloaded to the phase one detected data buffer (1DDB) by the clock 1Clk2 (see FIG. 11 and FIG. 12), if the 11DET/12DET indicate detection of a pre-selected mask by the mask detection arithmometer 11DMA/12DMA.

At the beginning of the next time frame, which has 128 phase1 cycles, the last captured 1DDB content is further downloaded to the phase1 data register (1DDR) by the clock signal 1Clk3/128. Number of said mask detections is counted in the mask counter buffer (1MCB), as it is explained below:

at the beginning of every time frame which has 128 phase1 cycles, the 1MCB is reset/preset to 0/1 if there isn't/is a mask detection for the first cycle of the frame which is signaled by the 1PHA/128ena=1;

the 1MCB is increased by 1/kept the same, if there is/isn't any mask detection during a particular phase1 cycle;

at the beginning of the next time frame, the 1MCB is downloaded to the phase1 mask counter register (1MCR) and the output of the 1MCB>0 decoder (MCB>0 DEC) is downloaded to the 1MCR(P) bit, by the 1Clk3/128.

Said 1DDR and 1MCR are read by the PCU, when the beginning of the next frame is communicated to the PCU by the phase1 $128^{th}$ clock enable signal (1PHA/128ena) and the above mentioned 1MCR(P)=1 indicates that at least 1 detection of a pre-selected mask occurred during the previous frame.

Said PCU controlled capturing of a wave buffer content is implemented, as it is explained further below.

The sample number register (SNR) is loaded by the PCU: with a phase number defined as phase1/phase2 if the SNR(0) is set 0/1, and with a particular phase cycle number in a time frame defined by SNR(7:1) bits.

Since there are 2 phases with 128 cycles per time frame, SNR(7:0) bits define 1 of 256 sampling cycles for having its wave buffer captured and made available for a further analysis by the PCU.

Said SNR is downloaded into the phase1 sample number buffer (1SNB) at the beginning of a time frame by the first phase1 clock of the frame 1Clk2/128.

At the beginning of a time frame: the phase1 sample number counter (1SNC) is set to 0, since the 1PHA/128ena selects 0 to be loaded into the 1SNC by 1Clk2.

During every other cycle of the time frame: 1 is added to the SNC content, since the 1PHA/128ena is inactive during all the next cycles of the frame.

The 1SNC(7:1) and the 1SNB(7:1) are being compared by the logical comparator (Log.Comp.), which produces the Eq=1 signal when their identity is detected.

Said Eq=1 enables the 1SNB(1)=0/1 to select the 11WB(R:0)/12WB(R:0) in the 3:1 selector (3:1 SEL), for capturing in the phase1 sampled data buffer (1SDB).

At the beginning of the next time frame, the output of the 3:1 SEL is additionally captured in the phase1 sampled data register (1SDR) by the signal 1Clk3/128.

Said 1SDR is read by the PCU, which is notified about availability of the requested sample by the signal 1PHA/128ena.

5. Receiver Synchronization Techniques

Functional block diagram of inherently stable synchronization system is provided in FIG. 13 wherein recovery of OFDM receiver sampling clock Cs and local symbol frame Fls is shown. More detailed implementation and partitioning of such system is shown in FIG. 15.

Samples from an OFDM composite signal interval, long enough to comprise entire OFDM symbol, are processed by the Synchronous Sequential Processor (defined in Subsection 8 of SUMMARY OF THE INVENTION) which uses Cs as its reference clock (see FIG. 13 and FIG. 14).

Sub-clocks of such reference clock, driving such SSP used for OFDM processing, may not need to facilitate phase resolution matching single gate delay. Therefore a conventional delay line, consisting of serially connected flip-flops driven by a frequency multiplier of the reference clock, can be sufficient to generate such lower resolution sub-clocks instead of using the delay line consisting of serially connected gates with all elaborate timing involved.

However independent of any delay line implementation, SSP architecture guaranties that all SSP micro-operations are performed in exactly predefined time windows within known time displacements to such reference clock. Therefore SSP processing delay measured from entering last sample of an interval processed to producing the final result of such interval processing is totally predictable.

As specified therein, SSP includes real-time processing stages of incoming wave-form and a programmable computing unit (PCU) for supporting any adaptive signal processing dependent of previous micro-operations results or wave-form content.

SSP uses interrupts to acquire results of such PCU adaptive processing, while PCU produces such results in advance before they are needed (see also Subsection 8 of SUMMARY OF THE INVENTION). Therefore SSP can use such results in predefined time windows synchronizing known sequence of said SSP micro-operations, while PCU accommodates all changes of processing time and/or algorithms.

Since such SSP is used to detect composite frame boundary, resulting boundary detection delay Tbd is known very accurately.

Despite such accurate Tbd, composite signal distortions due to channel interference and inherent problems of conventional methods for composite frame boundary detection, shall be expected to cause noticeable errors in boundary detection times which convey into receiver time offset errors.

However said predictable Tbd of the boundary detection signal Sbd (see FIG. 13) facilitates generation of the referencing frame Fr, re-timed by the sampling clock Cs.

Such Fr is applied to the digital frequency detector (DFD) which produces frequency offset estimate Fos by subtracting said expected nominal number of sampling clocks form the number of sampling clocks counted during said referencing frame interval.

As such DFD arrangement facilitates measuring frequency offset within referencing frame intervals corresponding to multiple periods of OFDM composite frame, such prolongation of frequency sensing intervals multiples accuracy of frequency offset measurements (see also time-diagrams and Note 4 in FIG. 13).

Such much more accurate frequency offset Fos applied to the frequency locked loop FLL, enables generation of said sampling clock with frequency by one order more accurate and thus prevents any inter-bin leaking endangering IDFT/IFFT processing of OFDM composite frame.

Such DFD/FLL configuration offers other significant advantages as well over phase locked loops PLL used conventionally in OFDM receivers. Such configuration assures much faster frequency acquisition when connecting to new composite signal source, and avoids PLL instability when exposed to an unknown spectrum of phase noise caused by unpredictable channel interference and inaccuracy of conventional phase measurements methods.

Inherent stability is achieved by combining such stable sampling clock generation by FLL with the phase synthesizer PS (defined in Subsections 5 and 6 of SUMMARY OF THE INVENTION) working in the open ended configuration (shown in FIG. 13 and FIG. 15).

Such open ended PS configuration applies modifications of referencing frame phase with programmable phase steps defined by sub-clocks of sampling clock, wherein such sub-clocks are generated internally in PS from flip-flop based delay line driven by FreqDetClk produced by the frequency multiplier Samp-Clk×R of sampling clock Cs.

Such PS method (defined in the Subsections 5 and 6 mentioned above) uses the same SSP architecture as that used for the boundary detection discussed above. Similarly sub-clocks driving such SSP do not need to facilitate phase resolution matching single gate delay. Coincidentally sub-clocks used by PS for defining programmable phase steps applied to the local symbol frame do not need to provide phase resolution matching single gate delay either. Therefore the same sub-clocks, generated by conventional flip-flop based delay line, can be used for both; for driving said SSP utilized by SP, and for defining said programmable phase steps.

Such conventional delay line is used as consisting of serially connected flip-flops driven by the frequency multiplier Samp-Clk×R of the sampling clock wherein the sampling clock represents frequency multiplication of the local symbol frame (utilized as the reference clock by the SF_PS) by said nominal number Nn. Consequently total frequency multiplication factor amounts to R×Nn.

PCU produces such steps number definition before it is requested by PS and places such steps number on its output PCU-OUT in response to PS interrupt MC_INT.

PCU shown in FIG. 15 receives; the referencing frame Fr, the sampling clock Cs, the boundary delay time Tbd and said frequency offset Fos.

When synchronization acquisition is initialized, Fr presets an PCU internal Fr phase register to Nn−Tbd, wherein Nn is said nominal number expected for reference frame interval covering single OFDM symbol.

As such presetting of PCU internal Fr register provides said programmable presetting of numerical first edge specific for the FPD (see Subsection 7 of SUMMARY OF THE INVENTION), it utilizes such PCU function for upgrading this DPD to provide such FPD functionality.

At the same time the referencing frame prompts the PCU_OUT register to provide definition of such Nn−Tbd phase step, and prompts the symbol frame phase synthesizer SF_PS to generate PCU interrupt MC=1_INT and to implement such Nn−Tbd phase step.

Consequently the first edge of the Local Symbol Frame Fls is generated with the Nn−Tbd phase displacement to the initializing edge of Fr.

Dependent of specifics of a particular PS design; such generation of Fls first edge displaced by Nn−Tbd phase step to the referencing frame edge, can include resetting the phase of frame generated previously by PS before such phase step is applied.

As PCU receives consecutive Fos values defining displacements of next detected Fr boundaries to consecutive expected boundaries, it keeps updating track record of previous Fos and said Fr phase register with such Fos values in order to maintain continues record of Fr phase changes and present status.

In order to avoid uncontrolled phase transients resulting from an accumulation of DFD digitization errors, only DFD design eliminating such digitization errors accumulation can be used (such DFD is defined in U.S. Pat. No. 6,864,672 by Bogdan).

Similarly PCU keeps also track record of previous phase steps defined to SF_PS and keeps updating its internal Fls phase register defining present phase of the local symbol frame.

Based on such data about Fr phase and Fls phase, PCU calculates a number of said phase steps which the referencing frame phase needs to be modified by, in order to implement a preprogrammed phase/frequency transient function between the local symbol frame and the referencing frame.

Such configuration enables accurate phase frequency control reducing phase noise and jitter.

In addition to the SF_PS, configuration shown in FIG. 15 uses another phase synthesizer FLL_PS placed in the return path of the analog phase locked loop APLL used to modify sampling clock frequency in order to minimize said frequency offset between the sampling clock and said composite signal clock.

Additionally to the data mentioned above, PCU keeps track of phase steps introduced into the sampling clock Cs via the FLL_PS. Therefore PCU has all the data defining frequency and phase relations between the sampling clock Cs and the crystal oscillator clock LX_Clk, and between the LX_Clk and said composite frame clock outlined by the referencing frame clock.

Similar configuration shown in FIG. 16 utilizes LX_Clk, instead of the sampling clock, for producing said Freq.Det-Clk. Therefore PCU scales said nominal number Nn, proportionally to frequency offset between the LX_Clk and the composite clock outlined by the Fr, before utilizing such Nn for measuring Fos with the DFD referenced by the LX_Clk.

Synchronization System with improved stability shown in FIG. 14 and FIG. 17, includes:

using the additional DPD for measuring time offset (phase error) Trf−ls between the referencing frame Fr and the symbol frame Fls, instead of relying entirely on PCU subroutines explained above;

such Trf−ls is supplied to PCU which uses it to maintain close control of such time offset (phase error) by defining appropriate phase steps to the symbol frame synthesizer SF_PS.

Such synchronization system can facilitate even closer control of such phase offset, while it implicates lesser stability improvements and simpler phase frequency control less efficient in reducing phase/frequency transients.

High Accuracy FLPS shown in FIG. 18 represents high performance synchronization system which will be needed in future high speed wireless/wireline OFDM and mobile receivers, including next generations of ADSL, WiFi or WiMAX.

Such system facilitates multiplying low frequency (down to 30 kHz) of XTAL oscillator (LX_Clk) by very high factor (up to 50 000), in order to utilize very inexpensive low frequency crystal cuts for producing highly stable local oscillator clock.

Such frequency multiplier utilizes DFD1 for measuring frequency error XTALos between the XTAL oscillator clock (LX_Clk) and the sampling clock Cs represented by the FreqDetClk, wherein the frequency multiplication factor R shall be lower than 10 in order to avoid stability problems in SOC PLL implementations.

PCU reads the frequency error XTALos and produces sequence of PCU-OUT signals supplied to the frequency locked loop phase synthesizer (FLL_PS) located in the reference path of VCXO based analog PLL having very low bandwidth (for example 0.1-1 kHz).

Such PCU_OUT signals cause said FLL_PS to insert phase errors which drive said analog PLL into producing sampling clock Cs maintaining pre-programmed frequency relation to the LX_Clk.

Since such PCU-OUT signals represent sequence of small phase steps applied with frequency by several orders higher than that of analog PLL bandwidth, resulting Cs jitter shall be very low.

Consequently, such system multiplies low frequency of highly accurate inexpensive local XTAL oscillator (LX_Clk), in order to produce sampling clock frequency with accuracy much better than 1 ppm.

Such system utilizes SCCS concept of multiplying low frequency of highly accurate inexpensive local XTAL oscillator, in order to produce sampling clock frequency with accuracy much better than 1 ppm (see Subsections 1, 2 and 3 of SUMMARY OF THE INVENTION).

This system combines all the advanced features, explained above for the FLPS shown in FIG. 15, combined with such highly efficient frequency multiplication method.

CONCLUSION

In view of the above description of the invention and associated drawings, other modifications and variations will now become apparent to those skilled in the art based on the teachings contained herein. Such other modifications and variations fall within the scope and spirit of the present invention.

What is claimed is:

1. A method for use in an orthogonal frequency division multiplexing (OFDM) receiver for synchronizing an OFDM receiver clock (SORC) to an OFDM composite signal clock corresponding to an OFDM transmitter clock, based on utilizing a referencing frame signal recovered from OFDM composite frames carrying data or pilot information wherein an interval of said referencing frame signal is recovered as corresponding to a single one of said OFDM composite frames or multiple said OFDM composite frames; wherein the SORC method comprises the steps of:

detecting boundaries of the OFDM composite frames by processing the OFDM composite frames or a sub-carrier signal recovered from the OFDM composite frames;

using the boundaries detections for specifying the referencing frame signal by delimiting the interval of the referencing frame signal, wherein a known detection delay is maintained between the OFDM composite frames and the referencing frame signal;

using sub-clocks of a local clock for measuring a length difference between the interval of the referencing frame signal and an equivalent symbol frame, wherein the equivalent symbol frame contains a number of cycles of the local clock expected to occur during the interval of the referencing frame signal;

calculating a frequency offset between the referencing frame signal and the equivalent symbol frame, by dividing the length difference by a length of the interval of the referencing frame signal or by a length of the equivalent symbol frame;

using the frequency offset in a frequency locked loop maintaining a frequency alignment between the local clock and the OFDM composite signal clock;

using the sub-clocks of the local clock, the detection delay and the length difference for synthesizing the OFDM receiver clock aligned in phase to the OFDM composite signal clock.

2. An SORC method of claim 1; wherein the SORC method further comprises:

applying a processing method which maintains a known or predictable processing delay between a reception of OFDM composite frame samples corresponding to a direct or embodied definition of a consecutive one of the boundaries of the OFDM composite frames and a detection signal of the consecutive boundary;

or utilizing a processor synchronized to the local clock for maintaining the known or predictable processing delay.

3. An SORC method of claim 1, wherein the SORC method further comprises application of time or frequency domain filters or statistical methods for evaluating reliability of a consecutive one of the boundary detections; wherein:

if said the consecutive boundary detection is evaluated as reliable, it is used for the delimiting the interval of the referencing frame signal;

if the consecutive boundary detection is dismissed as unreliable, it is not used for the delimiting the interval of the referencing frame signal and a corresponding said equivalent symbol frame is increased by an interval corresponding to a one of the OFDM composite frames which the consecutive boundary detection has failed for.

4. A method for use in an orthogonal frequency division multiplexing (OFDM) receiver for synchronizing an OFDM receiver clock (SORC) to an OFDM composite signal clock corresponding to an OFDM transmitter clock, based on utilizing a referencing frame signal recovered from received OFDM composite frames carrying data or pilot information wherein an interval of said referencing frame signal is recovered as corresponding to a single one of said OFDM composite frames or multiple said OFDM composite frames; wherein the SORC method comprises the steps of:

detecting boundaries of the OFDM composite frames by processing the OFDM composite frames or a sub-carrier signal recovered from the OFDM composite frames;

wherein a known detection delay occurs between receptions of the boundaries of the OFDM composite frames and the detections of the boundaries of the OFDM composite frames;

using the detections of the boundaries of the OFDM composite frames for delimiting the interval of the referencing frame signal;

using sub-clocks of a local clock for measuring a length difference between the interval of the referencing frame signal and an equivalent symbol frame, wherein the equivalent symbol frame contains a number of cycles of the local clock expected to occur during the interval of the referencing frame signal;

calculating a frequency offset between the referencing frame signal and the equivalent symbol frame, by dividing the measured length difference by a length of the interval of the referencing frame signal or by a length of the equivalent symbol frame;

using the frequency offset in a frequency locked loop maintaining a frequency alignment between the local clock and the OFDM composite signal clock;

using the known detection delay and such lengths differences for estimating a phase offset between the referencing frame signal and such equivalent symbol frames;

using the sub-clocks of the local clock and the estimated phase offset for synthesizing a phase of the OFDM receiver clock synchronized to the OFDM composite signal clock.

5. An SORC method of claim 4; wherein the SORC method further comprises:

applying a processing method which maintains a known or predictable processing delay between a reception of OFDM composite frame samples corresponding to a direct or embodied definition of a consecutive one of the boundaries of the OFDM composite frames and a detection signal of the consecutive boundary;

or utilizing a processor synchronized to the local clock for maintaining the known or predictable processing delay.

6. An SORC method of claim 4 wherein the SORC method further comprises application of time or frequency domain filters or statistical methods for evaluating reliability of a consecutive one of the boundary detection detections; wherein:

if the consecutive boundary detection is evaluated as reliable, it is used for the delimiting the interval of the referencing frame signal;

if the consecutive boundary detection is dismissed as unreliable, it is not used for the delimiting the interval of the referencing frame signal and a corresponding said equivalent symbol frame is increased by an interval corresponding to a one of the OFDM composite frames which the consecutive boundary detection has failed for.

7. A method using frequency locked phase synthesis (FLPS) in an orthogonal frequency division multiplexing (OFDM) receiver for synchronizing an OFDM receiver clock to an OFDM composite signal clock corresponding to an OFDM transmitter clock, by using referencing frames providing frequency and phase transmittal from received OFDM frames wherein a frequency locked loop produces a local clock aligned in frequency to said OFDM composite signal clock and a phase synthesizer utilizes said local clock for producing said OFDM receiver clock aligned in phase to said OFDM composite signal clock; wherein the FLPS method comprises the steps of:

using the local clock for estimating lengths differences and frequency errors between the referencing frames and nominal frames corresponding to the referencing frames, wherein each one of said nominal frames is defined by a number of local clocks expected to occur during a corresponding one of said referencing frames when the local clock is aligned in frequency to the OFDM composite signal clock;

using the estimated frequency errors for maintaining a frequency alignment between the local clock produced by the frequency locked loop and the OFDM composite signal clock;

using the estimated lengths differences and a known phase displacement between the referencing frames and the received OFDM frames for estimating a phase offset between the local clock and the OFDM composite signal clock;

using the local clock and the estimated phase offset by the phase synthesizer for producing the OFDM receiver clock aligned in phase to the OFDM composite signal clock.

8. An FLPS method of claim 7; wherein the FLPS method further comprises:

applying a processing method which maintains the known phase displacement for deriving the referencing frames from the received OFDM frames;

or utilizing a processor synchronized to the local clock for the deriving the referencing frames from the received OFDM frames in order to maintain the known phase displacement.

9. An FLPS method of claim 7 wherein the FLPS method further comprises detecting boundaries of said received OFDM frames by processing said received OFDM frames, using the boundaries detections for delimiting said referencing frames wherein the known phase displacement is maintained, applying time or frequency domain filters or statistical methods for evaluating reliability of the boundaries detections; wherein:

if a consecutive one of said boundary detections is evaluated as reliable, it is used for delimiting a consecutive one of said referencing frames;

if the consecutive boundary detection is dismissed as unreliable, it is not used for the delimiting the consecutive referencing frame and a consecutive one of said nominal frames corresponding to the consecutive referencing frame is increased to a number of local clocks expected to occur during the consecutive referencing frame when the local clock is aligned in frequency to the OFDM composite signal clock.

* * * * *